United States Patent [19]

Murabayashi et al.

[11] Patent Number: 5,313,116
[45] Date of Patent: May 17, 1994

[54] SEMICONDUCTOR INTEGRATED CIRCUIT DEVICE HAVING BIPOLAR TRANSISTOR AND FIELD EFFECT TRANSISTOR

[75] Inventors: Fumio Murabayashi; Yoji Nishio, both of Hitachi; Shoichi Kotoku, Katsuta; Kozaburo Kurita, Hitachi; Kazuo Kato, Tohkai, all of Japan

[73] Assignee: Hitachi, Ltd., Tokyo, Japan

[21] Appl. No.: 765,018

[22] Filed: Sep. 24, 1991

Related U.S. Application Data

[62] Division of Ser. No. 649,854, Feb. 1, 1991, Pat. No. 5,059,821, which is a division of Ser. No. 325,911, Mar. 20, 1989, Pat. No. 5,001,365.

[30] Foreign Application Priority Data

Mar. 18, 1988 [JP] Japan .................................. 63-63338

[51] Int. Cl.[5] ............................................ H03K 19/01
[52] U.S. Cl. ..................................... 307/446; 307/443
[58] Field of Search ................ 307/443, 446, 451, 520, 307/296.3

[56] References Cited

U.S. PATENT DOCUMENTS 4,649,294  3/1987  McLaughlin ...................... 307/446
4,926,069  5/1990  Yamazaki ........................... 307/446

Primary Examiner—David R. Hudspeth
Attorney, Agent, or Firm—Antonelli, Terry, Stout & Kraus

[57] ABSTRACT

A semiconductor integrated circuit device having a plurality of logic circuits integrated on a semiconductor substrate is provided which can operate with a power source potential difference substantially less than 5 V. The logic circuit includes a bipolar transistor having a base and its collector-emitter current path coupled between a first power source terminal and an output terminal, together with at least one field effect transistor having its gate responsive to an input signal applied to an input terminal and its source-drain current path coupled between the first power source terminal and the base of the bipolar transistor. A semiconductor switch means is also provided which is responsive to the input signal applied to the input terminal for performing ON/OFF operations complementary to the ON/OFF operations of the bipolar transistor and which has a current path between its paired main terminals coupled between the output terminal and the second power source terminal. In order to improve the operating speed, a potential difference reducing element is provided having a current path between its paired main terminals coupled between the first power source terminal and the output terminal for reducing the potential difference, which is present between the first power source terminal and the output terminal based on the base-emitter forward voltage of the bipolar transistor when the bipolar transistor is ON.

14 Claims, 48 Drawing Sheets

| 100 : | OFF | ON | ON | OFF | OFF |
| 103 : | OFF | OFF | ON | ON | OFF |
| 110 : | ON | OFF | OFF | ON | ON |
| 114 : | ON | ON | OFF | OFF | ON |
| 116 : | ON | OFF | OFF | ON | ON |

| STATE | I | II | III | IV | V |

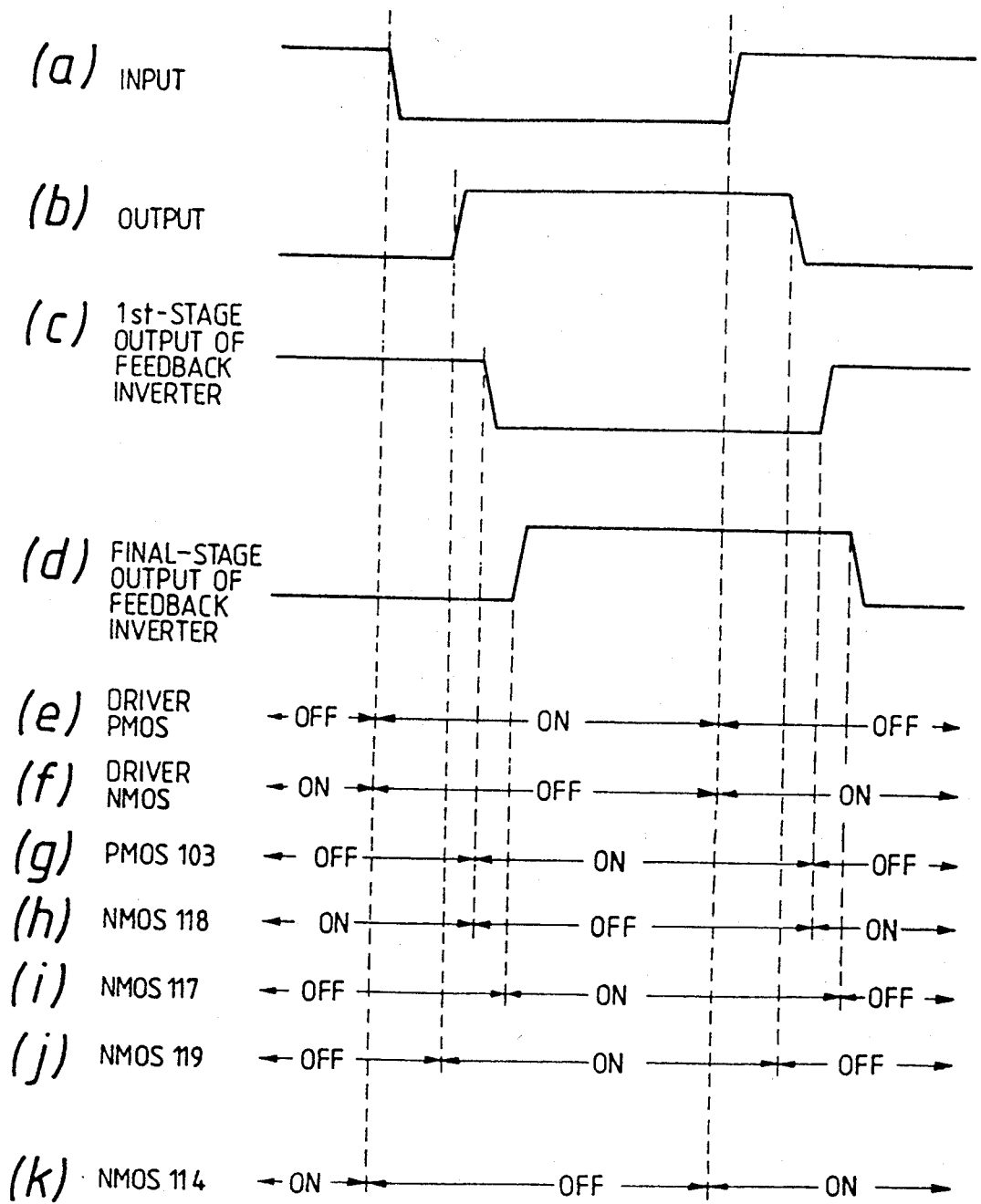

SEMICONDUCTOR INTEGRATED CIRCUIT DEVICE HAVING BIPOLAR TRANSISTOR AND FIELD EFFECT TRANSISTOR

This is a divisional of application Ser. No. 649,854, filed Feb. 1, 1991, now U.S. Pat. No. 5,059,821, which is a divisional of application Ser. No. 325,911 filed Mar. 20, 1989, now U.S. Pat. No. 5,001,365.

BACKGROUND OF THE INVENTION

The present invention relates to a semiconductor integrated circuit device and, more particularly, to a semiconductor integrated circuit device having a bipolar transistor and a field effect transistor and suited for a system of high speed and low power consumption.

A VLSI of high performance having the advantages of both bipolar and MOS can be realized by forming a bipolar transistor and a MOS transistor over a common semiconductor substrate and by composing these transistors in a circuit. This composing technique is called the "BI-CMOS (Bipolar-CMOS) technique" and can be applied to a VLSI such as a memory or gate array. One representative example of the circuit for realizing the VLSI is shown in FIG. 3. More specifically, FIG. 3 shows one example of the BI-CMOS inverter circuit, which has its output portion composed of a totem pole of bipolar transistors 120 and 121 and its input portion composed of MOS transistors so that the bipolar transistors of the output portion are driven by the MOS transistors of the input portion.

The features of this circuit of FIG. 3 are as follows. Since the input portion is composed of the MOS transistors, the input impedance is very high. Since, moreover, the bipolar transistors of the output portion are complementarily operated by the MOS transistors, no DC current will flow. This serves to minimize the power consumption. Since the output portion is composed of the bipolar transistors, the load driving force is very high. Thus, the BI-CMOS circuit has a construction suited for VLSI having high speed and the low power consumption.

In the case of this circuit example, the output portion has a totem pole connection which is also used in the well-known TTL (Transistor-Transistor-Logic), and the input portion has a structure of CMOS (Complementary MOS). As understood from this structure, the power source voltage is 5 V like the TTL or CMOS. Not only the example of FIG. 3 but also the BI-CMOS VLSI such as the memory or gate array being practiced at present is operated at the power source voltage of 5 V.

References concerning such BI-CMOS techniques are exemplified by many publications such as Japanese Patent Laid-Open Nos. 59-11034, 61-54712 and 60-27227; "0.5 MICRON BICMOS TECHNOLOGY" (1987 IEDM, pp. 838–840); and U.S. Pat. Nos. 4,719,373, 4,661,723, and 4,682,054.

Another circuit is known to aim at high speed and low power consumption by combining bipolar transistors and CMOS transistors, as shown in FIGS. 63 and 64 (as disclosed in Japanese Patent Laid-Open No. 61-84112). This circuit is an inverter which has fundamental operations, as will be described in the following. Common parts are designated by identical reference characters. When an input 308 is at a "0" level, a PMOS field effect transistor (PMOS) 300 is ON to feed the base current to an NPN bipolar transistor (which will hereinafter be referred to as "NPN") 303. Then, the NPN 303 is ON. On the other hand, an NMOS field effect transistor (NMOS) 301 is OFF to feed no base current to an NPN 304 so that the NPN 304 is OFF. As a result, an output 309 assumes a "1" level. On the other hand, if the input 308 assumes the a "1" level, the PMOS 300 is OFF to feed no base current to the NPN 303 so that the NPN 303 is OFF. Moreover, the NMOS 301 is ON, and an NMOS 302 having its gate receiving the output level (at "1" at this time) is still ON so that the base current is fed to turn ON the NPN 304. As a result, the output 309 assumes the "0" level. Then, the NMOS 302 is OFF so that the base current to the NPN 304 can be blocked to achieve low power consumption characteristics.

However, the circuit of FIG. 63 has no element for dropping the base potential of the NPN 303 when the output 309 drops, i.e., when the input 308 rises to turn OFF the NPN 303. As a result, the NPN 303 is not promptly turned OFF to establish an ON timing of both the NPN 303 and 304 so that a through current flows from a $V_{CC}$ power source 180 to a GND power source 181 to obstruct the low power consumption and the high speed.

This point is improved by the arrangement shown in FIG. 64. By providing the NMOS 305, the base voltage of the NPN 303 is abruptly dropped through an NMOS 305, which is turned ON when the input 308 rises, to abruptly turn OFF the NPN 303. An impedance element Z 306 which can be a resistor 307 connected between the base and emitter of the NPN 304 are used to drop the base voltage to the GND potential when the NPN 304 is turned OFF.

Points to be improved in the BI-CMOS system/circuit technique of the prior art can be summarized into the following two points: one relating to the circuit characteristics (or power consumption) and breakdown voltage at the power source voltage of 5 V; and the other relating to the circuit structure. These two technical problems will be described in the following.

In the prior art, the BI-CMOS circuit shown in FIG. 3 is typically used with the power source voltage of 5 V. As the improvement in fineness advances, however, problems arise concerning power consumption and the breakdown voltage of the elements. As the structure becomes finer, the number of transistors to be incorporated into one chip will naturally increase. If the power to be consumed by one circuit is assumed to be constant, the power consumption will increase in proportion to the degree of integration. If, at present, the degree of integration is 20,000 gates/chip and the power consumption per chip is 5 W, the power consumption per chip will increase to 10 W as the structure becomes finer so that the integration degree grows to 40,000 gates/chip.

If the power consumption per circuit is constant, as apparent from the above simple calculations, the power consumption per chip will increase in proportion to the increase in the integration degree accompanying the finer structure. With the increasing power consumption, the temperature in the chip rises to deteriorate the characteristics and reliability of the transistors. Therefore, these transistors have to be cooled. A cooling fan is required in case the power consumption is several watts or less, and water-cooling facilities are required for devices with higher power consumption. These facilities necessary for cooling the chip finally appear as the high cost and large size of the products. This is contrary to the targets such as low cost and small size, which are aimed at by the VLSI technique.

This problem of the increase in the power consumption is becoming more serious as the structure becomes finer and the integration becomes higher. This makes it necessary to reduce the power consumption of the BI-CMOS circuit. Another problem accompanying the fine structure is the breakdown voltage of the elements. Since the fine structure at present is obtained under a constant power source voltage, the intensity of the electric field to be applied to the elements is increasing on and on to raise a resultant problem of deterioration or dielectric breakdown of the element characteristics.

The second problem concerns the circuit structure. Using the circuit of the prior art, as shown in FIG. 3, it has been found difficult to reduce the power consumption by optimizing the circuit constants while maintaining the high-speed switching characteristics.

First of all, the circuit operations will be briefly described with reference to FIGS. 3 and 4. Let it be assumed that an input voltage signal 162 shown in FIG. 4 is applied to the input 162 of FIG. 3. If the input 162 is first at a High level, a PMOS 100 is OFF, NMOS 110 and 115 are ON, and a NMOS 114 is OFF. If the input changes from High to Low, the PMOS 100 is turned ON whereas the NMOS 115 is turned OFF so that the base current is fed from the PMOS 100 to turn ON a NPN 120. Since the NMOS 110 is turned OFF, on the contrary, a NPN 121 is OFF so that an output 165 becomes High. At this time, the NMOS 114 is turned ON to short-circuit the base and emitter of the bipolar 121 to turn OFF the same without fail.

Next, if the input changes from Low to High, the PMOS 100 is turned OFF, but the NMOS 115 is turned ON to drop the base potential of the bipolar 120 so that the bipolar 120 is turned OFF. On the other hand, the NMOS 110 is turned ON to feed the base current to turn ON the bipolar 121 so that the output 165 becomes Low. At this time, the NMOS 114 is switched from ON to OFF. Immediately after the NMOS 110 becomes ON, the NMOS 114 becomes ON. Since, however, the ON resistance of the NMOS 114 is designed to be higher than that of the NMOS 110, the current from the NMOS 110 is fed not only the NMOS 114 but also to the base of the bipolar 121 to turn ON the bipolar 121.

This circuit is of low power consumption type because the bipolars 120 and 121 have operations complementary to each other. However, the power consumption increases because the through current will flow from the power source 160 to the ground 161 in the transitional state in which the bipolars 120 and 121 are switched. In order to reduce the power consumption, therefore, it is necessary to minimize the through current by switching the bipolars 120 and 121 at a high speed. When the input 162 is changed from Low to High, for example, the bipolar 120 is switched from ON to OFF. In order to speed up this operation, it is necessary to drop the base potential of the bipolar 120 at a high speed by enlarging the channel width W of the NMOS 115 to reduce the ON resistance of the NMOS 115.

In order that this circuit may operate at a high speed when the input is changed from High to Low, on the other hand, it is necessary to feed the base current at a high speed from the PMOS 100 to the bipolar 120. Because of this, it is necessary that the current from the PMOS 100 should not leak to the NMOS 115 but be entirely fed to the base of the bipolar 120. In the transitional state where the input 162 is changed from High to Low, however, the PMOS 100 and NMOS 115 are liable to be simultaneously turned ON so that the current of the PMOS 100 will partially leak to the NMOS 115. In order to reduce this current leakage, therefore, it is necessary to make a design that the channel width W of the NMOS 115 is small to increase the ON resistance of the NMOS 115.

Thus, the prior art circuit shown in FIG. 3 is required, for the purpose of low power consumption, to reduce the through current by designing a large channel width of the NMOS 115 to speed up the bipolar 120 and, for the purpose of high speed, to reduce the leakage current of the base by designing a small channel width for the NMOS 115. In other words, an inconsistency arises if low power consumption and high speed are to be concurrently realized. Therefore, a second object of the present invention is to provide a circuit structure which can simultaneously realize low power consumption and high speed for the circuit by clearing those limits.

In the BI-CMOS system of low power consumption type realized in accordance with the first main aspect of the present invention, the overhead of the power consumption due to the through current of the circuit cannot be ignored. Therefore, the BI-CMOS circuit to be used in the low power consumption BI-CMOS system realized by the first aspect of the invention is suited for use with a second aspect of the invention.

The prior art technique described above takes no special consideration with regard to the connection between the NMOS transistors (NMOS) 301 and 302 for driving the NPN bipolar transistor 304, and encounters the following problems. These problems will be described with reference to FIGS. 65 and 66.

As shown in FIG. 65, a junction capacity 310 for the drain or source of the NMOS is at the node A between the NMOS 301 and 302. A parasitic capacity 311 such as a base capacity or the junction capacity of the NMOS 302 is around the base of the NPN 304. FIG. 66 illustrates the operation timings and the ON and OFF states of the NMOS 301 and 302, as divided into five regions I to V.

In the region I, the input 308 is set at the "0" level whereas the output 309 is set at the "1" level. At this time, the NMOS 301 is OFF whereas the NMOS 302 is ON so that the potentials at both the point A and the base of the NPN 304 are at the GND potential 181.

In the region II, the input signal 308 begins to rise whereas the output signal 309 begins to drop. At this time, the NMOS 301 and 302 are ON, and the potential at the point A rises with a time constant determined by the ON resistances of the NMOS 301 and 302 and so on. On the other hand, the base potential of the NPN 304 rises and is turned ON.

In the region III, the input 308 is at the "1" level whereas the output 309 is at the "0" level. At this time, the NMOS 301 is ON whereas the NMOS 302 is OFF. The potential at the point A is expressed by $V_{CC}-V_{th}$, if the threshold voltage of the NMOS 301 is designated at $V_{th}$. The base potential of the NPN 304 attenuates the time constant of the resistance 307 and parasitic capacity 311 to the GND potential.

In the region IV, the input 308 begins to drop whereas the output 309 begins to rise. At this time, both the NMOS 301 and 302 are OFF to keep the potential of the point A at the state of the region III, and the base potential of the NPN 304 continues to drop with the same time constant as that of the region III.

In the region V, the input 308 is at the "0" level whereas the output 309 is at the "1" level. At this time, the NMOS 301 is OFF whereas the NMOS 302 is ON. The potential of the point A will attenuate toward the GND potential whereas the base potential of the NPN 304 will once rise and then attenuate toward the GND potential. This is caused by the phenomenon that the charges stored in the parasitic capacity 310 are distributed to the parasitic capacity 311 when the NMOS 302 is turned ON. As a result, at the timing when the NPN 303 should be turned ON whereas the NPN 304 should be turned OFF, the NPN 304 is in fact not turned OFF. Therefore, a through current is established from the $V_{CC}$ power source 180 to the GND power source 181. This through current adversely affects high speed because it increases the power consumption and allows the charge current of the load by the NPN 303 to leak to the NPN 304.

Thus, one of the problems encountered by the technique of the prior art, as shown in FIG. 3, is that the bipolar transistors 120 and 121 are delayed in turning ON because their base potentials fail to reach the base-emitter forward voltage $V_{BE}$ of the bipolar transistors until the end of the charging operations due to the presence of the parasitic capacity around the bases, although the driver MOS 100 and 110 are turned ON to feed the base currents of the bipolar transistors.

SUMMARY OF THE INVENTION

Therefore, a first object of the present invention is to realize a BI-CMOS system which can solve the problems of power consumption and breakdown voltage accompanying the finer structure.

A further object of the present invention is to provide a semiconductor integrated circuit device which has a bipolar transistor and a field effect transistor of high speed and low power consumption.

Another object of the present invention is to shorten the time period required for the base potential of the bipolar transistor to reach the base-emitter forward voltage $V_{BE}$.

The above-specified first object, i.e., the avoidance of the problems of the low power consumption and the breakdown voltage, is achieved by dropping the power source voltage from the value of 5.0 V of the prior art to 4 V, for example. This does not mean that the power source voltage is necessarily limited to the value of 4 V, since a different proper power source voltage can be selected for the performance region required by the system. Therefore, the first object is achieved by the means using a power source voltage lower than 5.0 V but satisfying the performances required. This will be described in the following with reference to FIG. 5.

FIG. 5 is a graph illustrating the characteristics of the BI-CMOS gate circuit represented by FIG. 3. The abscissa designates the power consumption per gate, and the ordinate designates the gate delay time and plotting the characteristics for the power source voltage changed with the operation frequency and the load capacity being held constant. As the power source voltage is increased from 3 V to 3.5 V and 4 V, the power consumption will slightly increase, and the gate delay time becomes remarkably short. If the power source voltage is further increased from 4 V to 4.5 V and 5 V, the power consumption will highly increase, and the gate delay time is slightly shortened. Thus, the delay time of the BI-CMOS gate circuit has the following tendency. The delay time highly depends upon the power source voltage within a range of 3 V to 4 V. For the higher power source voltage, only the power consumption will increase, but the delay time will not be shortened significantly. Essentially, the delay time will progressively approach a constant value.

Because of the effects shown in FIG. 5, it is possible to highly reduce the power consumption while suppressing the delay time to only a relatively small increase, even if the power source voltage is dropped from 5 V to about 4 V, for example. The hatched region shown in FIG. 5 provides a performance region required by a certain system. In case the BI-CMOS circuit is used with the power source voltage of 5 V, as in the prior art, the delay time performance is satisfied, but the power consumption is too high to satisfy the necessary conditions. The necessary performance region is located within the region where the power source voltage is about 4 V. In this case, the necessary performances can be satisfied by using the BI-CMOS circuit at the power source voltage of 4 V, for example. The concept of using the BI-CMOS circuit at a power source voltage lower than 5 V was not required before the structure was made finer to remarkably increase the degree of integration, and this possibility is clarified by analyzing the characteristics of the BI-CMOS circuit shown in FIG. 5. In case, moreover, the BI-CMOS circuit is used at a power source voltage lower than 5 V, the voltages to be applied to the individual transistors constituting the circuit can be dropped to avoid the problem of the breakdown voltage of the elements, which is generally a concern when the structure becomes finer.

Next, the second object of realizing a BI-CMOS circuit structure capable of reducing the power consumption while maintaining the high speed will be described with reference to FIGS. 1 and 2. It has been illustrated in FIG. 5 that the Bi-CMOS circuit can reduce power consumption without deteriorating the high speed by dropping the power source voltage. These characteristics can be limited by the curve plotted in FIG. 5. The BI-CMOS circuit of the prior art cannot realize the higher speed and the lower power consumption at the same time, as has been described hereinbefore. The present invention contemplates to provide a circuit structure capable of realizing both high speed and low power consumption.

FIG. 1 shows a circuit exemplifying this principle, and FIG. 2 shows the operations of the circuit. In FIG. 1, reference numeral 192 designates a bipolar transistor (hereinafter referred to as a bipolar) which has its collector and emitter connected between a power source 160 and the output 165. An FET 194 acting as a MOS field effect transistor is connected between a power source 167 and the base of the bipolar 192 and has its gate connected with the input 162. Between the base of the bipolar 192 and a terminal 168, there are connected in series a current bypass element 190 acting as a first potential difference reducing element and an FET 195, which has its gate connected with the input 162. A bipolar 193 has its collector and emitter connected between the output 165 and a power source 161, and an FET 196 is connected between a terminal 169 and the base of the bipolar 193 and has it gate connected with the input 162. Between the base of the bipolar 193 and the power source 168, on the other hand, there is connected a current bypass element 191 which acts as a second potential difference reducing element.

One example of the operations of this circuit structure is shown in FIG. 2. The FETs 194 to 196 are turned ON and OFF in accordance with the change in the input voltage signal, and the current bypass elements 190 and 191 are turned ON and OFF with a delay from the change in the output voltage which is in response to the input signal. The bipolar transistors 192 and 193 are switched in accordance with the ON and OFF of those FETs 194 to 196 and the current bypass elements 190 and 191. If the input voltage is High, for example, the FET 194 is OFF whereas the FETs 195 and 196 are ON.

Let it be assumed that the current bypass element 190 is turned OFF whereas the element 191 is turned ON for a Low output. If the input voltage is changed from High to Low, the FET 194 is turned ON whereas the FETs 195 and 196 are turned OFF. Since the current bypass elements 190 and 191 are switched with a delay from the change in the output voltage, they hold their initial states such that the former element 190 is OFF whereas the latter element 191 is ON. Since the FET 194 is ON whereas the current bypass element 190 is OFF because of the delay, the base current is fed from the power source 167 to turn ON the bipolar transistor 192. Since, on the other hand, the FET 196 is OFF whereas the current bypass element 191 is ON because of the delay, the bipolar transistor 193 is OFF. As a result, the output is changed from Low to High (in the state II).

With a delay time after the output voltage signal, which is responsive to the input signal, has changed, the current bypass element 190 is changed from OFF to ON, and the current bypass element 191 is changed from ON to OFF (in the state III). Next, if the input voltage signal is changed from Low to High, the FET 194 is turned OFF, but the FETs 195 and 196 are turned ON. Since, at this time, the current bypass element 190 is ON because of the delay, the base potential of the bipolar 192 drops through the elements 190 and 195 until it is turned OFF. Since, on the other hand, the FET 196 is ON whereas the current bypass element 191 is OFF because of the delay, the base current is fed from the terminal 169 through the element 196 to turn ON the transistor 193 so that the current is changed from High to Low (in the state IV). With a delay time after the output voltage has changed, the current bypass element 190 is turned OFF, and the element 191 is turned ON (in the state V).

The features of the circuit structure and operations thus far described over those of the circuit of the prior art are that the element 190, which carries out the role of base current extraction of the bipolar transistor 192, is OFF until at least an output voltage $V_{out}$ exceeds the subtraction of $(V_{CC}-V_{BE})$, i.e., $V_{out} > V_{CC} - V_{BE}$. Here, VCC designates the power source voltage, and $V_{BE}$ designates the base-emitter voltage of the bipolar transistor 192. Moreover, the element 191, which carries out the role of extracting the base current of the bipolar transistor 193, is OFF until the output voltage $V_{out}$ exceeds the sum of $(V_{GND}+V_{BE})$, i.e., $V_{out} < V_{GND} + V_{BE}$. Here, $V_{GND}$ designates the voltage of the power source 161. The object of the present invention is achieved by the circuit structure thus featured.

Another object of the present invention is achieved by using the totem pole connection of the bipolar transistors and by using the so-called "Darlington connection" of the upper bipolar transistor and the MOS such that the base current of the lower bipolar transistor is connected with the $V_{CC}$ power source and is fed through the MOS, which is turned OFF when the output drops, and through the MOS which is connected between the MOS and the base of the lower bipolar transistor.

Another object of the present invention is achieved, as shown in FIG. 74, by connecting switch elements 314 and 319 with the base terminals of the bipolar transistors to bias the other terminals of the switch elements such that the base potentials may not exceed the base-emitter forward voltage $V_{BE}$.

In the following, the circuit structure and operations described above can achieve the second object of the present invention, as will be described with reference to FIGS. 1 and 2. First of all, in order to reduce the power consumption of the BI-CMOS circuit, it is necessary to reduce the through current which is generated to flow from the power source terminal 160 to the power source terminal 161 when the bipolar transistors 192 and 193 are switched. For this necessity, the bipolar 192 has to be turned OFF at a high speed if the drop of the output voltage is to be considered. In order to turn OFF the bipolar 192 at high speed, the base current may be abruptly bypassed by reducing the ON resistances of the base current bypass element 190 of the bipolar 192 and the FET 195. Since the current bypass element 190 is ON at the output drop (in the state IV), the bipolar 192 can be turned OFF at a high speed by extracting the base current if the ON resistance of the element 190 is designed to take a sufficiently small value. When the output voltage rises, on the other hand, the bipolar 193 has to be turned OFF at a high speed. For this necessity, the base current may be abruptly bypassed by sufficiently reducing the ON resistance of the second base current bypass element 191 of the bipolar 193. At the output rise (in the state II), the current bypass element 191 is already ON, and the bipolar 193 is turned OFF in advance. After the output voltage sufficient drops, the element 191 turns OFF the bipolar 193. Thus, by designing the ON resistances of the first and second current bypass elements 190 and 191 to have sufficiently low levels, the bipolar transistors 192 and 193 can be turned OFF at high speed when in the switching operation or OFF prior to the switching operation so that the low power consumption can be achieved.

For the purposes of speed-up, on the contrary, the first current bypass element 190 is OFF at the output rise (in the state II), for example. As a result, the base current to be fed from the FET 194 to the bipolar transistor 192 is wholly fed to the base of the transistor 192 without any leakage to the first current bypass element 190. Specifically, no matter how low the ON resistance of the current bypass element might be designed for reducing the power consumption, the current bypass element 190 is OFF, when the bipolar transistor 192 is changed from OFF to ON (in the state II). Therefore, the impedance is in a remarkably high, ideal state without being influenced by the ON resistance.

At the output drop (in the state IV), on the other hand, the current bypass element 191 is OFF so that the base current to be fed from the FET 196 to the bipolar transistor 193 is wholly fed to the base of the transistor 193 without leaking to the current bypass element 191. No matter how low the ON resistance of the element 191 might be designed, like the current bypass element 190, the element 191 is OFF, when the bipolar transistor 193 is turned ON. Therefore, the impedance is in the remarkably high, ideal state.

Thus, in the structure of the circuit of the present invention, the design for reducing the power consumption can be accomplished independently of the high speed, and the second object of the present invention can be achieved by accomplishing the low power consumption and the high speed at the same time.

The base current of the lower NPN transistor in the totem pole connection is forcibly fed through the MOS connected with the $V_{CC}$ power source. This is because the drain-source voltage of the MOS does not depend upon the output potential but can be applied by the subtraction of ($V_{CC}-V_{BE}$). Here, $V_{BE}$ designates the base-emitter forward voltage of the NPN. By this voltage, the lower NPN transistor can be intensely driven to reduce the delay of the dropping delay time. After the output drops, the base current can be blocked to reduce the power consumption. By connecting the base current blocking MOS with the $V_{CC}$ power source, moreover, the lower NPN transistor can be prevented from being turned ON by the distribution of the charges when the output rises, as shown in FIGS. 65 and 66, so that the through current can be reduced to drop the power consumption.

The actions of the technical means for solving the above-discussed problems will be described in the following with reference to FIGS. 74 and 75. When the input is changed from High to Low, the driver PMOS will be turned ON whereas the driver NMOS will be turned OFF. Switch elements 303 ($D_1$) and 318 ($D_2$) are so controlled that D, is kept OFF whereas $D_2$ is kept ON for that period. As a result, the drain current of the driver PMOS is fed to the base terminal without any leakage. Since the element 318 ($D_2$) is ON, moreover, the bipolar transistor 121 is cut off. In case the input is changed from Low to High, the driver PMOS will be turned OFF whereas the driver NMOS will be turned ON. $D_1$ and $D_2$ are so controlled that, for the period, the switch element 303 ($D_1$) is kept ON whereas the switch element 318 ($D_2$) is kept OFF. As a result, the bipolar transistor 121 is turned ON whereas the bipolar transistor 120 is turned OFF.

The switch element 303 thus connected with the base of the bipolar transistor 120 is turned ON in case the bipolar transistor 120 is turned OFF, and the switch element 303 is turned OFF in case the bipolar transistor 120 is turned ON. Also, the switch element 318 thus connected with the base of the bipolar transistor 121 is turned ON in case the bipolar transistor 121 is turned OFF, and the switch element 318 is turned OFF in case the bipolar transistor 121 is turned ON.

Next, the one-side terminals of other switch elements $D_5$ (314) and $D_4$ (319) are connected with the terminals 168 and 170 which have fixed potentials not exceeding the base-emitter voltage $V_{BE}$ of the bipolar transistor so that they act to raise the base potential promptly to the base-emitter potential $V_{BE}$. In case the input is changed from High to Low, more specifically, the parasitic capacitance around the base of the bipolar transistor 120 is to be charged up by the drain current of the drive PMOS 100. By this time, the base of the NPN 120 has already been biased to a fixed potential lower than the $V_{BE}$ through $D_5$ (314). This makes it possible to turn ON the NPN 120 at a high speed. On the other hand, if the input is changed from Low to High, the switch element 319 ($D_4$) is ON so that the base of the bipolar transistor 121 has already been biased to a fixed voltage lower than the $V_{BE}$ through D. As a result, the NPN 121 can be turned ON at the high speed.

BRIEF DESCRIPTION OF THE DRAWINGS

FIGS. 76 to 79 and 81 to 89 are circuit diagrams showing embodiments of the present invention.

DETAILED DESCRIPTION OF THE EMBODIMENTS

Figure 6:
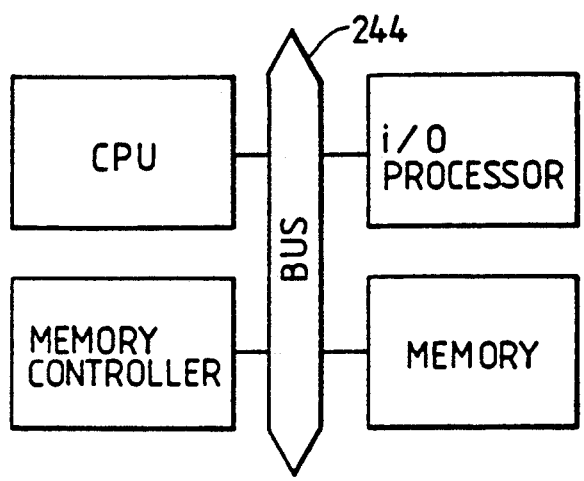
FIGS. 6 and 7 show embodiments of the first aspect of the invention.

FIG. 6 shows one embodiment of the first aspect of the present invention. In particular, FIG. 6 shows the general structure of a computer, in which a central processing unit CPU, a memory for storing data inputted to the CPU and/or data outputted from the CPU, a memory controller, and an i/o processor are all connected through a bus 244. In this system, the CPU, for example, is required to have a gate circuit of high-speed performance so that it may execute arithmetic operations at a high speed. If, moreover, the CPU is divided into several chips, a delay time is added for inputting and outputting signals between the chips. In order to reduce the overhead for those inputting and outputting operations, it is necessary to reduce the inter-chip transitions of the signals thereby to eliminate the delay required for the inputting and outputting operations. For this necessity, the chips are integrated, if possible, over a single semiconductor substrate so that the system of FIG. 6 has a high degree of integration. In other words, the system shown in FIG. 6 is a typical example required to have high speed and low power consumption at the same time.

Figure 1:
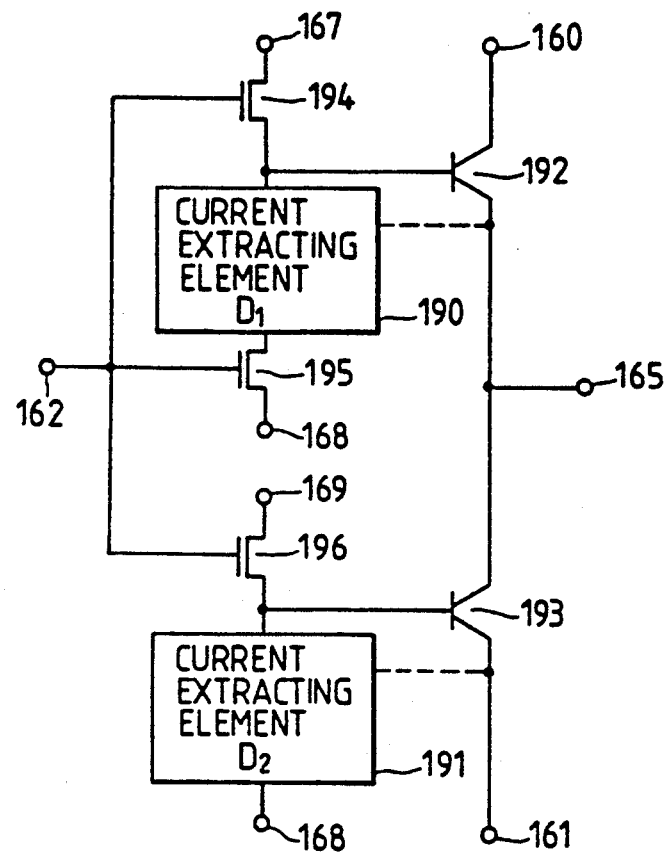
FIG. 1 is a circuit diagram of the present invention.
Figure 2:
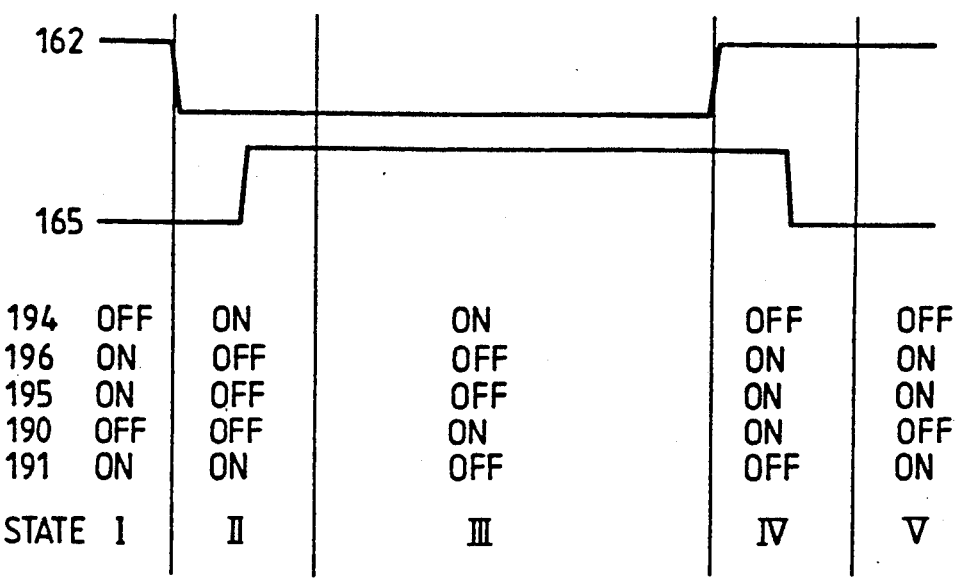
FIG. 2 is an operation timing chart.
Figure 3:
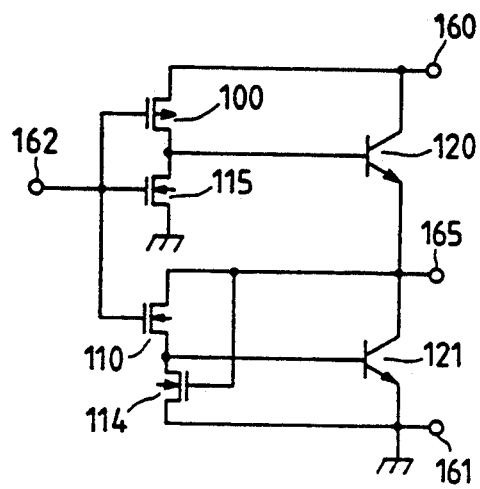
FIG. 3 is a circuit diagram of the prior art.
Figure 5:
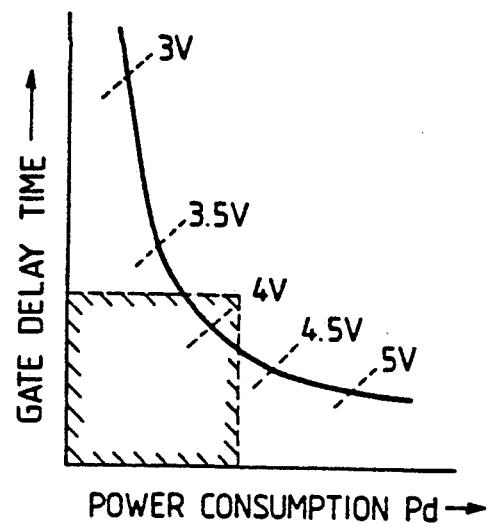
FIG. 5 is a performance graph.
Figure 4:
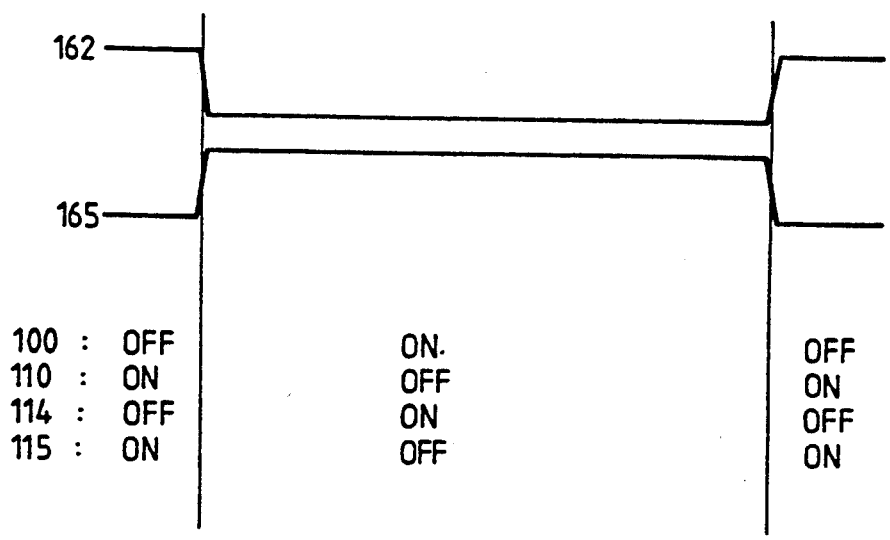
FIG. 4 is an operation timing chart.

The performances required of this system are within the hatched region shown in FIG. 5, for example. The BI-CMOS circuit of the power source voltage of 5 V has a high power consumption so that it is not suitable for this system. In order to effect the operations within the hatched performance region, therefore, the power source voltage ($\approx |V_{CC}-V_{GND}|$) is dropped to as low as 4 V. The BI-CMOS circuit of 5 V can meet the requirement of the delay time but has a high power consumption so that it cannot satisfactorily construct the system of FIG. 6. If the power source voltage is dropped to 4 V, both the delay time and the power consumption can satisfy the performances required thereof. Thus, the system of FIG. 6 can be satisfactorily realized by the BI-CMOS circuit having a power potential difference of 4 V or less, as will be described in detail in the following.

Figure 7:
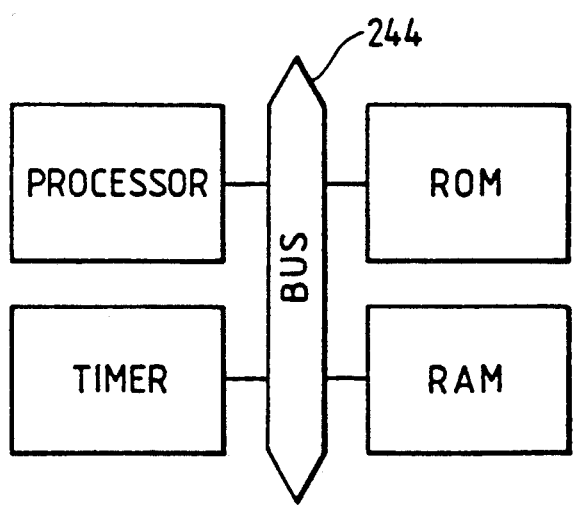

FIG. 7 shows a data processing system in which a processor of a BI-CMOS circuit, a RAM, a ROM and a timer are connected with the bus 244. As shown, the bus 244 is connected with the RAM, the ROM and the timer so that it has to bear a high load capacity. This makes it necessary to construct the processor of the BI-CMOS circuit thereby to drive the bus at a high speed. In the case of this system, like the case of FIG. 6, the power source voltage has to be dropped so as to meet the performances required thereof. However, the power source voltage should not be limited to the value of 4 V, since an optimum design may be obtained even if the system of FIG. 7 is constructed of a BI-CMOS circuit which operates at a power source voltage of 3.3 V, as will be described in detail in the following.

The desirability for using a power source voltage lower than 5 V will be described in the following. First of all, in a TTL (Transistor-Transistor-Logic circuit), there is a future plan to set the power source voltage at 3.3 V±0.3 V (ISSCC 1986 Technical Digest, p. 224). In order to match the signal level with such a TTL for compatibility, it is necessary to set the power source voltage of the BI-CMOS at 3.3 V±0.3 V. Then, the interface with the TTL can be accomplished without any level change of the signal.

On the other hand, in case the system is constructed to have ECL circuitry and BI-CMOS circuitry coexisting with each other according to another example, the power source systems can be united to provide a convenient usage if the power source voltage of the BI-CMOS is equalized to that of the ECL. This coexisting system of ECL and BI-CMOS may be constructed on a single chip or a plurality of chips. In either case, the power source circuit and wiring can be simplified if the power source systems are united. The power source voltages of the ECL is at −4.5 V±10% in the case of 100 K series, for example. Since the power source of the ECL usually takes its potential in the negative direction from the GND, the BI-CMOS also operated at a negative power source of −4.5 V±10%. As experienced in the example of a pseudo-ECL, however, the ECL can be operated at a positive power source potential. Then, the BI-CMOS can also be operated by a positive power source. With either a positive or negative power source, the power source potentials of the ECL and the BI-CMOS can be united so that the power source potential difference has an absolute value of |4.5 V±10%| to simplify the power source systems.

It is also conceivable to have a coexisting system of Bi-CMOS circuitry and NTL (Non-Threshold Logic) circuitry, for example. The aforementioned coexisting system of ECL and Bi-CMOS contemplates introducing the high logic ability and high speed of ECL circuitry into the BI-CMOS system. A coexisting system of NTL circuitry and the BI-CMOS system contemplates to utilize mainly the high speed of the NTL. These ECL and NTL arrangements can enjoy the high speed but have high power consumptions. A system of low power consumption and high speed can be provided by using the ECL or NTL only for the critical path of the arithmetic unit and by constructing the remainder of the system with BI-CMOS circuitry. The NTL circuit usually uses a power source of 2 V±10%. If, therefore, the power source of the BI-CMOS is shared at 2 V±10% with the NTL, the power sources can be made common.

On the other hand, the power source may be exemplified by a dry cell. Then, the operations are accomplished at 1.5 V±10% in the case of a single cell, at 3.0 V±10% in the case of two series cells, and at 4.5 V±10% in the case of three series cells. The dry cells are less noisy and are small-sized so that they have a high merit as a future power source.

Figure 61:
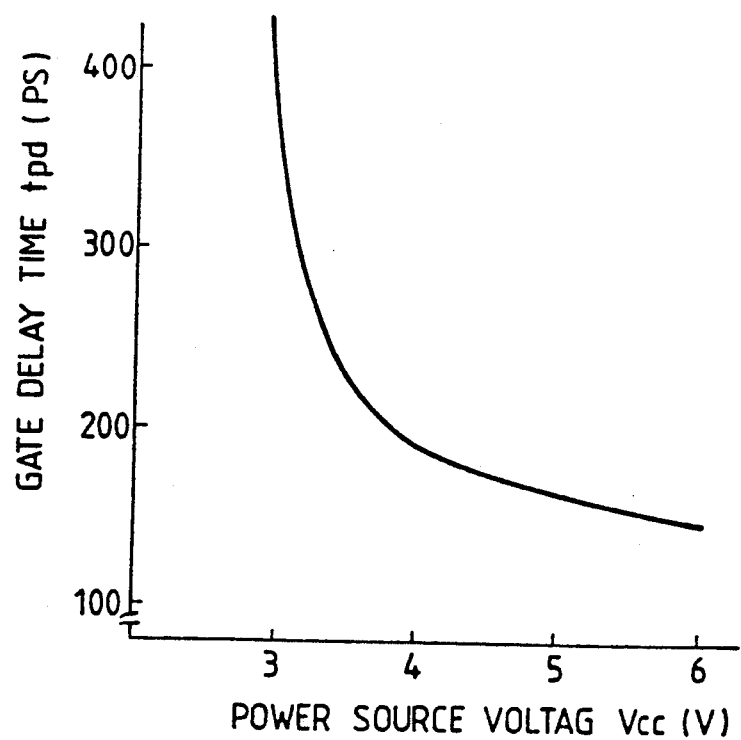

FIG. 61 illustrates the characteristics of the BI-CMOS gate of the present invention. The abscissa plots the power source voltage, and the ordinate the gate delay time. It is understood from the illustrated characteristics that the gate delay time is abruptly elongated at a voltage near 4 V or less. It follows that the voltage region where the BI-CMOS gate can operate at a high speed with less influence of the power source dispersion is located at 4 V or more. As the structure becomes finer, on the other hand, the power source voltage must be lowered because of the physical conditions of the drive such as punch-through, and dielectric breakdown of the gate from the hot-electron effect. Since, moreover, the power consumption changes in proportion to the square of the power source voltage, the lower power source voltage is desirable from the standpoint of the low power consumption. Especially complicated logic such as a microprocessor has to incorporate many functions into the chip and to operate at a high speed, and the low power consumption is an important factor for the system design. In the case of the present embodiment, therefore, the gate delay time may desirably have less dispersion against the power source voltage, and the power source voltage may desirably be as low as possible at 4 V±10%.

Figure 62:
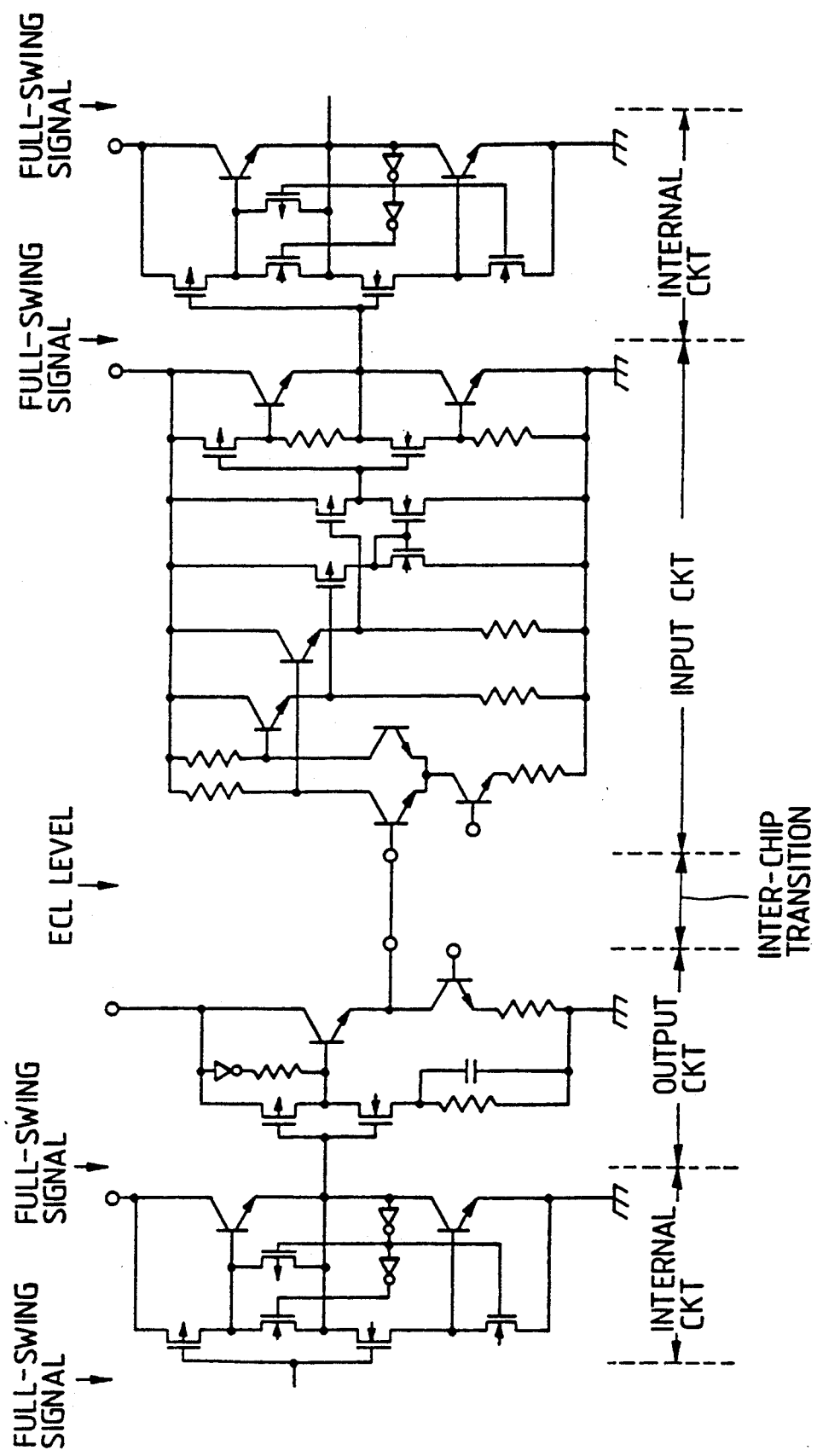
Figure 63:
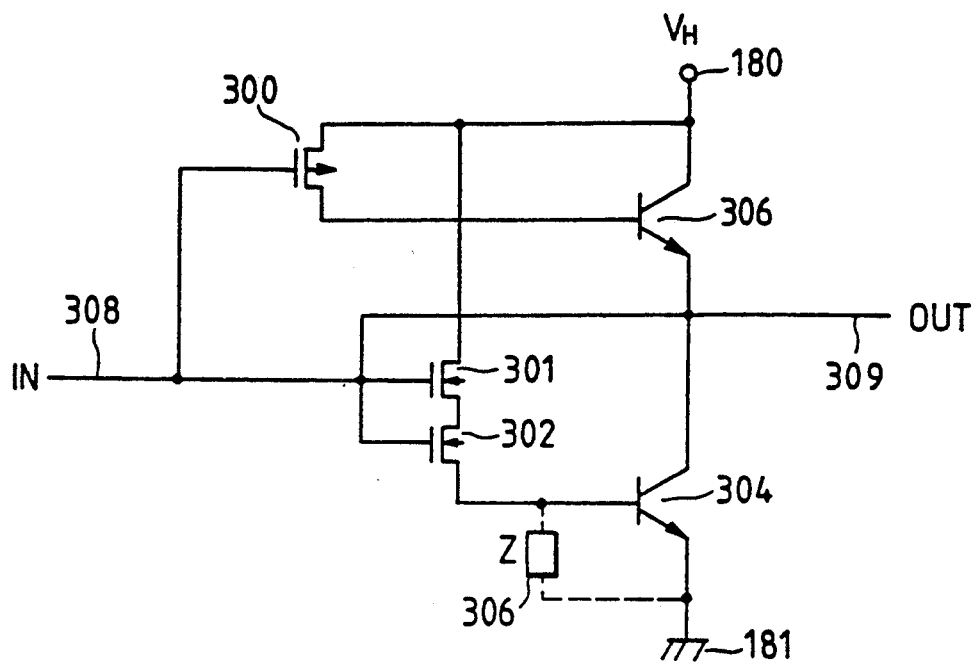
FIGS. 63 and 64 show BI-CMOS inverter circuits of the prior art.
Figure 64:
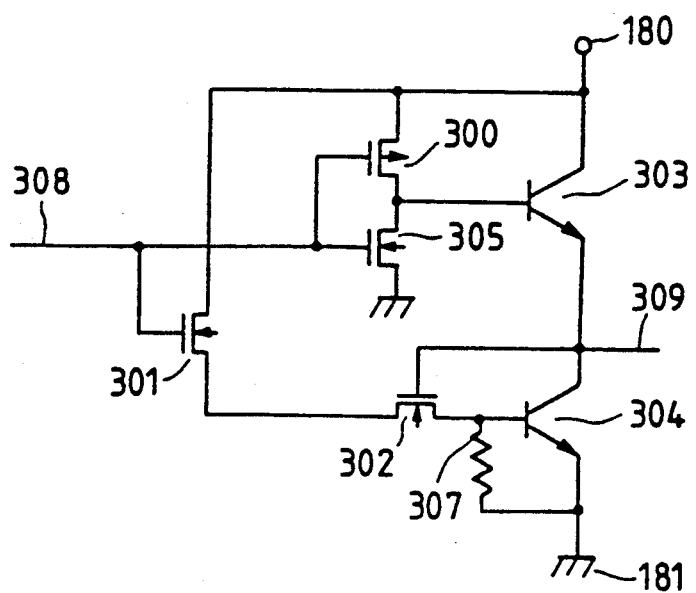

One example of the signal level in case either of the aforementioned power source potentials is used is shown in FIG. 62. The internal circuit uses the full-swing signal of the power source, which is fed to the output circuit. This output circuit transforms the full-swing signal into an ECL signal and outputs it to the outside of the chip. The input circuit changes the level of the ECL signal received and outputs the full-swing signal to operate the internal circuit. By using the full-swing signal in the chip, the leakage current of a next-stage gate can be eliminated to reduce the power consumption. Especially in the case of a low-voltage power source, the threshold voltage of the MOS transistor is frequently lowered to raise the current driving force. It is therefore necessary to fully swing the input signal to reduce the leakage current through the MOS. By using a small amplitude level of the ECL between the chips, moreover, the signal propagations are accomplished at a high speed and with a low amount of noise. Thus, a low-voltage power source system of high speed and low power consumption can be constructed by using the full-swing signal of the power source voltage in the chips and the ECL signals between the chips.

Figure 8:
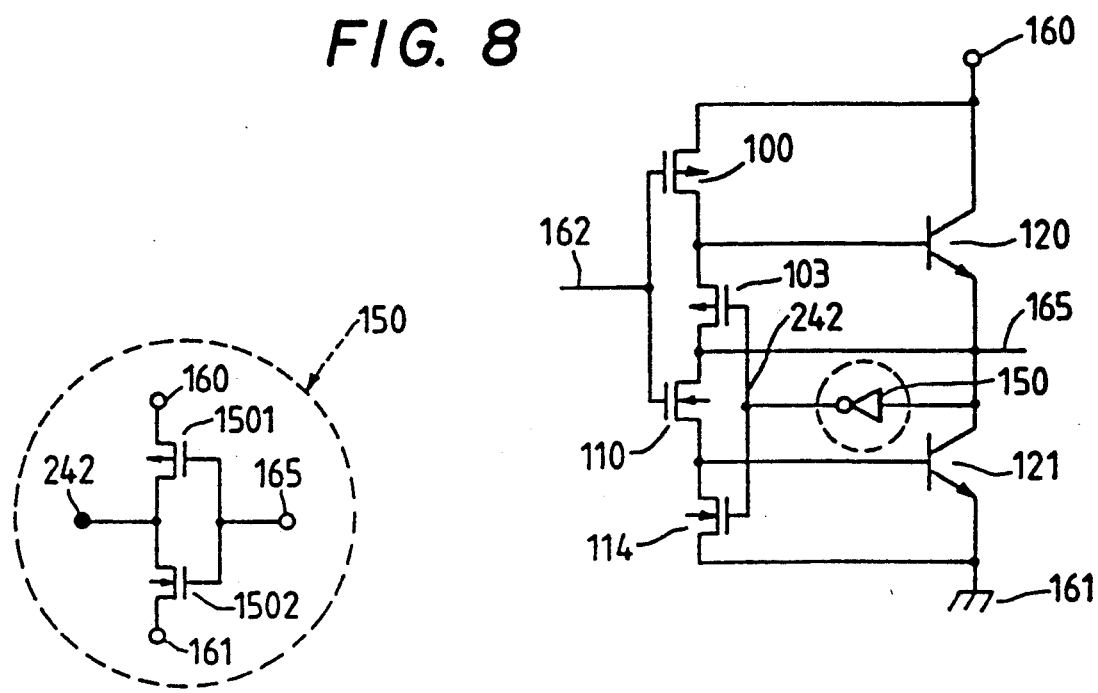
FIGS. 8 to 44 are circuit diagrams and operation timing charts of embodiments.

FIG. 8 shows a BI-CMOS inverter circuit, which is used in FIGS. 6 and 7, according to one embodiment of the present invention. Reference numeral 120 designates an NPN transistor (which will be abbreviated as "NPN"), which has its collector connected with the $V_{CC}$ power source terminal 160 and its emitter connected with the output terminal 165. Numeral 121 designates an NPN transistor which has its collector connected with the output terminal 165 and its emitter connected with the GND terminal 161. Numeral 100 designates a PMOS field effect transistor (which will be abbreviated as "PMOS"), which has its source connected with the $V_{CC}$ power source 160 and the collector of NPN 120, its drain connected with the base of the NPN 120 and its gate connected with the input terminal 162. Numeral 110 designates an NMOS field effect transistor (which will be abbreviated as "NMOS"), which has its source connected with the base of the NPN 121, its drain connected with the output terminal and the collector of NPN 121 and its gate connected with the input terminal 162. Numeral 103 designates a PMOS which has its source connected with the base of the NPN 120 and its drain connected with the output terminal 165, the drain of the NMOS 110 and the emitter of NPN 120. Numeral 114 designates an NMOS which has its drain connected with the base of NPN 121 and its source connected with the emitter of the NPN 121 and the GND terminal 161 ($|V_{CC}-V_{GND}|<5.0$ V). Numeral 150 designates a CMOS logic inverter which has its input terminal connected with the output terminal 165 and its output terminal connected with the gates of the PMOS 103 and the NMOS 114 for outputting a delay signal. CMOS logic inverter 150 includes a PMOS 1501 which has its gate connected with the output terminal 165, its source connected with the $V_{CC}$ power source 160, its drain connected with the gates of the PMOS 103 and NMOS 114, and a NMOS 1502 which has its gate connected with the output terminal 165, its source connected with the GND terminal 161, its drain connected with the gates of the PMOS 103 and NMOS 114.

Figure 10:
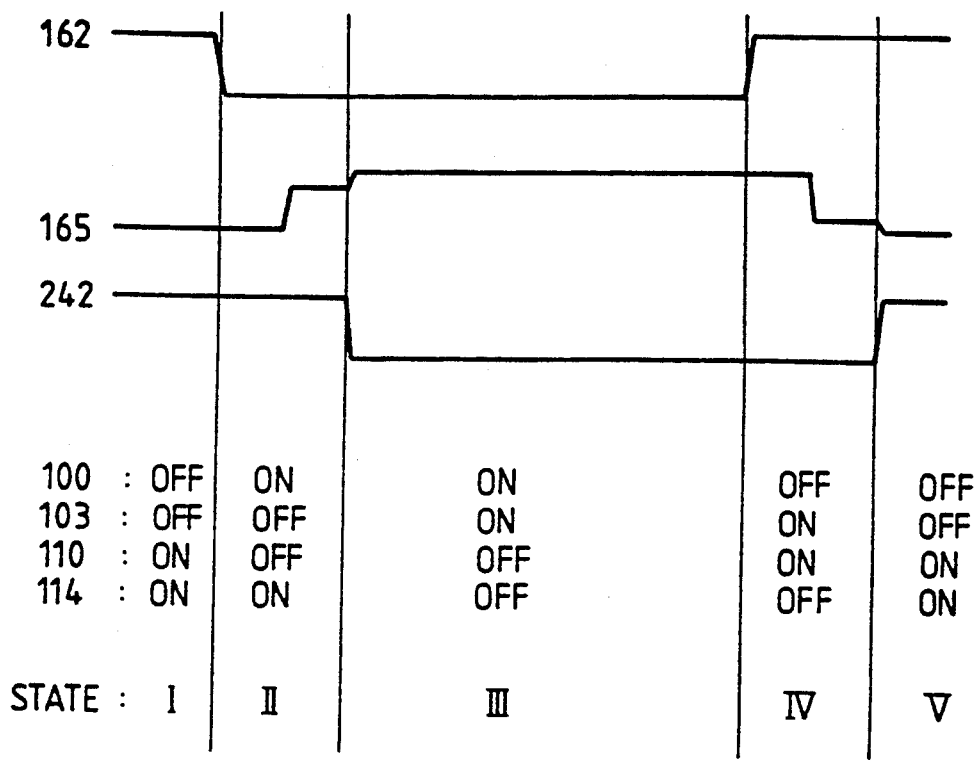

Next, the operations will be described with reference to FIG. 10. First of all, in the state I, the input voltage signal is High so that the PMOS 100 is OFF whereas the NMOS 110 is ON. Since, at this time, the output 165 is Low, the output 242 of the inverter 150 is High so that the PMOS 103 is OFF whereas the NMOS 114 is ON. Next, if the input voltage changes to Low so that the state II is entered, the NMOS 110 is turned OFF whereas the PMOS 100 is turned ON to feed the base current to turn ON the NPN 120. At this time, the output 242 of the inverter is kept High, because of the delay, so that the PMOS 103 is still OFF whereas the NMOS 114 is still ON. The NPN 121 is OFF. In the region II, the output voltage $V_{out}$ is raised to $V_{out} \approx V_{CC} - V_{BE}$. Here, $V_{CC}$ designates the power source voltage (which will be abbreviated as "$V_{CC}$"), and $V_{BE}$ designates the base-emitter voltage (which will be abbreviated as "$V_{BE}$").

When the state III is reached, the output 242 of the inverter 150 turns to Low, because of the delay, so that the NMOS 114 is turned OFF whereas the PMOS 103 is turned ON to raise the output voltage $V_{out}$ to $V_{out} \approx V_{CC}$. Next, if the input voltage turns from Low to High to invite the state IV to occur, the PMOS 100 is turned OFF whereas the NMOS 110 is turned ON so that it feeds the base current to turn ON the NPN 121. At this time, the output 242 of the inverter is kept Low, because of the delay, so that the PMOS remains ON whereas the NMOS 114 remains OFF. The output voltage $V_{out}$ drops to $V_{out} \approx V_{GND} + V_{BE}$. Here, $V_{GND}$ designates the ground potential (which will be abbreviated as "$V_{GND}$"). In the last state V, output 242 of the inverter 150 is turned to High, and the PMOS 103 is turned OFF whereas the NMOS 114 is turned ON so that the output voltage $V_{out}$ drops to $V_{out} \approx V_{GND}$.

With regard to the above-mentioned delay time, it can be arranged for the delay time to satisfy at least one of the following variations:

1) the delay time substantially satisfies a transitional time of at least one of NPN 120, 121 wherein at least one of NPN 120, 121 is in the transitional state in which at least one of NPN 120, 121 is switched;

2) the delay time substantially satisfies a time within the transitional time of at least one of NPN 120, 121 wherein at least one of NPN 120, 121 is in the transitional state;

3) the delay time substantially satisfies a time longer than the transitional time of at least one of NPN 120, 121;

4) the delay time substantially satisfies a time shorter than the period in which the input signal is switched;

5) the delay time substantially satisfies a period in which the output potential of said output terminal 165 varies from the first power source, potential $V_{CC}$ of said first power source terminal 160 to a potential which is higher than the second power source potential GND of said second power source terminal 161 by the base-emitter forward voltage $V_{BE}$ of at least one of NPN 120, 121;

6) the delay time is substantially longer than a period in which the output potential of said output terminal 165 varies from the first power source potential $V_{CC}$ of said first power source terminal 160 to a potential which is higher than the second power source potential GND of said second power source terminal 161 by the base-emitter forward voltage $V_{BE}$ of at least one of NPN 120, 121;

7) the delay time substantially satisfies a period in which the output potential of said output terminal 165 varies from the second power source potential GND of said second power source terminal 161 to a potential which is lower than the first power source potential $V_{CC}$ of said first power source terminal 160 by the base-emitter forward voltage VBE of at least one of NPN 120, 121; and 8) the delay time is substantially longer than a period in which the output potential of said output terminal 165 varies from the second power source potential GND of said second power source terminal 161 to a potential which is lower than the first power source potential $V_{CC}$ of said first power source terminal 160 by the base-emitter forward voltage $V_{BE}$ of at least one of NPN 120, 121.

Although the present invention is not limited to this, an example of an actual delay time can be in a range between 0.3 nsec and 0.5 nsec when output rise and fall times $T_r$ and $T_f$ are between 0.2 nsec and 0.3 nsec at a frequency of 400 MHz.

According to the present embodiment, when the PMOS 100 feeds the base current to NPN 120, the PMOS 103 is OFF so that the drain current of the PMOS 100 can be wholly fed as the base current of the NPN 120 to turn on the NPN 120 at a high speed (in the state II). Since, in this state, the NMOS 114 is ON whereas the NPN 121 has its base grounded to the GND potential, the NPN 121 is OFF in advance in the state II, i.e., at the rise of the output, so that no through current will flow. In the output drop (in the state IV), on the other hand, the NMOS 114 is OFF so that the drain current of the NMOS can be wholly fed to the NPN 121 to turn ON the same at a high speed. Since, at this time, the PMOS 103 is ON to short the base-emitter of the NPN 120, NPN 120 is turned OFF. Thus, no through current will flow. Thus, in the present embodiment, when the NPN 120 and the NPN 121 are turned ON, the PMOS 103 and the NMOS 114 acting as their respective base current extracting elements are OFF so that the NPN can be turned ON in an ideal state.

In the BI-CMOS circuit of the type in which the output of the bipolar transistor totem pole connection is driven with the MOS, it is the determinant of the low power consumption as to how quickly the bipolar transistor has its base current extracted and is turned OFF to reduce the through current. For this determination, it is necessary to make a design to reduce the impedance when the base current of the bipolar transistor is to be extracted. On the contrary, the base current will leak to the extraction element when the bipolar transistor is turned ON. Therefore, the BI-CMOS circuit of the prior art encounters a fundamental problem in that the power consumption is increased if a high-speed design is made by setting the base current extraction element at a high impedance whereas the speed is dropped if a low power consumption design is made by setting the base current extraction element at a low impedance. However, this fundamental problem has been solved by the present embodiment. Specifically, even if the ON resistances of the PMOS 103 and the NMOS 114 acting as the base current extraction elements are designed to take sufficiently low levels so as to reduce the power consumption in the transitional state, the extraction elements 103 and 114 are OFF and in the high impedance states when the NPN is turned ON because of the delay. Thus, it is possible to design the low power consumption without deteriorating the high speed.

Figure 9:
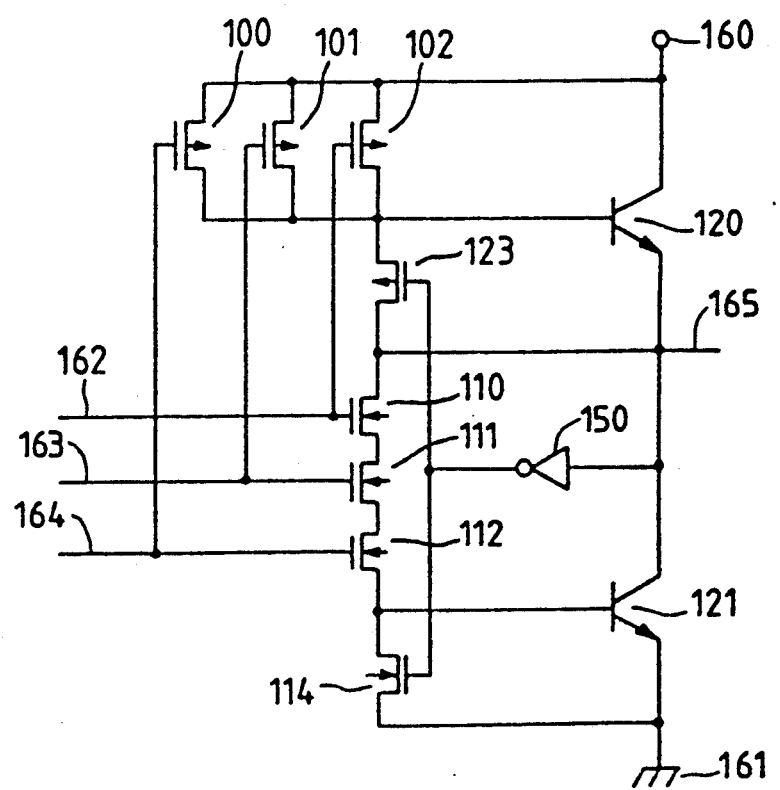

FIG. 9 shows an embodiment in which a concept similar to that of the inverter of FIG. 8 is extended to a three-input NAND circuit. Specifically, in FIG. 9 the source-drain current paths of PMOS 101 and 102 are connected in parallel with the source-drain current path of the PMOS 100, and the source-drain current paths of NMOS 111 and 112 are connected in series with the source-drain current path of the NMOS 110. The gates of PMOS 101 and NMOS 111 are connected with an input terminal 163, and the gates of PMOS 102 and NMOS 112 are connected with an input terminal 164. The operations will be omitted here because they can be easily understood from the example of the inverter shown in FIG. 8. In addition to the present embodiment, generally speaking, a k-input (k≧2) NAND circuit can be constructed.

Figure 11:
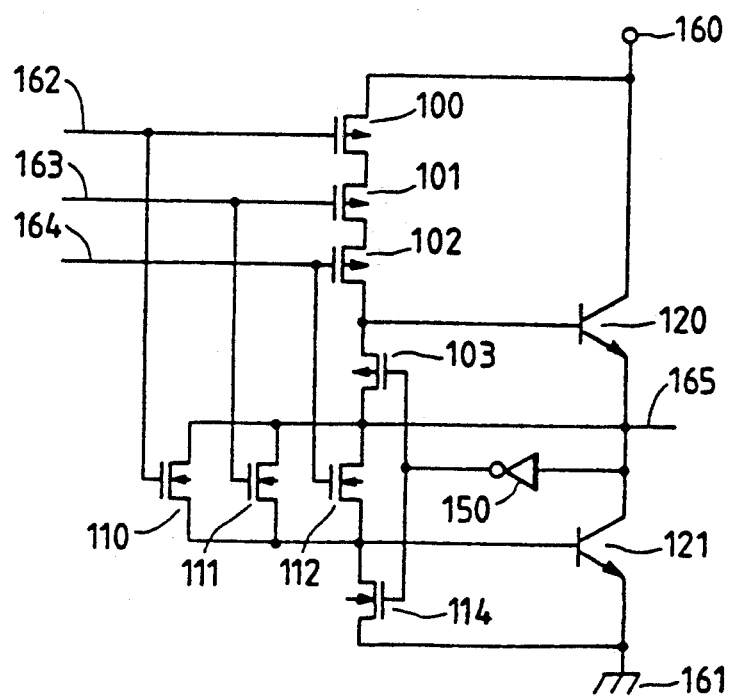

FIG. 11 shows an embodiment in which a concept similar to that of the inverter of FIG. 8 is extended to a three-input NOR circuit. In FIG. 11, the PMOS 101 and 102 are connected in series with the PMOS 100, and the NMOS 111 and 112 are connected in parallel with the NMOS 110. The operations will be omitted here because they can be easily understood from the example of the inverter. In addition to the present embodiment, generally speaking, a k-input (k≧2) NOR circuit can be constructed.

Figure 12:
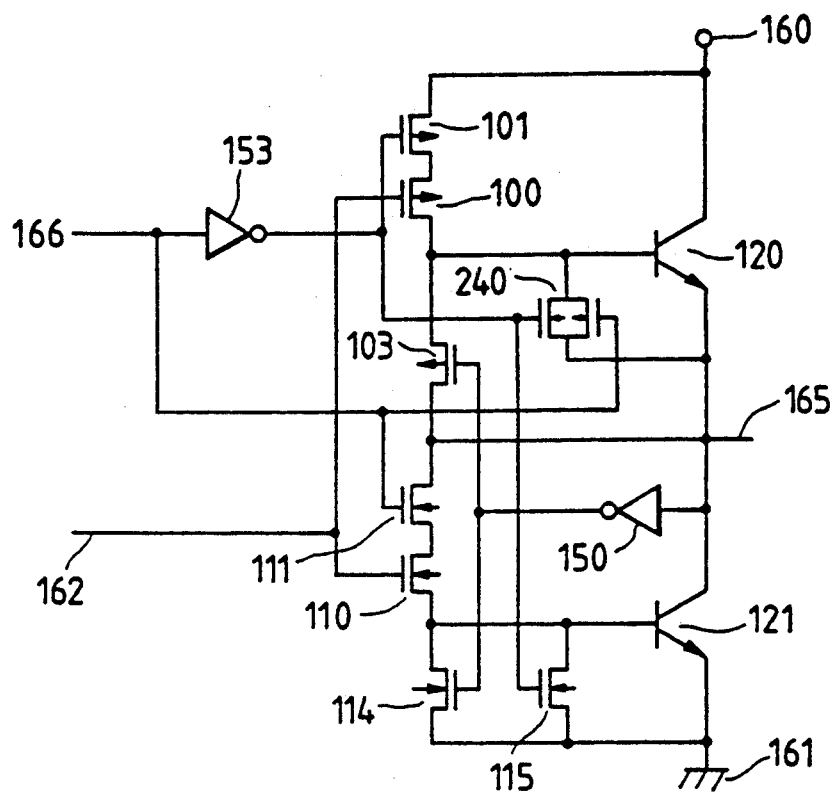

FIG. 12 shows an example in which a concept similar to that of the inverter of FIG. 8 is extended to a three-state inverter circuit. The source-drain current path of the PMOS 101 is connected in series with the source-drain current path of the PMOS 100, a transfer gate 240 is connected in parallel with the PMOS 103, and the source-drain current path of the NMOS 115 is connected in parallel with the source-drain current path of the NMOS 114. A CMOS inverter 153 has its input connected with an enable terminal 166 and its output connected with the PMOS 101 and the gate of NMOS of the transfer gate 240. The enable terminal 166 is connected with the gate of the NMOS ill and the gate of the PMOS of the transfer gate 240. In operation, when an enable terminal 166 is High, PMOS 101 and NMOS 111 are ON, and the transfer gate 240 and the NMOS 115 are OFF so that the same operations as those of the inverter of FIG. 8 are accomplished in accordance with the signal fed to the input 162. When the Low signal is fed to the enable terminal 166, on the other hand, the PMOS 101 and NMOS ill are turned OFF, the transfer gate 240 and the NMOS 115 are turned ON, and the NPN 120 and 121 are turned OFF so that the output terminal 165 comes into a high-impedance state.

Figure 13:
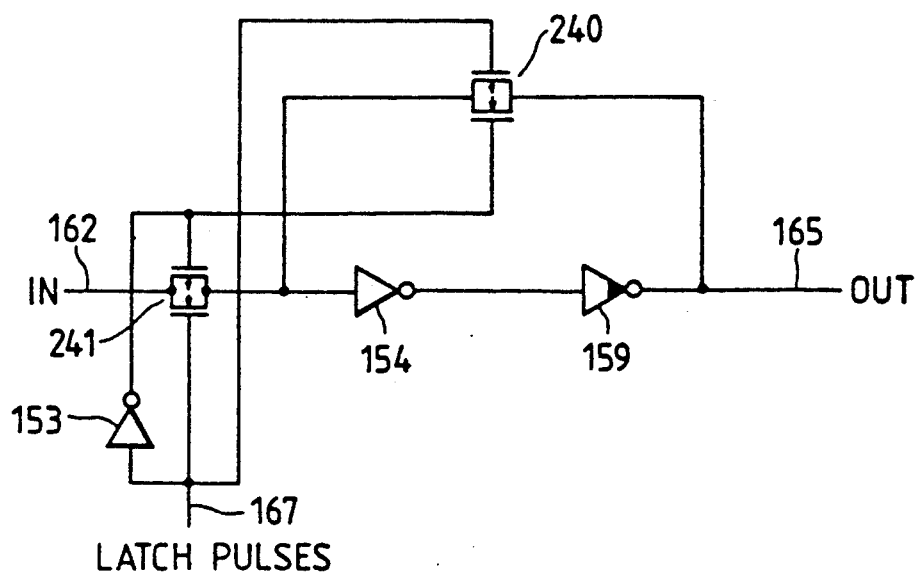

FIG. 13 shows an example of a latch circuit using the inverter of the present embodiment. A transfer gate 241, a CMOS inverter 154 and a BI-CMOS inverter 159 are connected in series, and the transfer gate 240 is connected between the output of the inverter 159 and the input of the inverter 154. The CMOS inverter 153 has its input terminal connected with the NMOS gate of the transfer gate 241 and its output connected with the PMOS gate of the transfer gate 241. The other terminal of this transfer gate 241 is connected with the input terminal 162. The output of the BI-CMOS inverter 159 is connected with the output terminal 165. The NMOS gate of the transfer gate 241 is connected with the latch pulse terminal 167. When the High signal is fed to the latch pulse terminal 167, data are written in the circuit from the input terminal 162. When the Low signal is fed to the latch pulse terminal 167, the data written previously are held.

Figure 14:
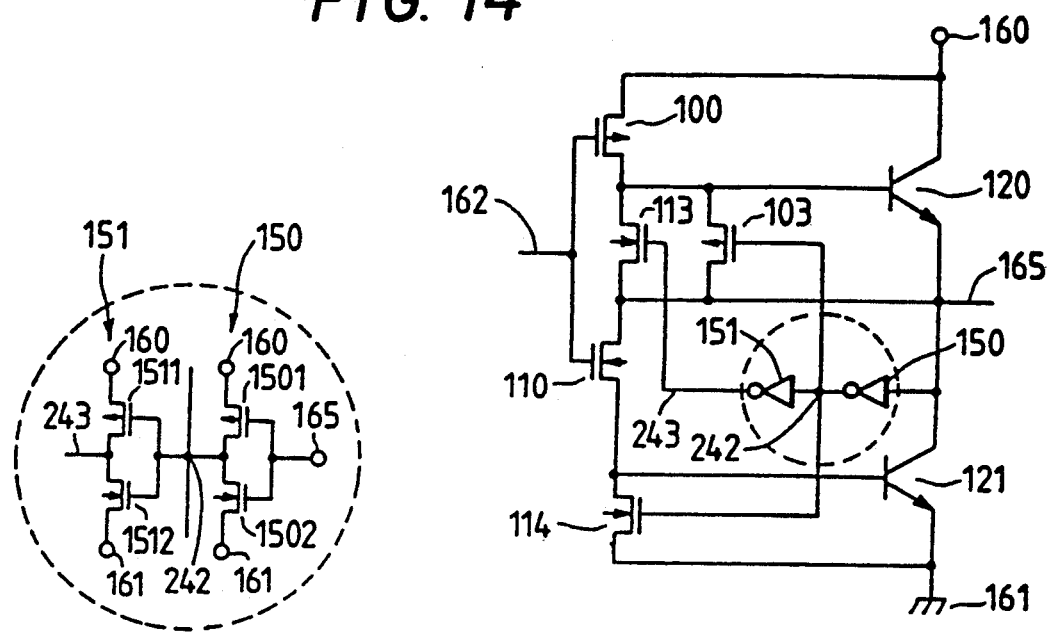

FIG. 14 shows another embodiment of the present invention, which is constructed by adding the following elements to the inverter circuit of FIG. 8. Specifically, the source-drain current path of NMOS 113 is connected in parallel with the source-drain current path of the PMOS 103, and a CMOS inverter 151 including PMOS 1511 and NMOS 1512 has its input terminal connected with the output terminal 242 of the CMOS inverter 150 and its output terminal connected with the gate of the NMOS 113.

Figure 16:
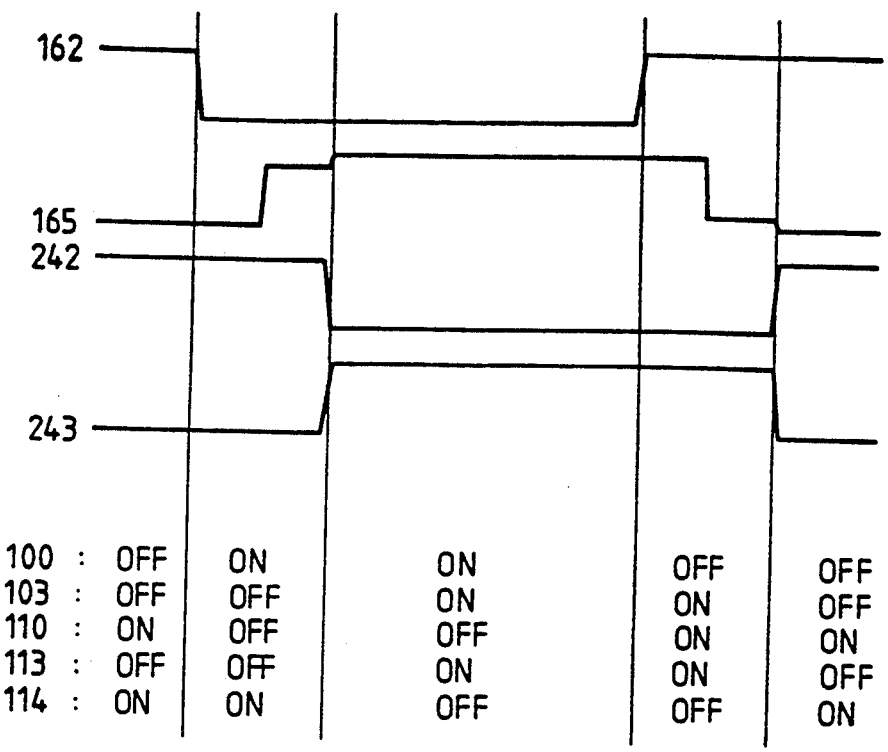

The operations of the structure of FIG. 14 are illustrated in FIG. 16. The difference from the inverter of FIG. 8 resides in that the NMOS 113 is turned ON and OFF with substantially the same timings as those of the PMOS 103. The addition of this NMOS 113 intensifies the base current extraction of the NPN 120. Specifically, the PMOS 103 is turned OFF when VS assumes the value Of $V_S \approx V_G + V_{thP}$. Here, $V_G$ designates the gate voltage of the PMOS, and $V_{thP}$ designates the threshold voltage of the PMOS. Because of $V_G \approx 0$, $V_S \approx V_{thP}$, the base voltage of the NPN 120 will not become lower than $V_{thP}$. The addition of the NMOS 113 enables the base voltage of the NPN 120 to drop to the GND level equal to the output voltage. If the base extraction is intensified by adding the NMOS 113 as in this embodiment, the power consumption can be reduced. Since, moreover, the NMOS 113 is OFF when the NPN 120 is turned ON, the NPN 120 is turned ON in an ideal state so as not to deteriorate high speed operation even if the NMOS 113 is added.

Figure 15:
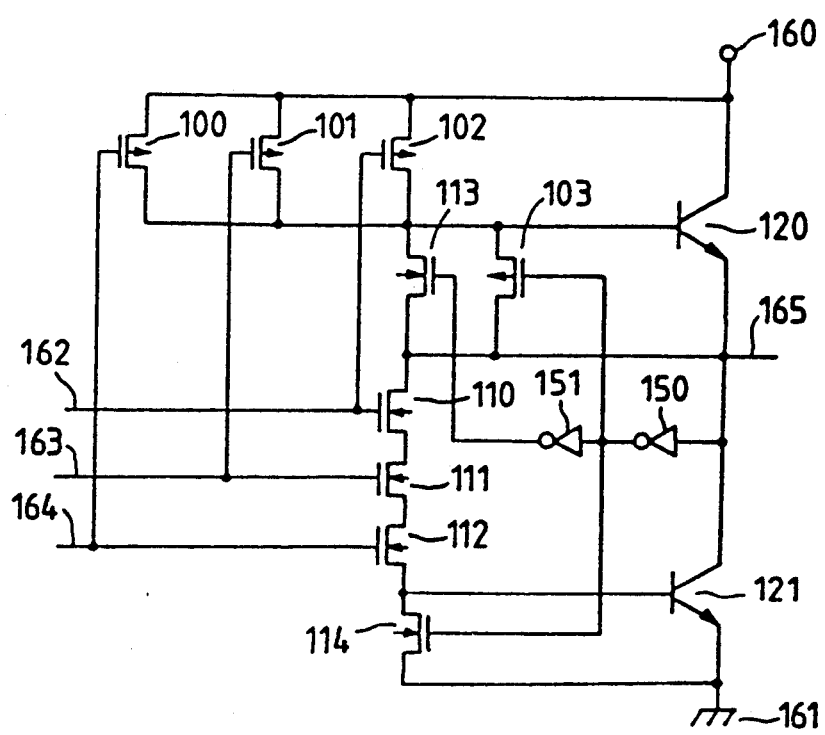

FIG. 15 shows an example in which a concept similar to that of the inverter of FIG. 14 is extended to a three-input NAND circuit. The manner of extension is similar to that which is made when the inverter of FIG. 8 is extended to the three-input NAND of FIG. 9. Moreover, the operations can be easily understood from the operations of the inverter of FIG. 14.

Figure 17:
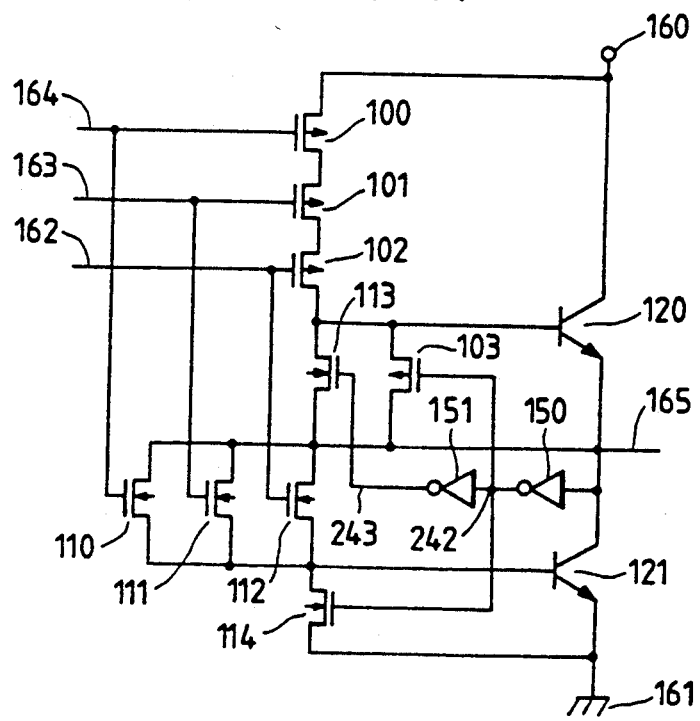

FIG. 17 shows an example in which a concept similar to that of the inverter of FIG. 14 is extended to a three-input NOR circuit. The manner of extension is similar to that which is made when the inverter of FIG. 8 is extended to the three-input NOR of FIG. 11. Moreover, the operations can be easily understood from the operations of the inverter of FIG. 14.

Figure 18:
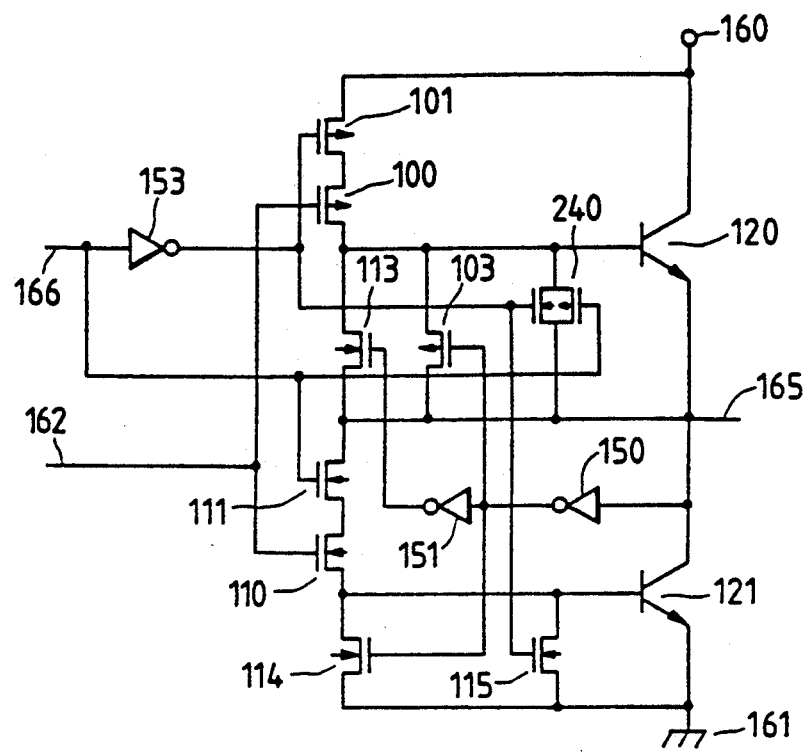

FIG. 18 shows an example in which a concept similar to that of the inverter of FIG. 14 is extended to a three-state inverter circuit. The manner of extension is similar to that which is made when the inverter of FIG. 8 is extended to the three-state inverter of FIG. 12. Moreover, the operations can be easily understood from the operations of the three-state inverter of FIG. 12.

Figure 48:
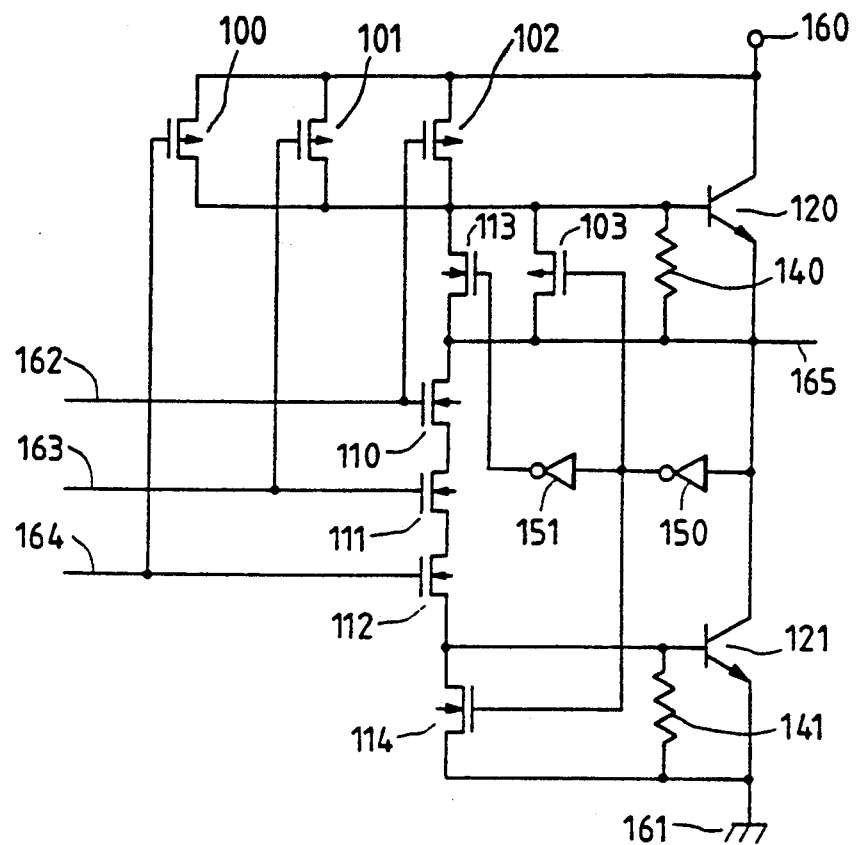
FIGS. 48 to 62 are diagrams for explaining the embodiments of the present invention.

FIG. 48 shows a circuit in which resistors 140 and 141 are added between the respective bases and emitters of the NPN 120 and 121 of the circuit of FIG. 15. The reason why the resistors are inserted between the bases and emitters of the NPN will be described in the following.

In the three-input NAND circuit of FIG. 15, as is apparent from the description of the operations of the inverter circuit of FIG. 14, there arises a state in which the PMOS 100, 101 and 102 are OFF while the PMOS 103 and the NMOS 113 are OFF. At this time, the base of the NPN 120 is in a floating state. If noise enters an input terminal 164 connected with the gate of the PMOS 120 to turn ON the PMOS 100 for an instant, the current flows through the PMOS 100 from the power source 100 to the base of the NPN 120. Since the base of the NPN is in the floating state, the base current has no place to leak to. As a result, the NPN 120 is turned ON so that the through current flows from the emitter of the NPN 120 through the NMOS 110, 111, 112 and 114 to the GND 161. Then, the power consumption may increase, and, in the worst, the circuit may malfunction.

If the resistor 140 is inserted between the base and emitter of the NPN 120, as shown in FIG. 48, it bypasses the current which might otherwise be fed from the PMOS 100 to the base of the NPN 120 due to noise. Therefore, the NPN 120 is not turned ON in this situation. Here, the first resistor 140 is naturally set at such a sufficiently high resistance so as not to adversely affect the rising characteristics of the circuit.

As also shown in FIG. 15, the NMOS 110 and 111 are ON, but the NMOS 112 and 114 are turned OFF to bring the base of the NPN 121 into the floating state. If, at this time, noise enters the input 164 to turn ON the NMOS 112 for an instant, the current flows from the output 165 (at the High level) through the PMOS 110, 111 and 112 to the base of the NPN 121 to turn ON the NPN 121. Then, the current flows from the power source 160 through the PMOS 100 and 103 and the NMOS 113 to the collector of the NPN 121 so that the through current flows to the ground 161 to increase the power consumption or, in the worst case, to cause the circuit to malfunction.

Accordingly, if the second resistor 141 is connected between the base and emitter of the NPN 121, as shown in FIG. 48, it bypasses the current due to noise so that the NPN 121 is not turned ON. Here, the second resistor 141 is set like the first resistor 140 at such a sufficiently high level that it will not deteriorate the circuit characteristics. The reliability of the circuit can be improved by connecting the resistors between the bases and emitters of the NPN 120 and 121, as described above. This method can be applied to not only the inverter circuit of FIG. 14 and the three-input NOR circuit of FIG. 17, but also to other circuits of similar type.

Figure 19:
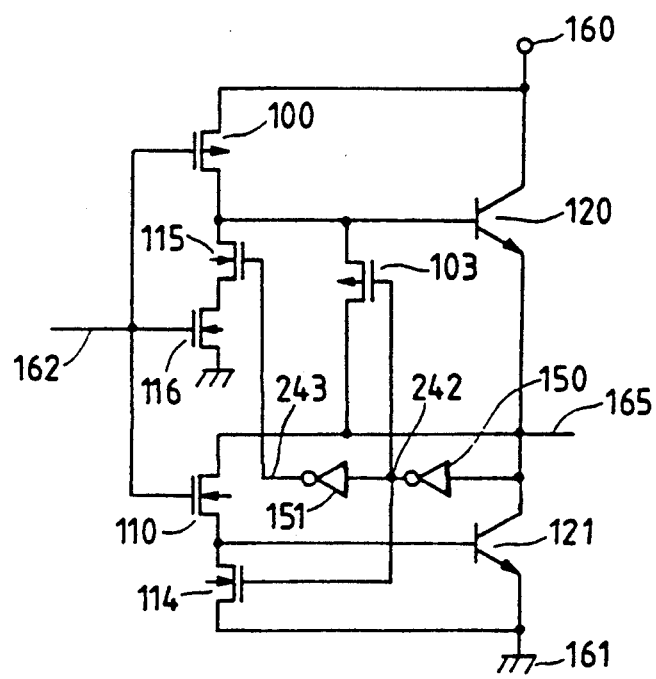
Figure 21:
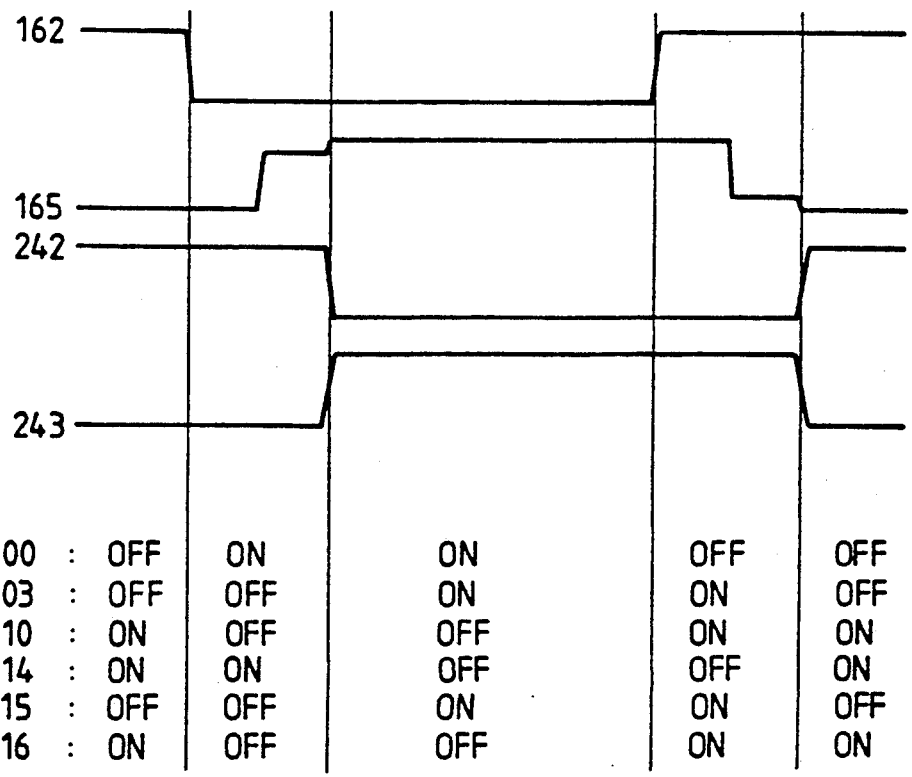

FIG. 19 shows another embodiment of the present invention, which is constructed by adding the following elements to the inverter circuit of FIG. 8. Specifically, the NMOS 115 has its drain connected with the base of the NPN 120. The NMOS 116 has its gate connected with the input terminal 162, its drain connected with the source of the NMOS 115 and its source connected with the GND power 161 (discharge potential point). The output of the CMOS inverter 150 is connected with the CMOS inverter 151, which has its output connected with the gate of the NMOS 115. The operations are illustrated in FIG. 21.

The features of the present embodiment reside in that the base of the inverter of FIG. 8 is coupled to the GND through the base current extracting NMOS 115 and 116. The base and emitter of the NPN 120 are not merely shorted but grounded to the GND level so that the NPN can be turned OFF at a high speed.

Figure 20:
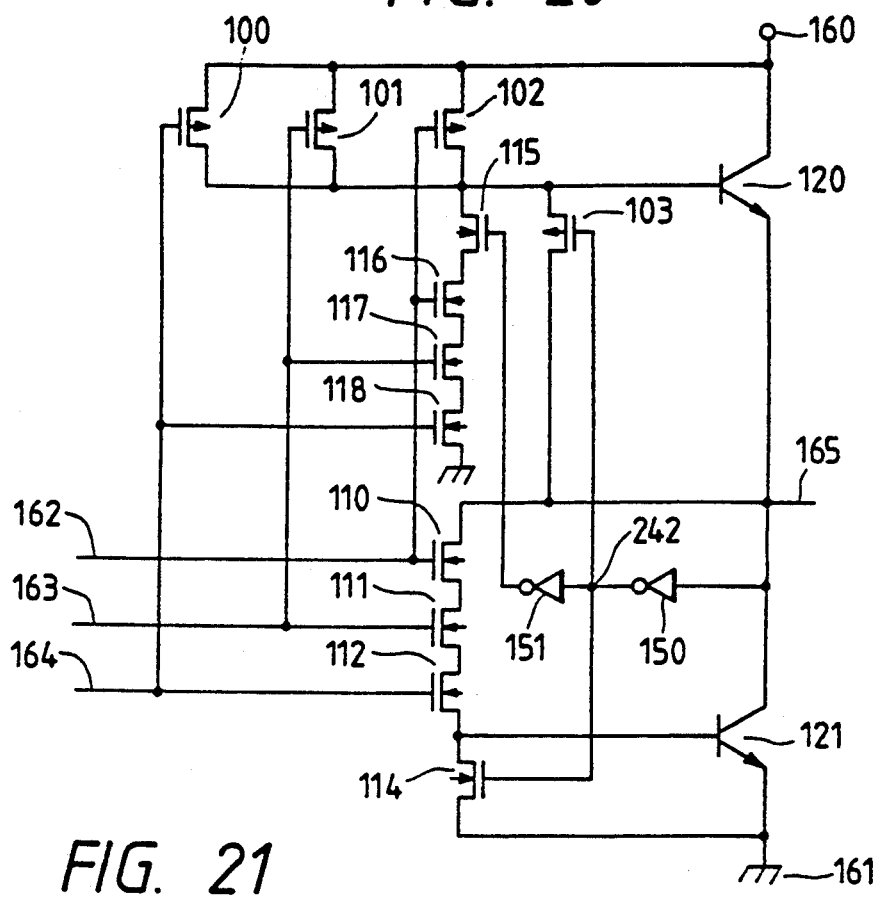
Figure 22:
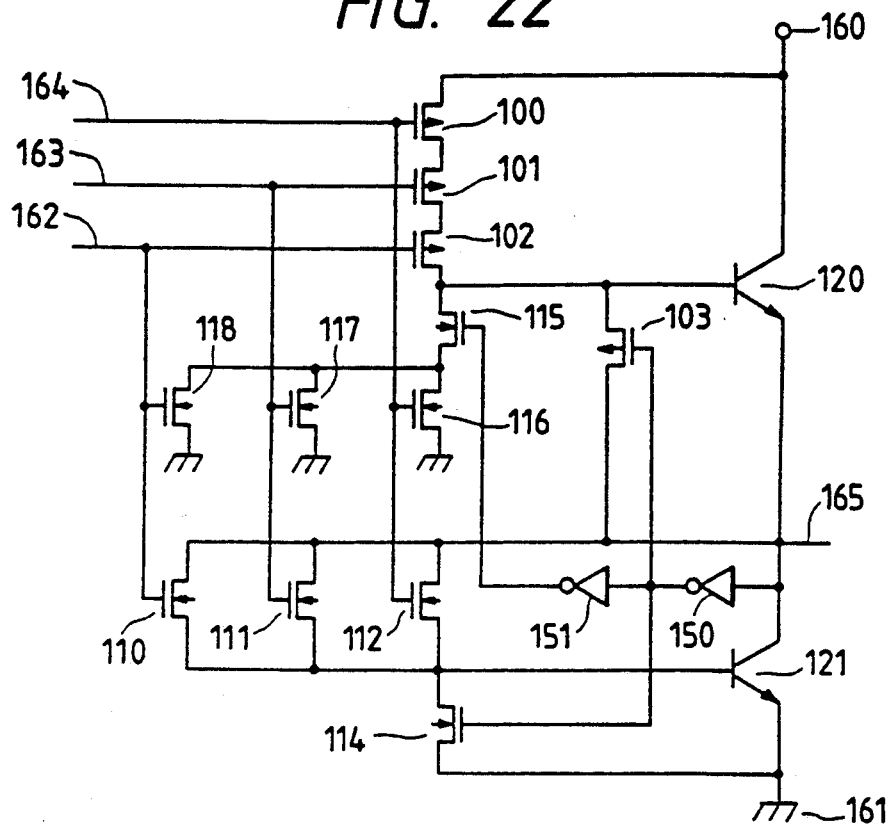
Figure 23:
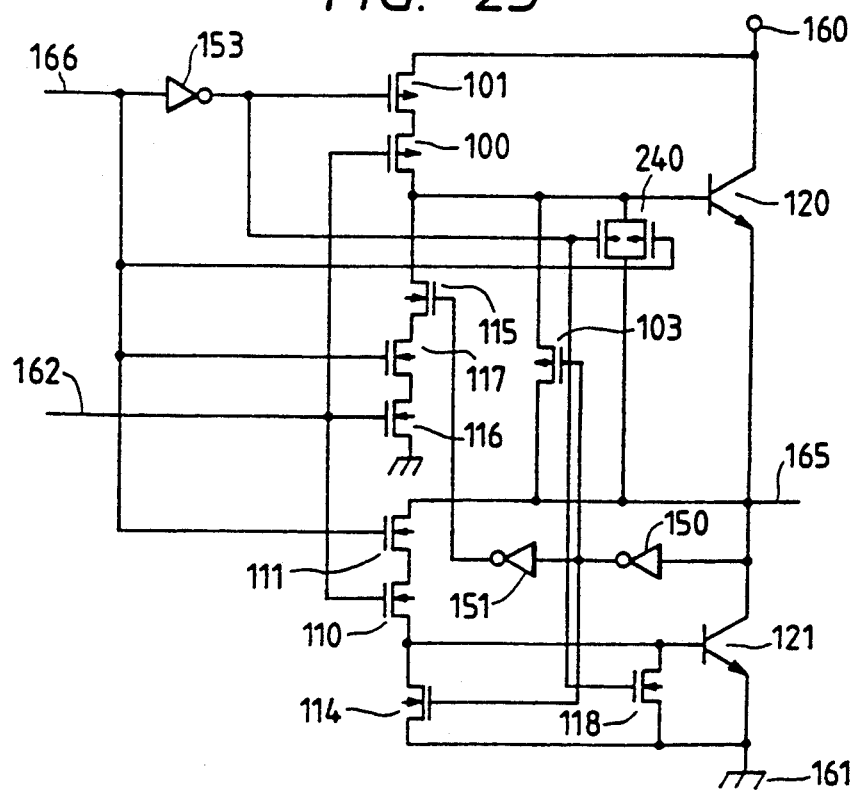

FIG. 20 shows an example in which the present embodiment is extended to a three-NAND circuit; FIG. 22 shows an example of extension to a three-NOR circuit; and FIG. 23 shows an example of extension to a three-state inverter. The methods and operations of the extension can be easily understood from the foregoing embodiments.

Figure 24:
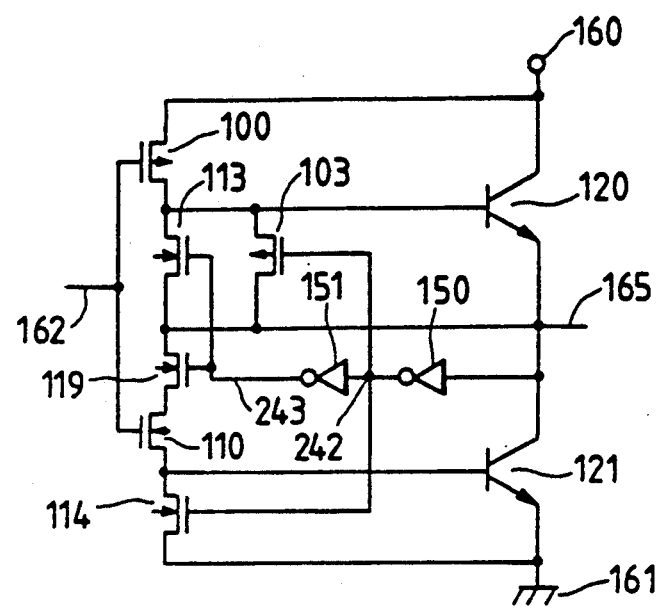
Figure 26:
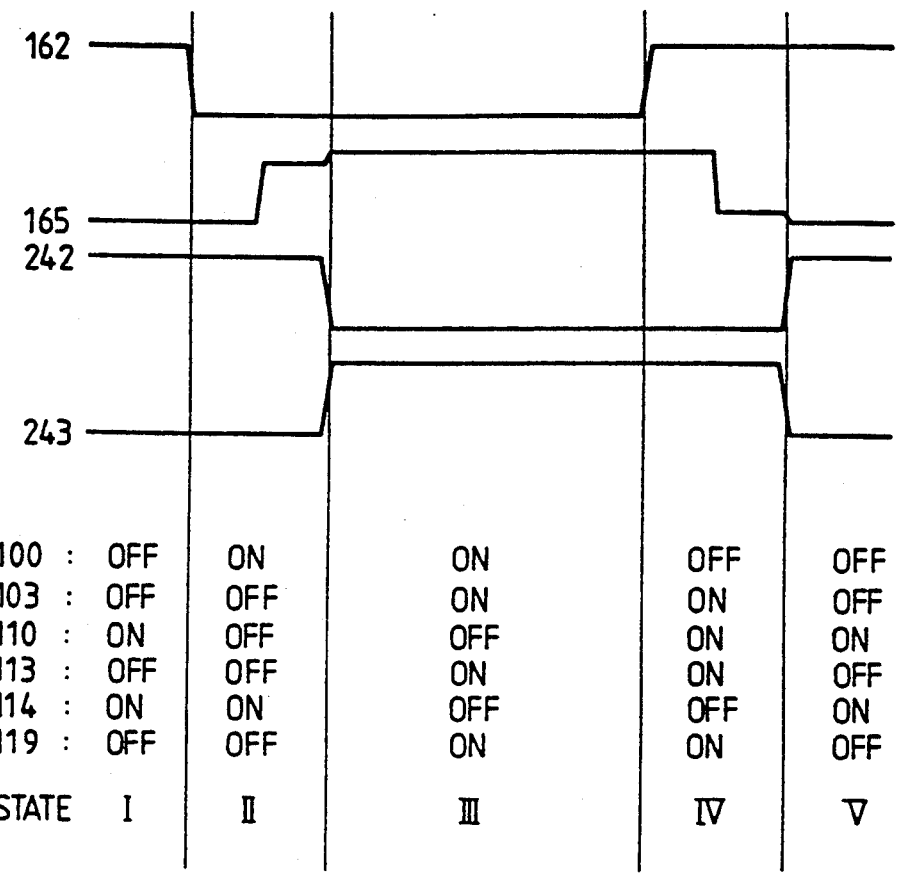

FIG. 24 shows another embodiment of the present invention which is constructed by adding the following elements to the embodiment of the inverter of FIG. 14. Specifically, between the drain of the NMOS 110 of FIG. 14 and the output terminal 165, there is connected an NMOS 119, which has its drain, its source and its gate connected with the output terminal 165, the drain of the NMOS 110 and the output of a CMOS inverter 243, respectively. The operations of the present embodiment are illustrated in FIG. 26. The features of the present embodiment reside in that the NMOS 119 is OFF during the rise of the output (in the state II of FIG. 26) to prevent the emitter current of the NPN 120 from leaking from the NMOS 110 to the base of the NPN 121. Thus, the rise of the output can be sped up.

Figure 25:
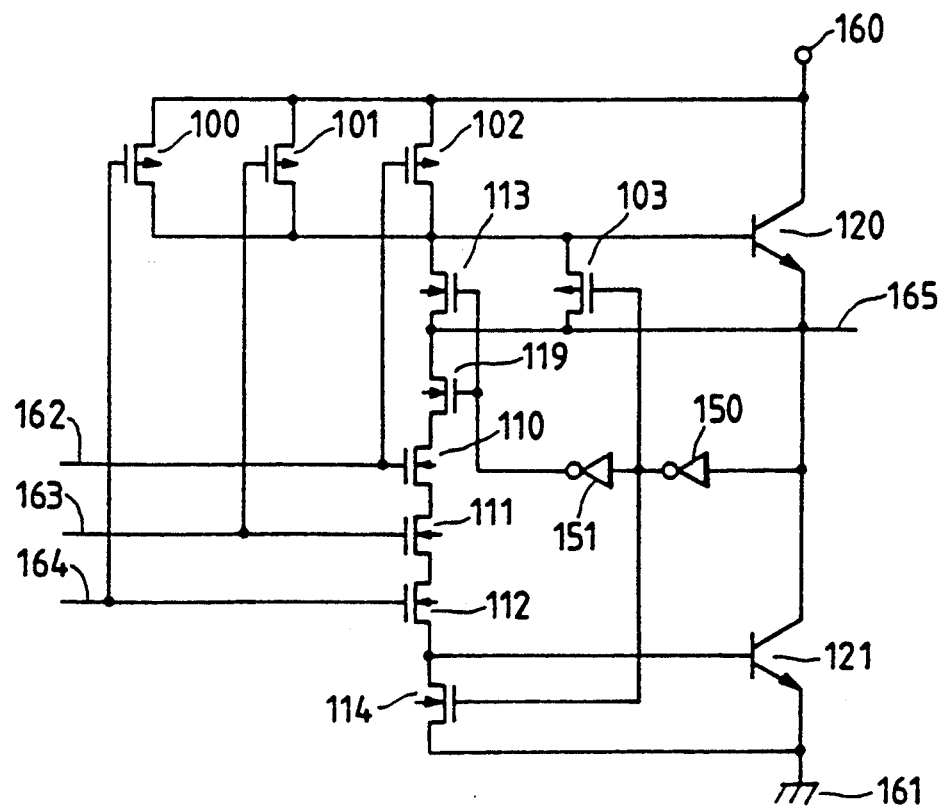
Figure 27:
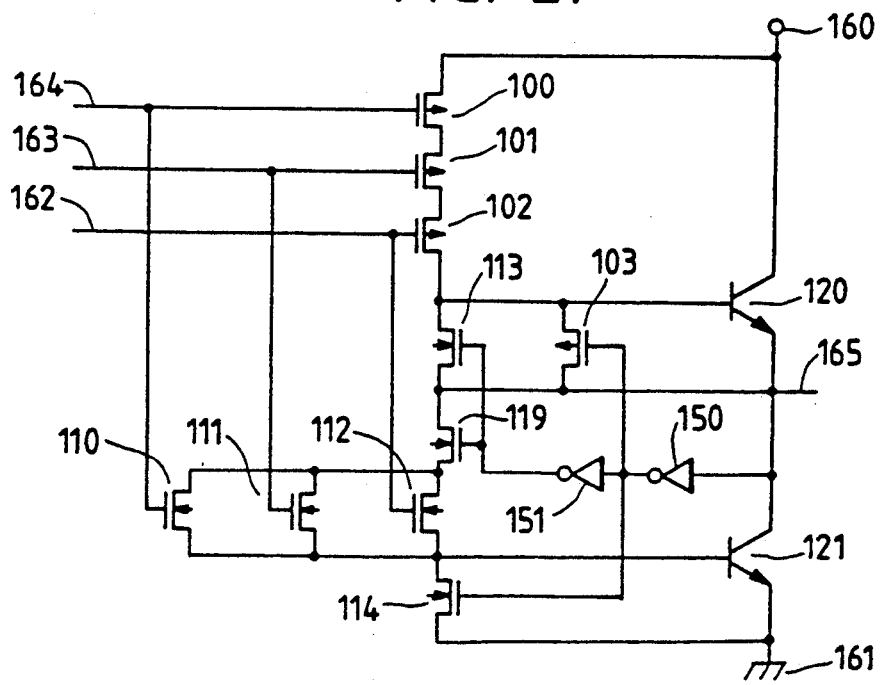
Figure 28:
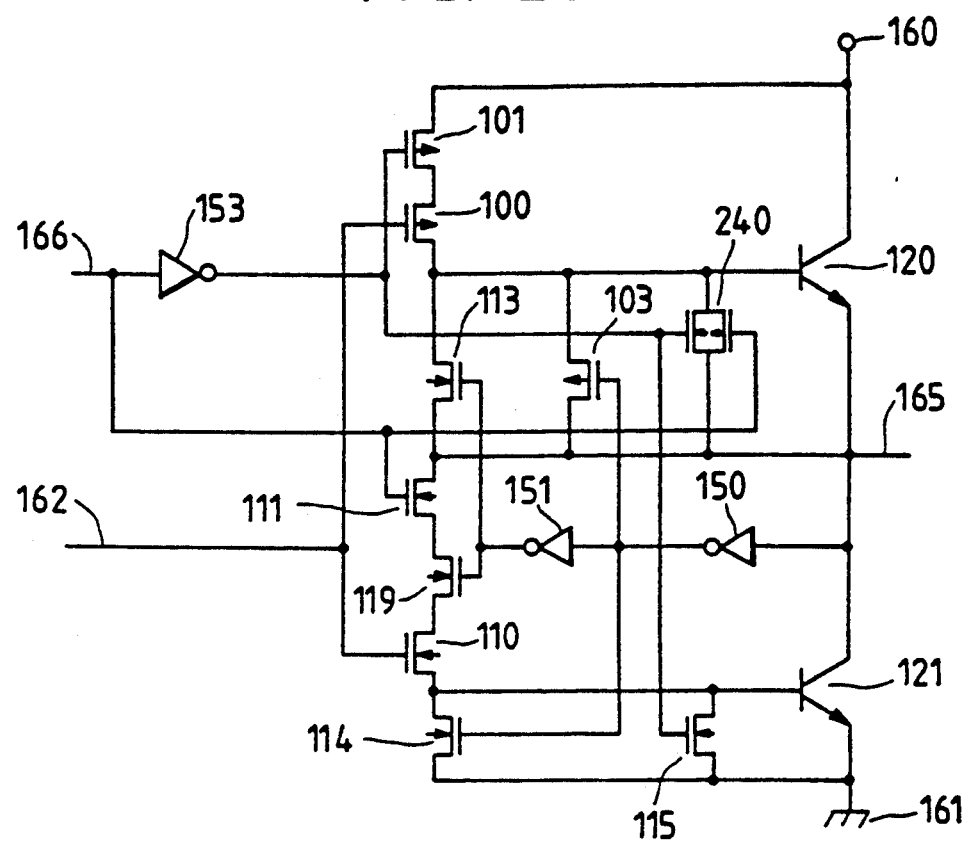

FIG. 25 shows an example in which the present embodiment is extended to a three-input NAND circuit; FIG. 27 is an example of extension to a three-input NOR circuit; and FIG. 28 shows an example of extension to a three-state inverter. The methods and operations of extension can be easily understood from the foregoing embodiments.

Figure 29:
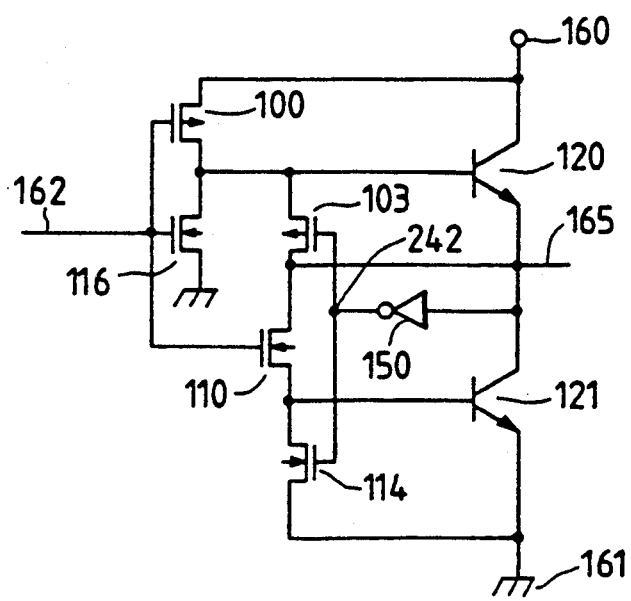
Figure 31:
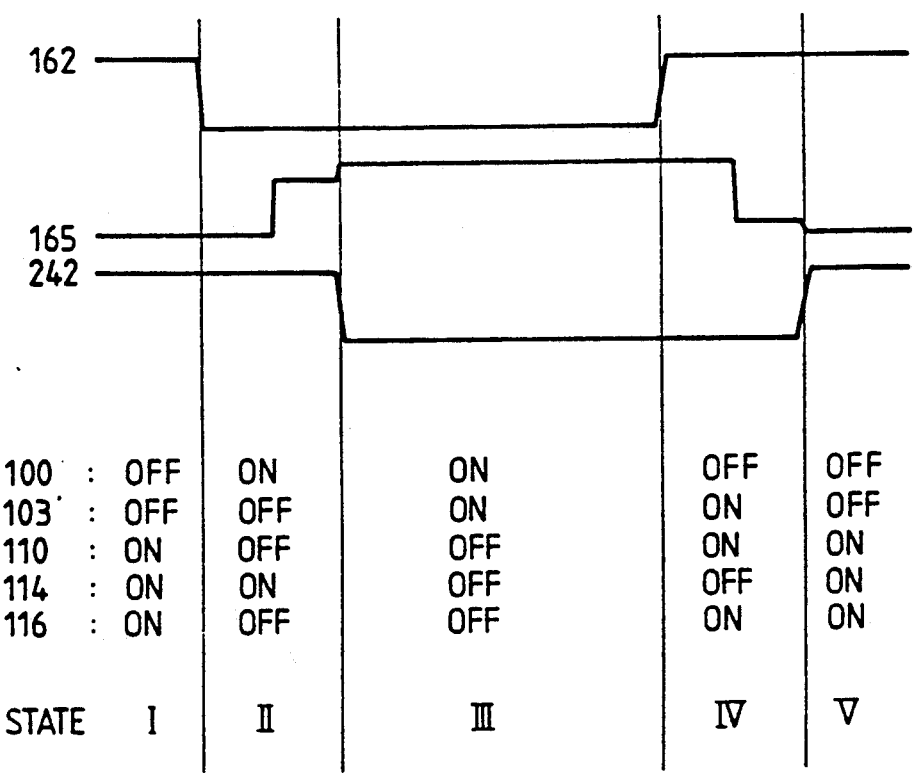

FIG. 29 shows another embodiment of the present invention, in which the NMOS 116 is added to the inverter circuit of FIG. 8. The NMOS 116 has its drain, source and gate connected with the base of the NPN 120, the GND 161 and the input terminal 162, respectively. The operations can be easily understood from FIG. 31. The difference of the present embodiment from the foregoing embodiments reside in that the base current of the NPN 120 will leak through the NMOS 116 when the output rises. This concept is contrary to the gist of the present invention. Since, however, the NMOS 116 is added as a supplement to the base extraction PMOS 103, it is BO designed to have a remarkably small size and a remarkably small leakage of the base current. Moreover, the output drop is similar to that of the embodiment of FIG. 8. Therefore, the best use is made of the gist of the present invention to eliminate the leakage of the base current. A rather higher effect in the low power consumption can be attained by supplementing the base current extraction of the NPN 120 with the NMOS 116 to speed up the NPN 120.

Figure 30:
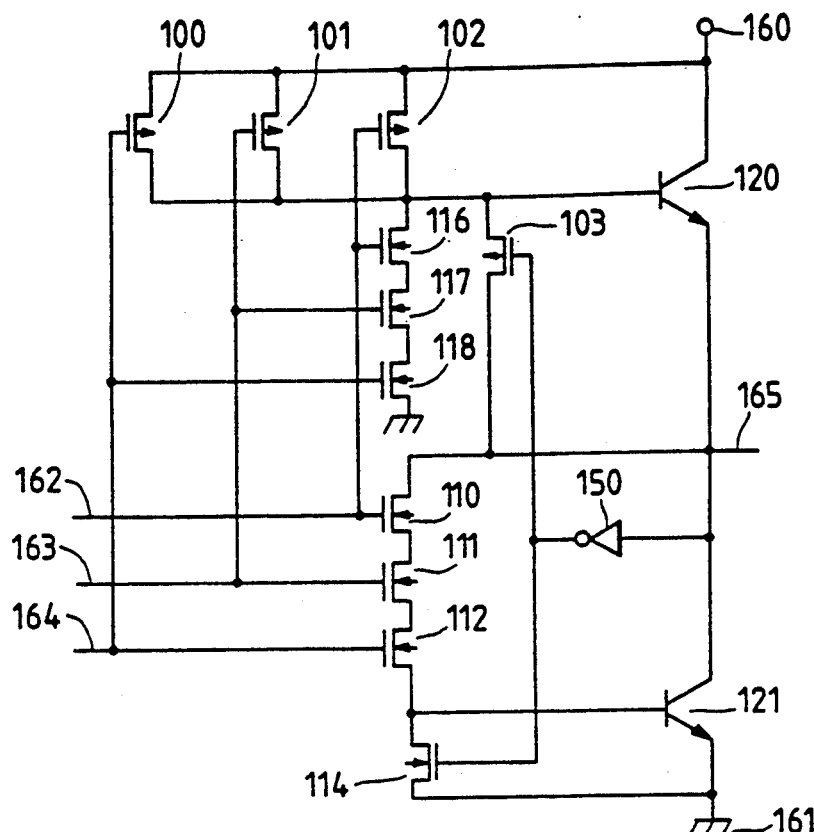
Figure 32:
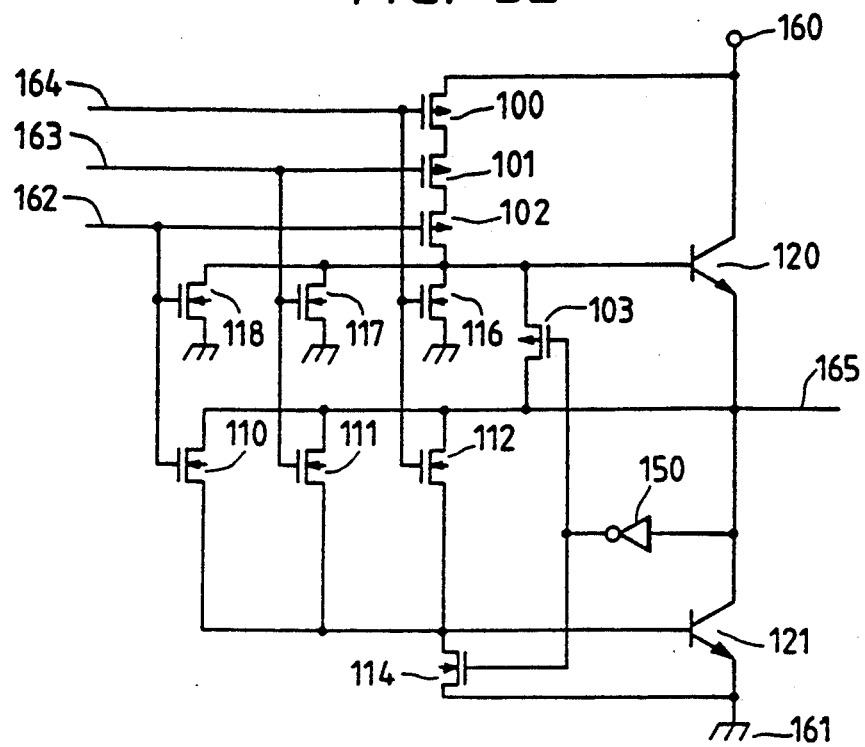
Figure 33:
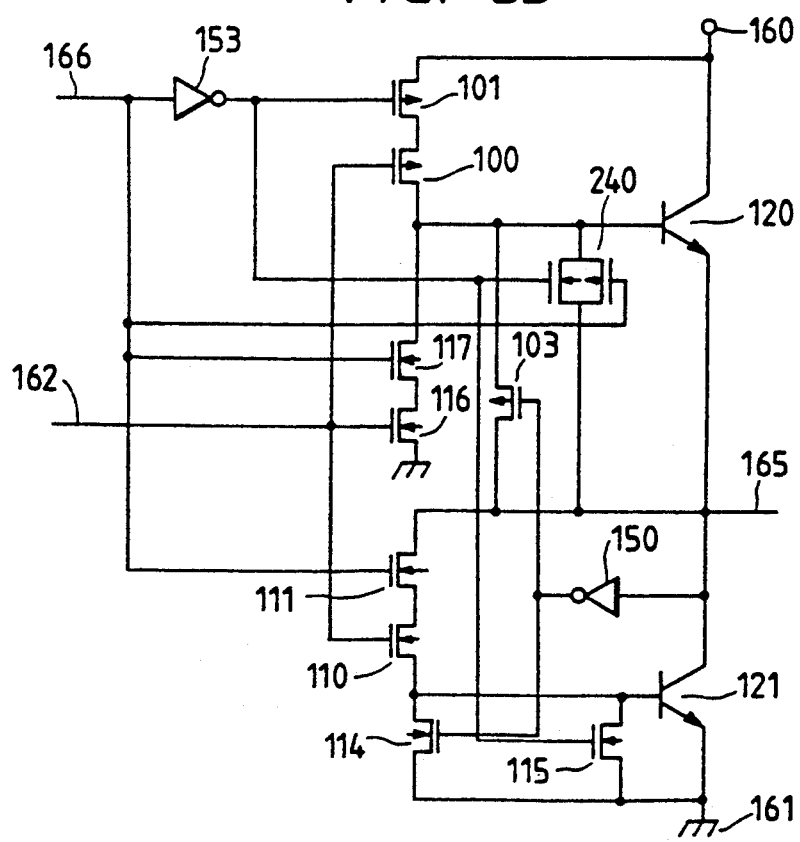

FIG. 30 shows an example of the extension of the present embodiment to a three-input NAND circuit; FIG. 32 shows an example of extension to a three-input NOR circuit; and FIG. 33 shows an example of extension to a three-state inverter. The methods and operations of the extension can be easily understood from the foregoing embodiments.

Figure 34:
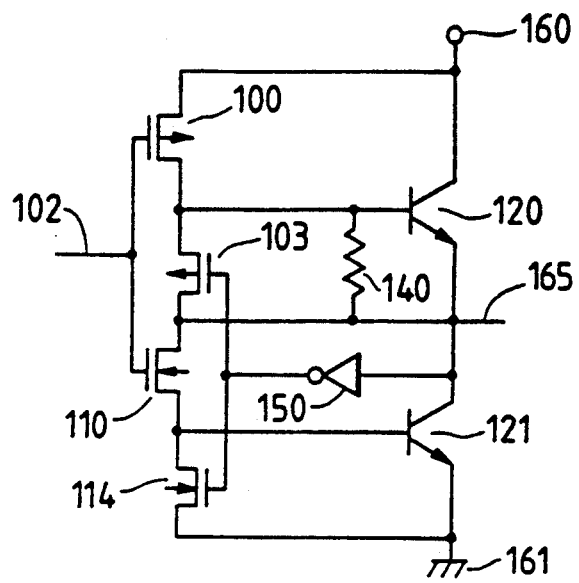

In FIG. 34, the resistor 140 is additionally connected between the base and emitter of the NPN 120 of the circuit of the embodiment of FIG. 8. The reason for connecting this resistor is to improve the reliability of the circuit by keeping the base of the NPN 120 from the floating state and to supplement the base current extraction PMOS 103 of the NPN 120. If the input 102 is High whereas the output 104 is Low, for example, PMOS 100 and 103 are OFF. As a result, the base of the NPN 120 is in the floating state. If, at this time, noise enters the input 102 to turn ON the PMOS for an instant, the NPN 120 is turned ON to feed the through current to the output portion. Since the resistor 140 is connected between the base and emitter of the NPN 120, the current of the PMOS 100 due to the noise can be bypassed so as not to turn ON the NPN 120. In order to prevent the rising characteristics of the circuit from being deteriorated, it is important to set the resistor at a sufficiently high value.

Figure 35:
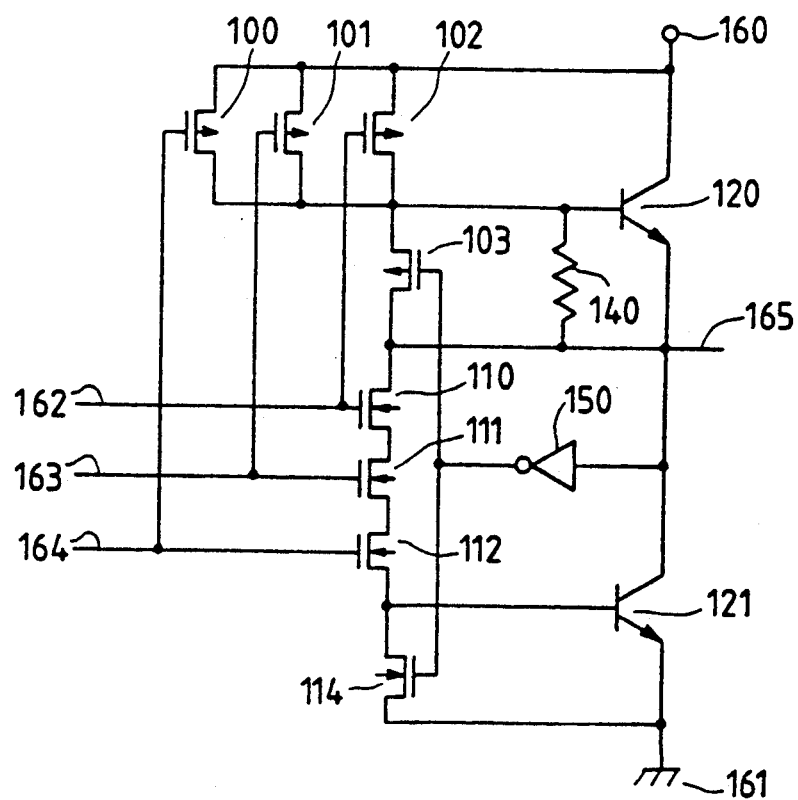
Figure 36:
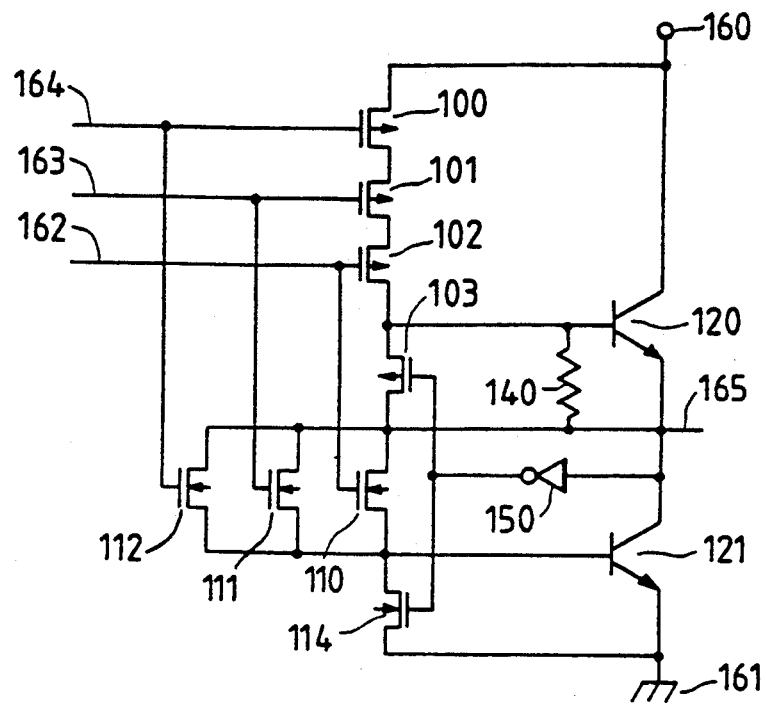
Figure 37:
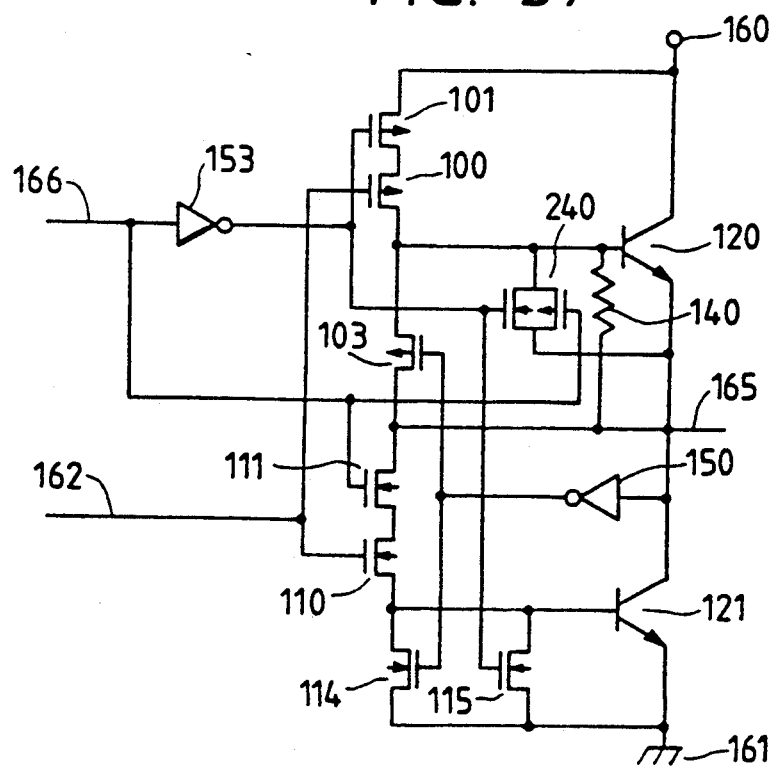

FIG. 35 shows an example of the extension of the present embodiment to a three-input NAND circuit; FIG. 36 shows an example of extension to a three-input NOR circuit; and FIG. 37 shows an example of extension to a three-state inverter.

Figure 38:
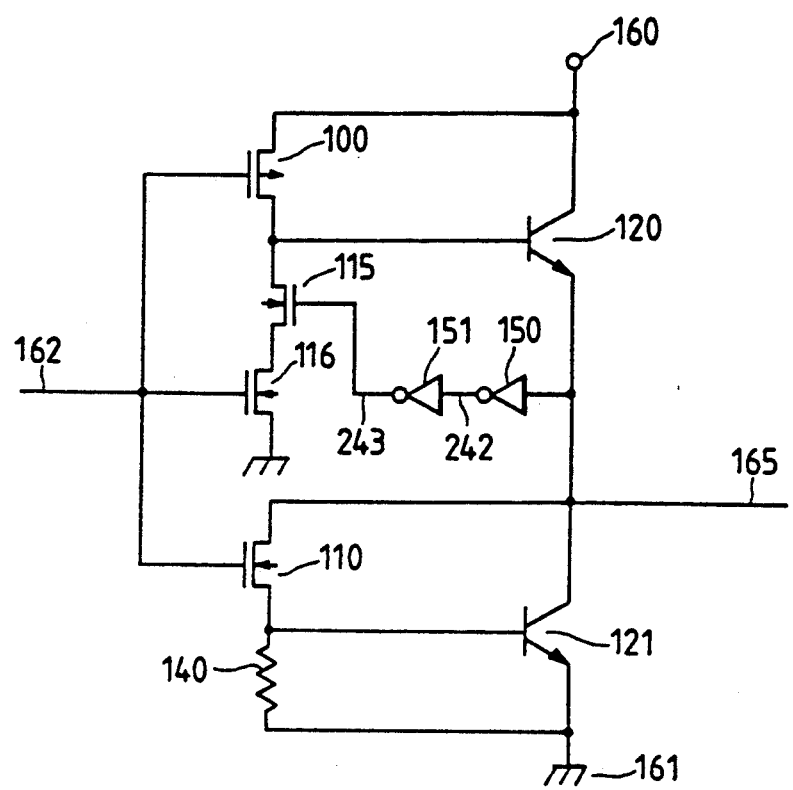
Figure 39:
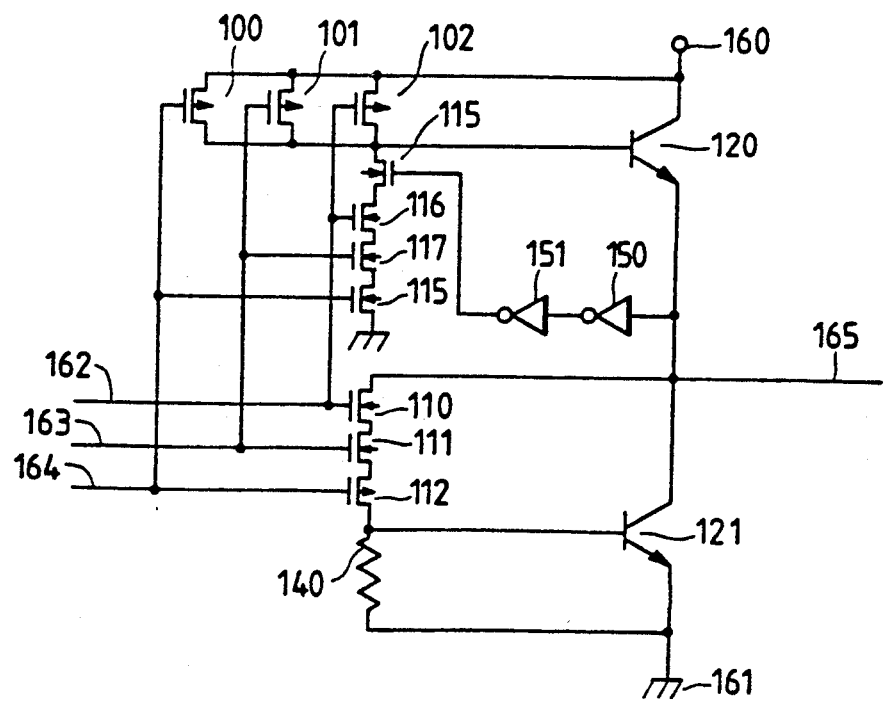
Figure 40:
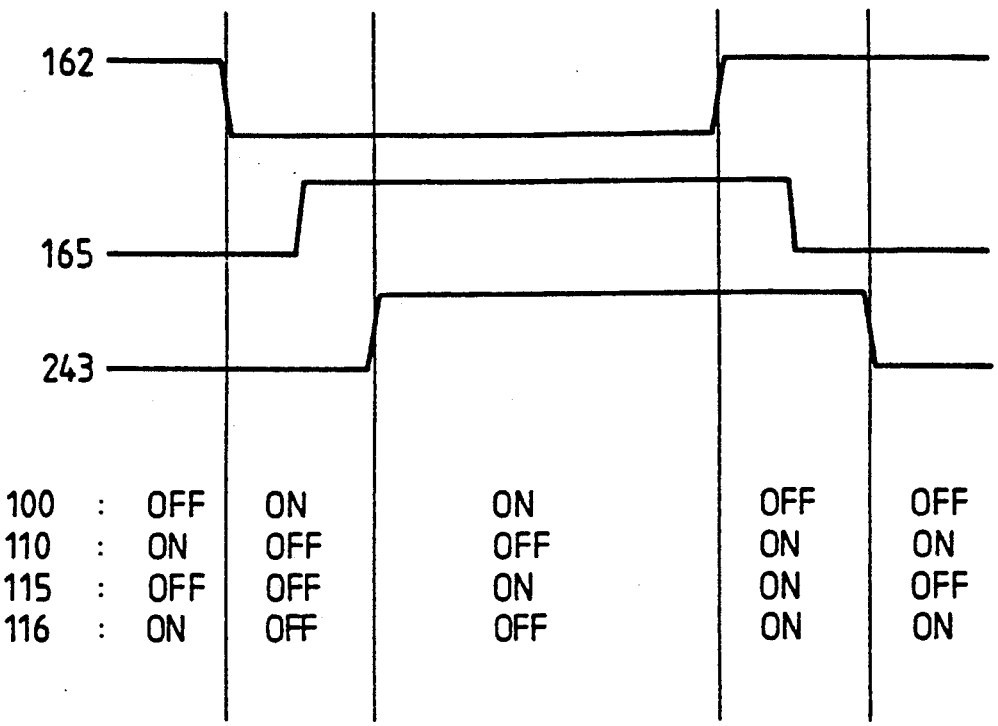
Figure 41:
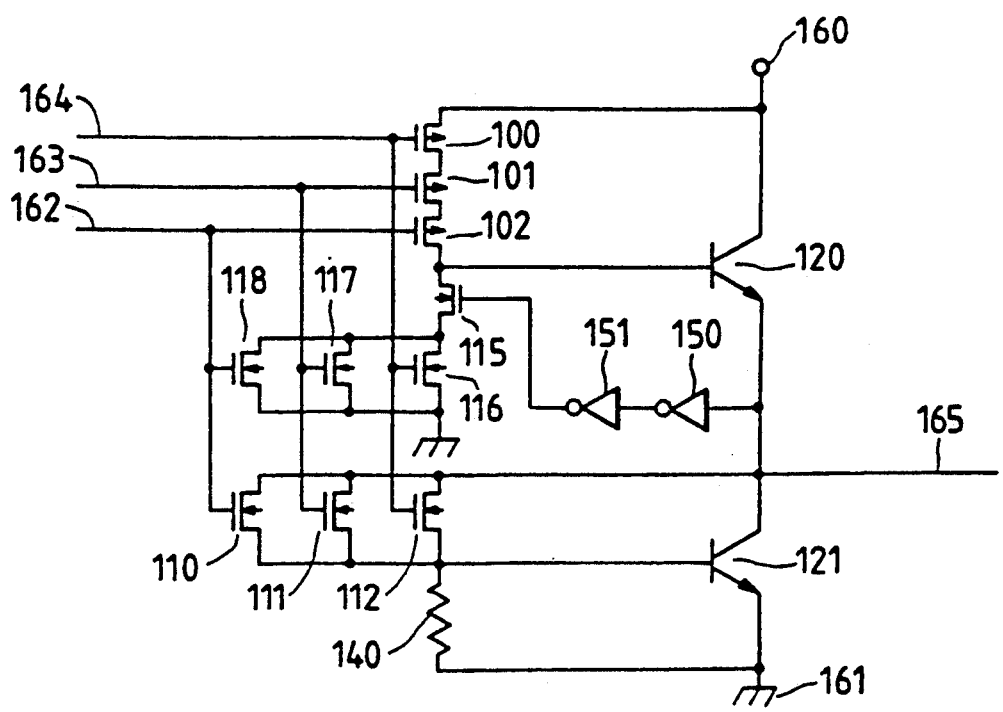
Figure 42:
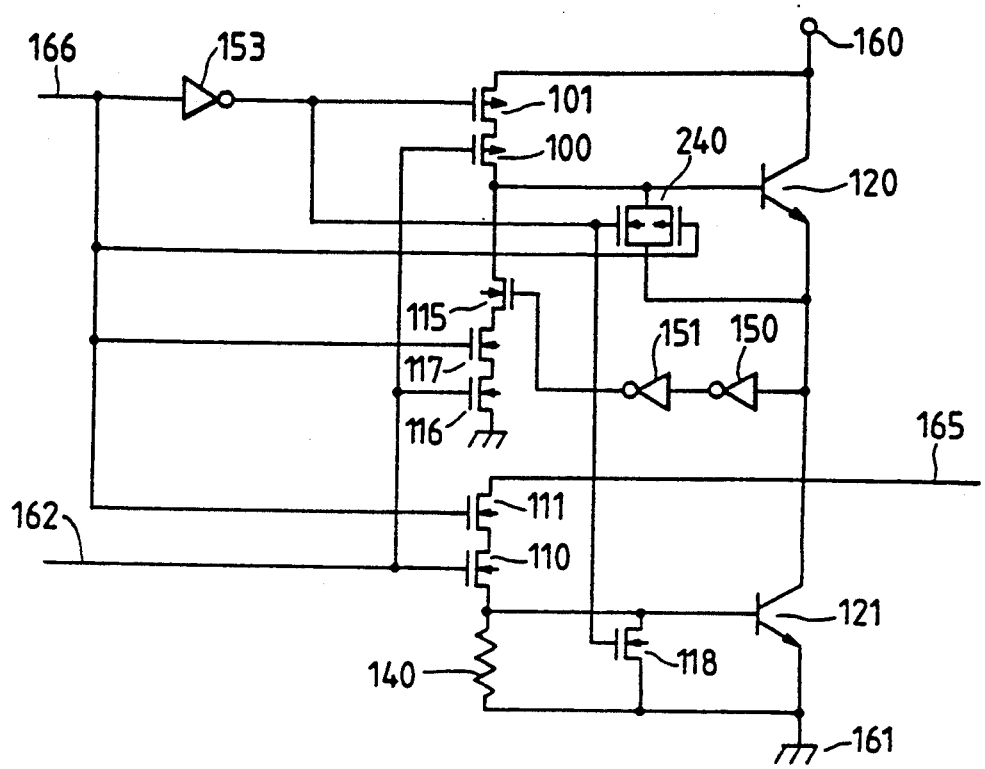
Figure 43:
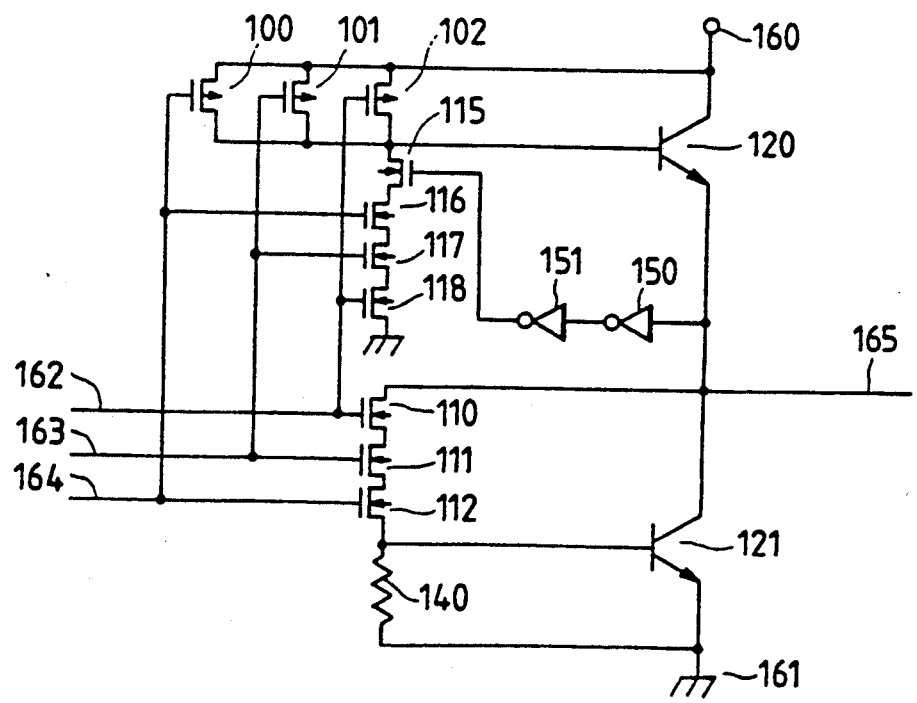

FIG. 38 shows another embodiment of the present invention. The present embodiment is different from the foregoing embodiments in that no PMOS is connected between the base and emitter of the NPN 120. As a result, the output takes a High level of $V_{out} \approx V_{CC} = V_{BE}$. The operations can be understood from FIG. 40. FIG. 39 shows an example of the extension of the present embodiment to a three-input NAND circuit; FIG. 41 shows an extension to a three-input NOR circuit; and FIG. 42 shows an extension to a three-state inverter. Moreover, FIG. 43 shows a modification in which the gate input positions of NMOS 116 to 118 are different from those of FIG. 39. Since the input positions are changed, the operations can be speeded up depending upon the conditions of use.

Figure 44:
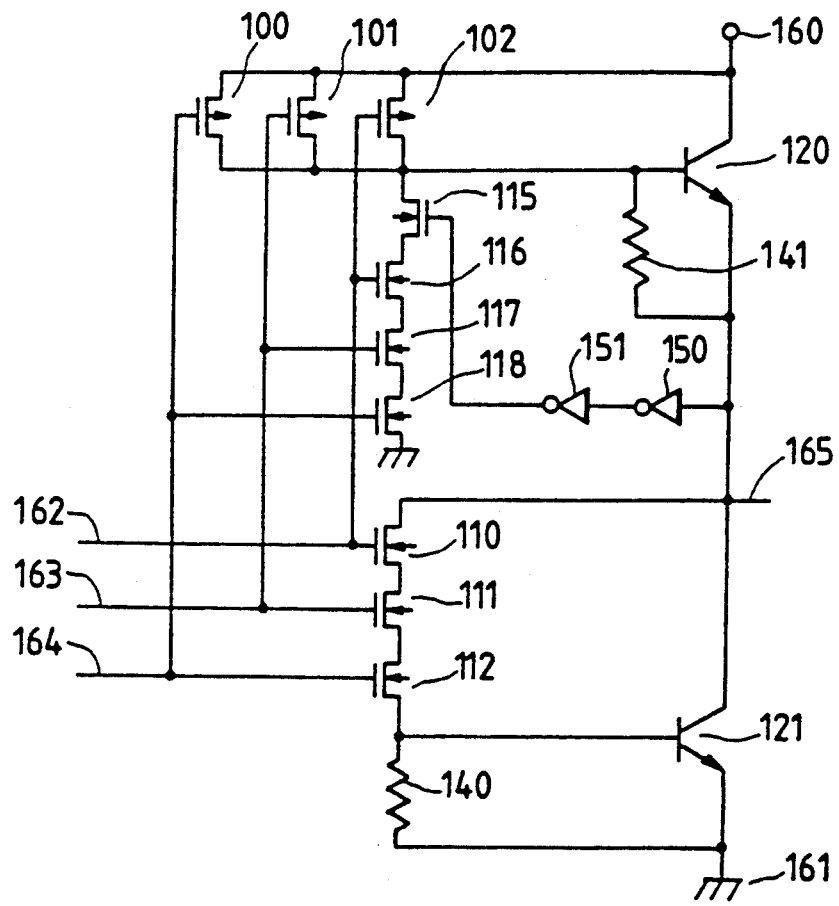

FIG. 44 shows an example in which the resistor 141 is additionally connected between the base and emitter of NPN 120 in FIG. 39. The reason for connecting this resistor is to prevent the base of the NPN 120 from coming into the floating state and the circuit from malfunctioning due to noise, as have been described in FIG. 34.

Figure 45:
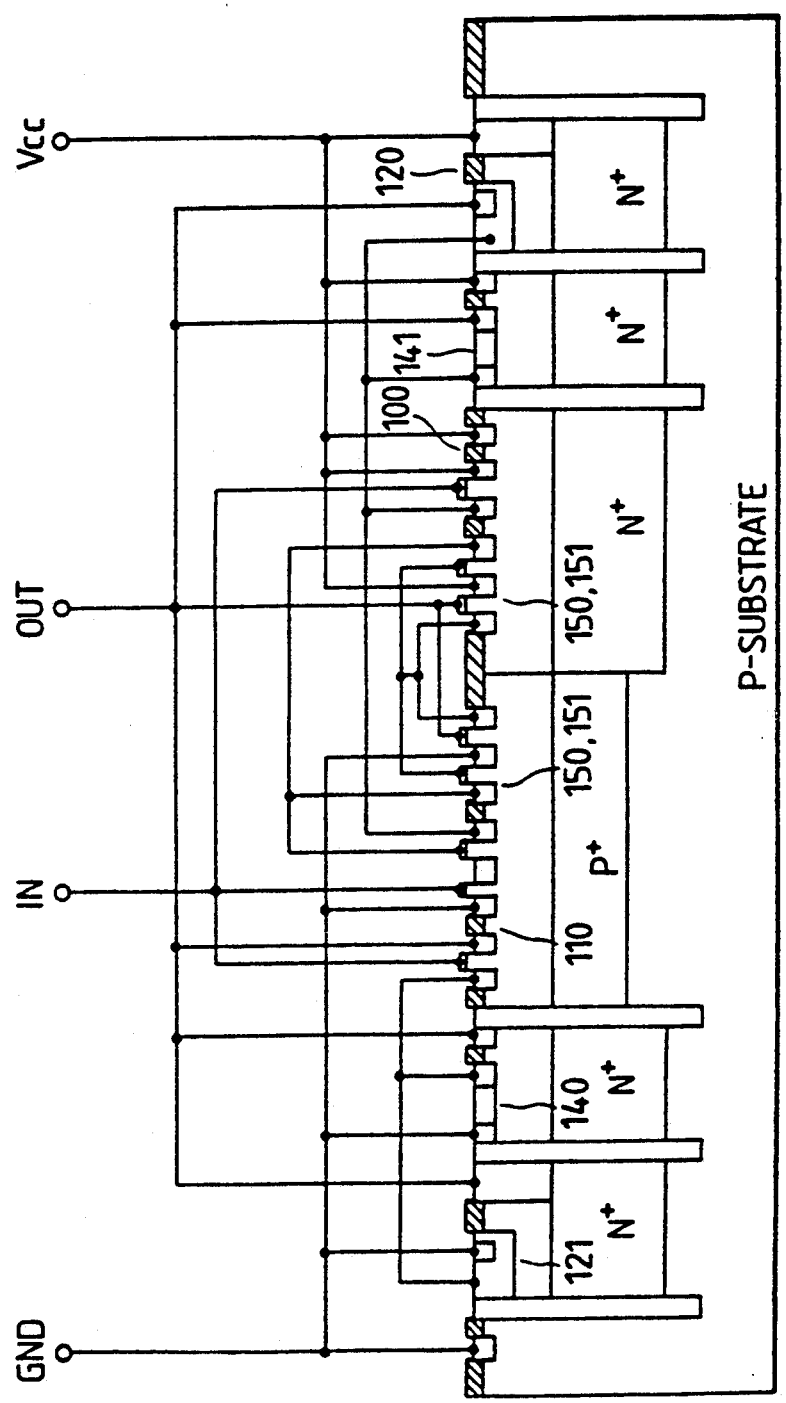
FIG. 45 is a longitudinal section showing the structure of one embodiment.

FIG. 45 shows a sectional structure in case the circuit shown in FIG. 44 is formed over a Si substrate. Over the P-substrate, there are formed P-well and N-well layers, over which are formed a NMOS, a PMOS, a NPN and a resistor. These elements are connected with one another through fine metal wiring layers on a main surface of the Si substrate, which are indicated by solid lines for simplicity of explanation. The metal wiring layers should not be limited to one layer but can be multiple wiring layers such as two or three layers which are electrically isolated from one another. A number of these structures are formed over a common silicon substrate and are connected through second and third metal wiring layers to construct one system or a portion of a system.

Figure 46:
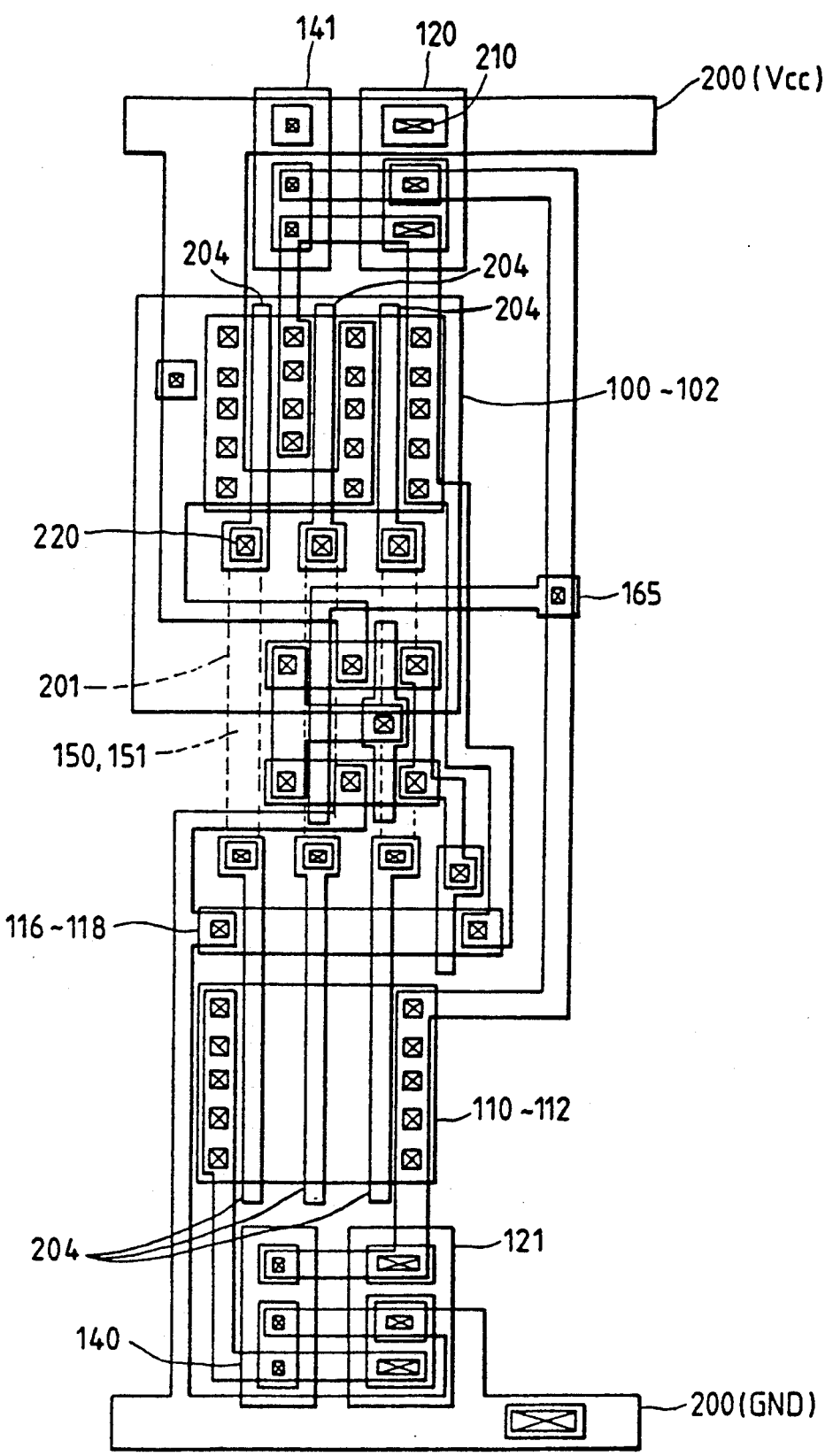
FIGS. 46 and 47 are top plan views of embodiments.

FIG. 46 is a top plan view showing an example of the layout pattern of the circuit shown in FIGS. 44 and 45. In the present embodiment, a base current extracting MOS and a feedback inverter are placed at the center of the cell and are overlaid and underlaid by NPN driving PMOS and NMOS, which are further overlaid and underlaid by NPN. This layout provides an elongated cell so that it can take a number of different wiring layer channels running transversely over the cell. Therefore, the layout is suitable for a gate array, for example.

Figure 47:
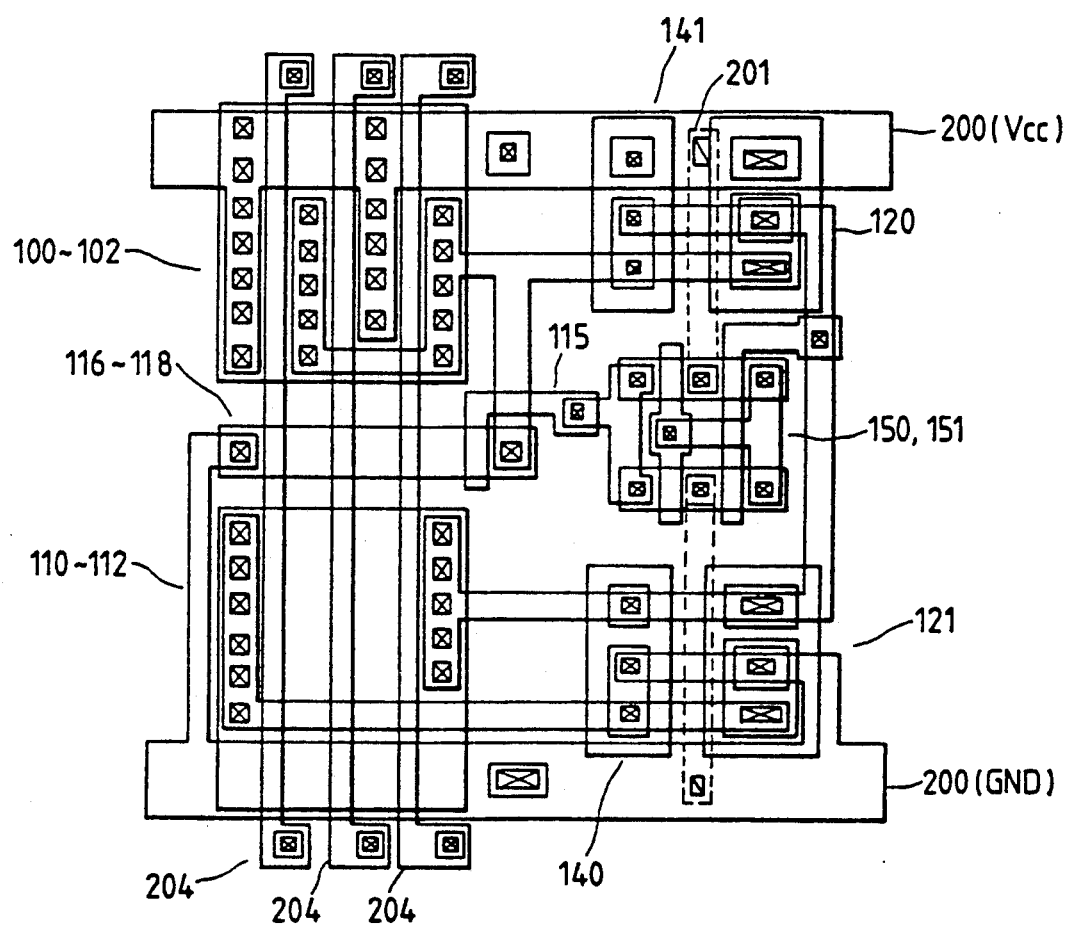

On the other hand, FIG. 47 shows another example of the layout pattern of the circuit of FIGS. 44 and 45. Like the NPN driving PMOS and NMOS, there are arranged the NPN, the extracting MOS, the feedback inverter and so on. Since the cell of this shape is arranged at the same level as the CMOS cell, one BI-CMOS cell can be placed in several CMOS cells so that the ratio of the numbers of the CMOS cells and the BI-CMOS cells can be arbitrarily selected. Thus, the BI-CMOS cell can be arranged only in a necessary portion to make a design with a higher degree of integration. Therefore, the cell of the present embodiment is suitable for the LSI of standard cell type, for example.

Figure 49:
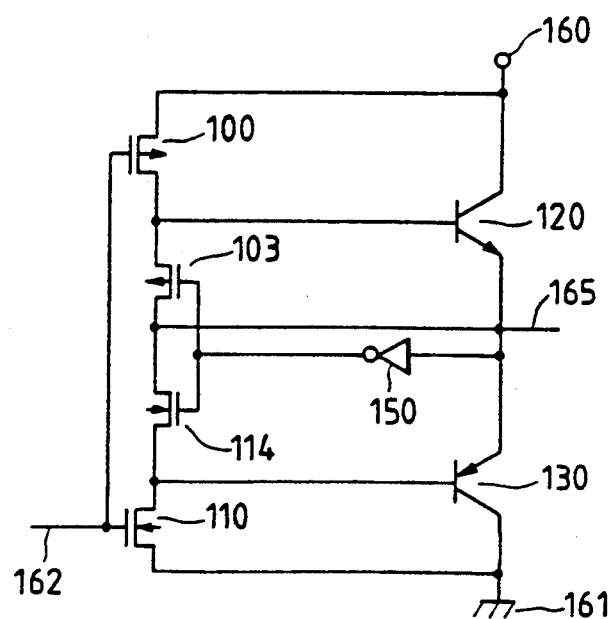
Figure 50:
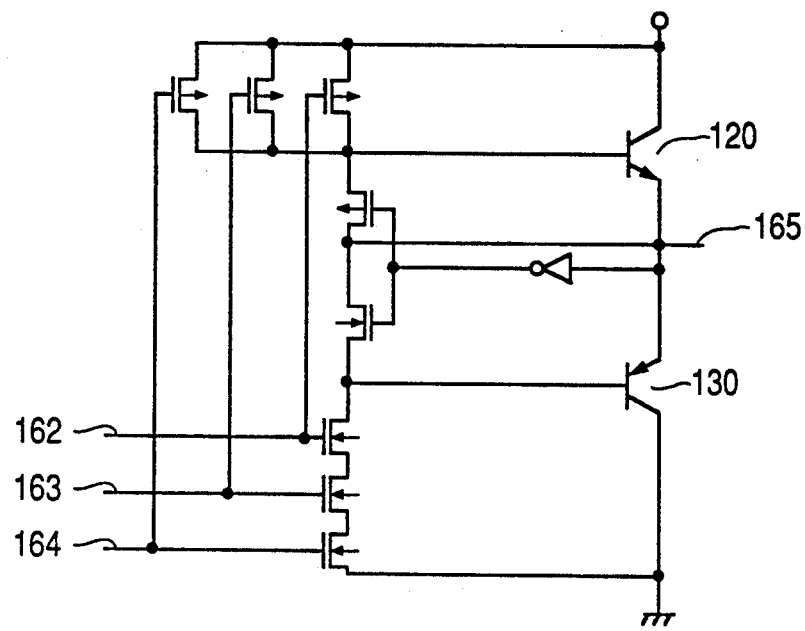
Figure 51:
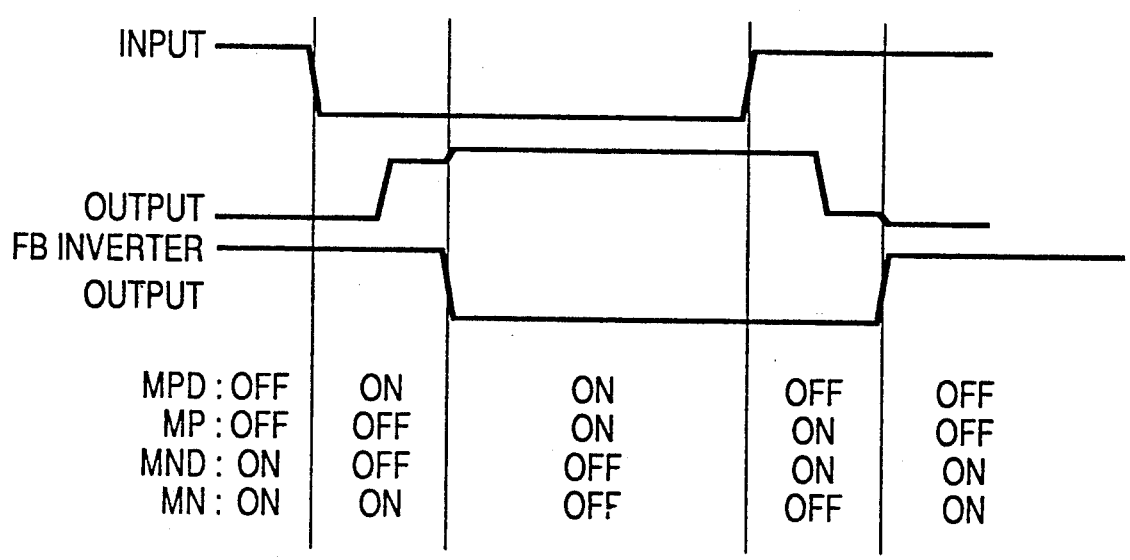
Figure 52:
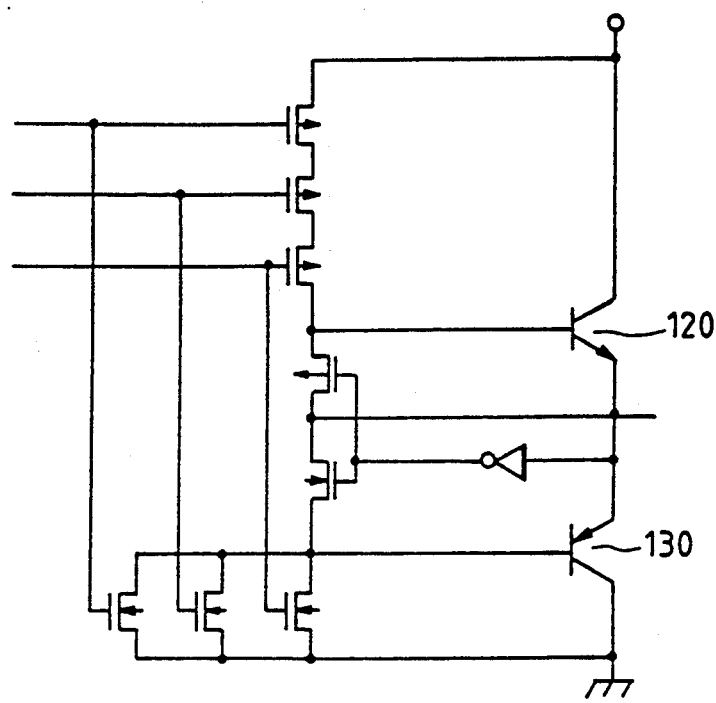
Figure 53:
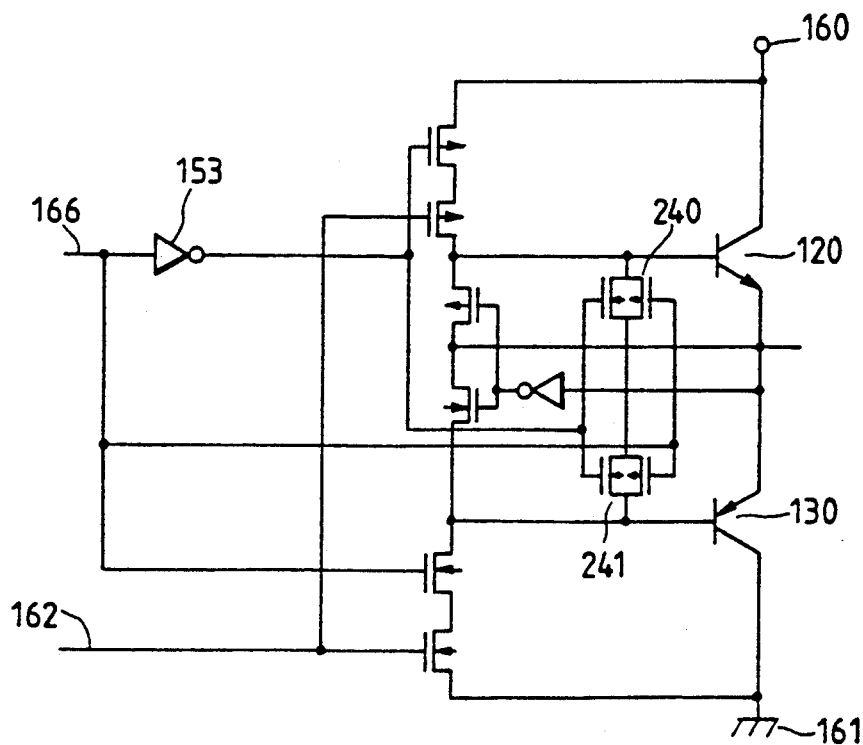

FIG. 49 shows an inverter circuit according to another embodiment of the present invention. The circuit operations are shown in FIG. 51. The features of the present circuit reside in that the drop of the output is accomplished by a PNP transistor. The PNP transistor has a high-speed output drop because it is turned ON when its base potential is lower than the output potential by $V_{BE}$ (i.e., the base-emitter voltage of the bipolar transistor). FIG. 50 shows an example of the extension of the present embodiment to a three-input NAND circuit; FIG. 52 shows an example of extension to a three-input NOR circuit; and FIG. 53 shows an example of extension to a three-state inverter circuit.

Figure 54:
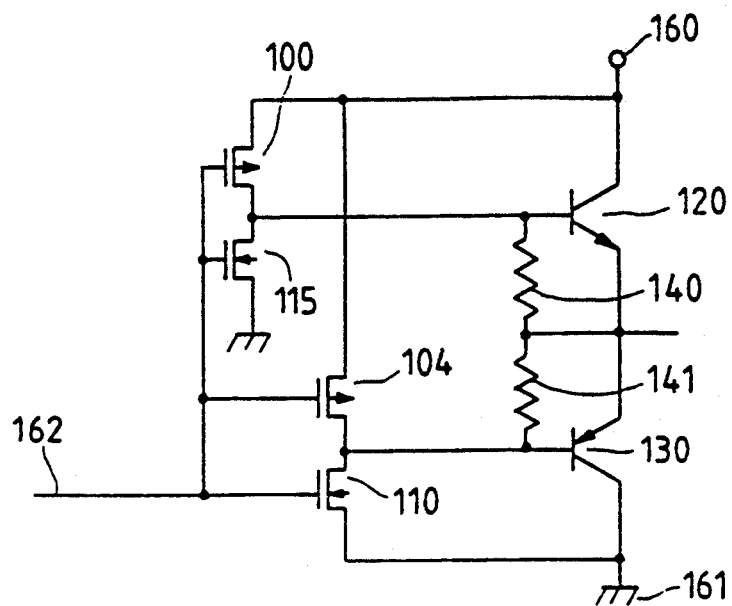
Figure 55:
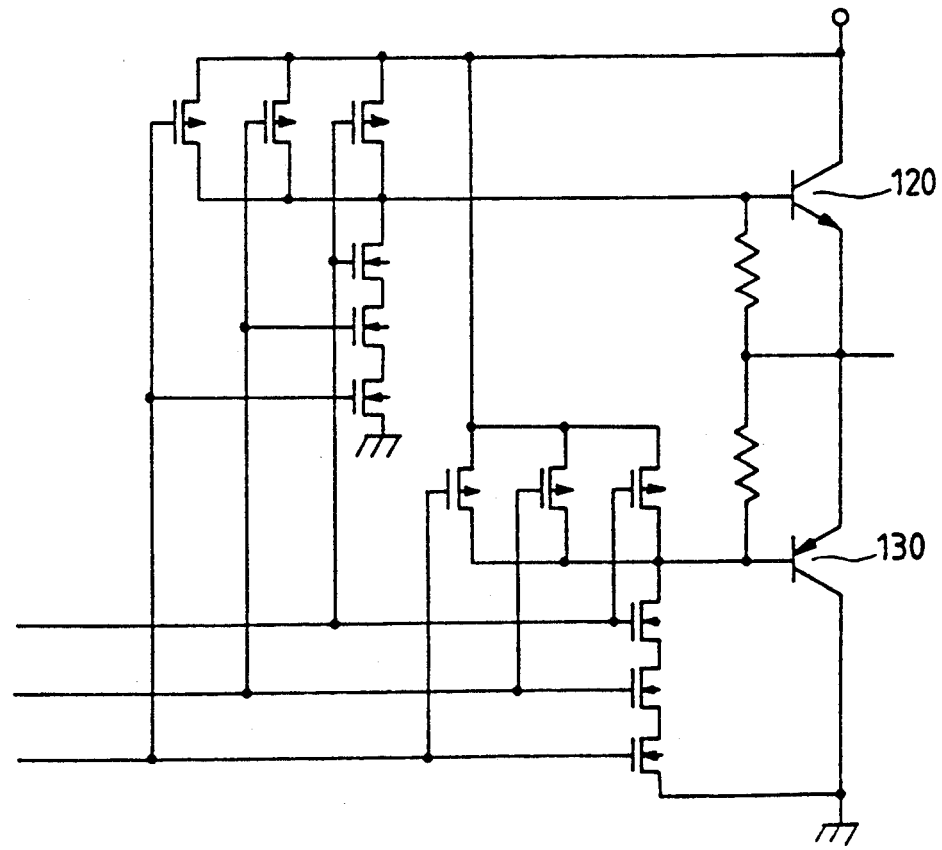
Figure 56:
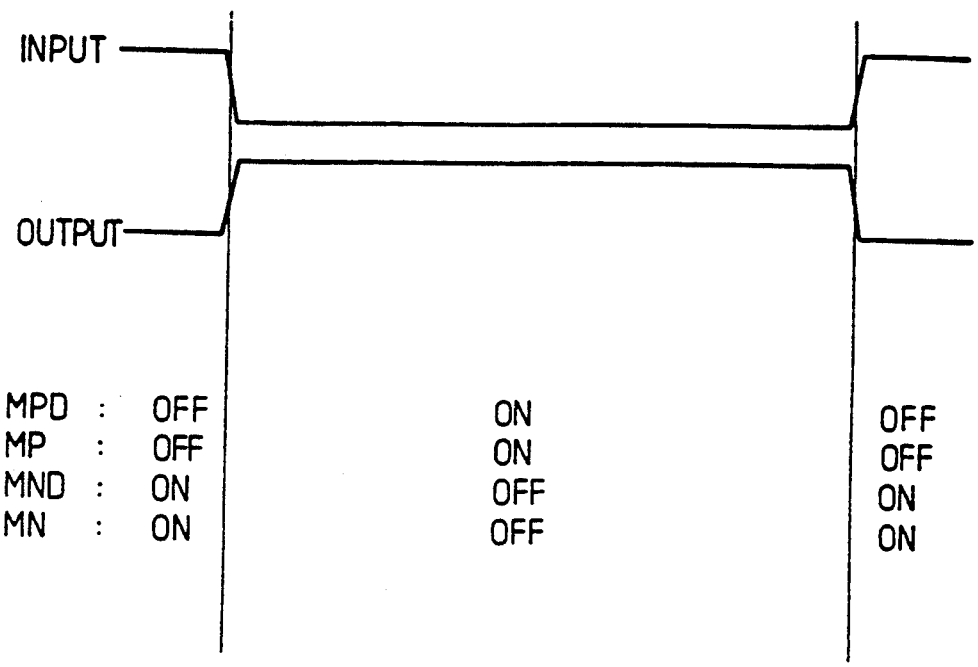
Figure 57:
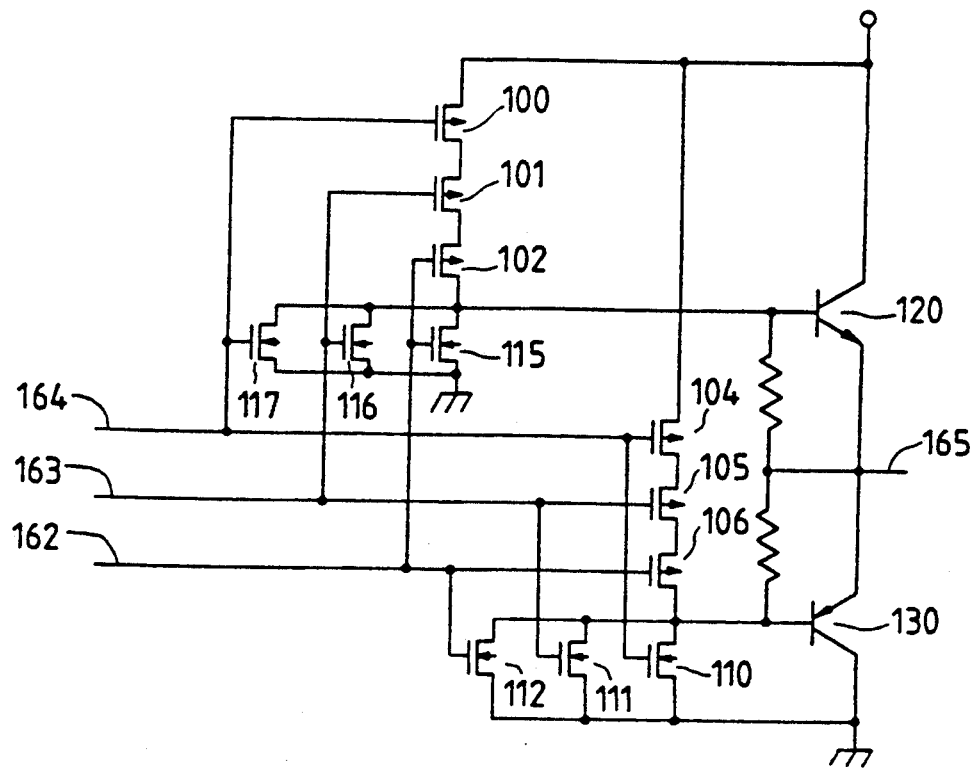
Figure 58:
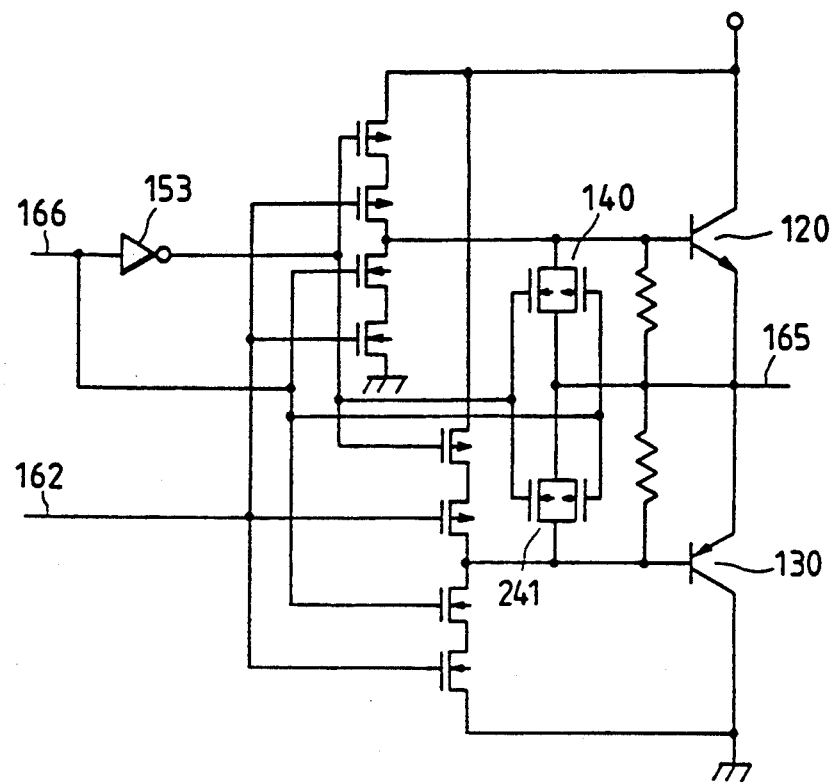

An embodiment of FIG. 54 is featured in that the output drop is effected by a PNP transistor like the foregoing embodiment. However, the present embodiment does not use a feedback inverter but, instead, effects the output amplitude full-swing by a resistor. The especially high speed of the present embodiment is caused by the fact that the NPN 120 and the PNP 130 have their bases driven at different beta ratios. The threshold voltage of the CMOS portion composed of the PMOS 100 and the NMOS 115 for driving the NPN 120 is set at a high level, closer to $V_{CC}$ than GND, whereas the threshold voltage of the CMOS portion composed of the PMOS 104 and the NMOS 110 for driving the PNP 130 is set at a low level closer to GND than $V_{CC}$. These settings enable the NPN 120 and the PNP 130 to be driven at high speed. FIG. 55 shows an example of the extension of the inverter of the present embodiment to a three-input NAND circuit; FIG. 57 shows an example of extension to a three-input NOR circuit; and FIG. 58 shows an example of extension to a three-state inverter circuit. Incidentally, the operation timings of the inverter shown in FIG. 54 are illustrated in FIG. 56.

Figure 59:
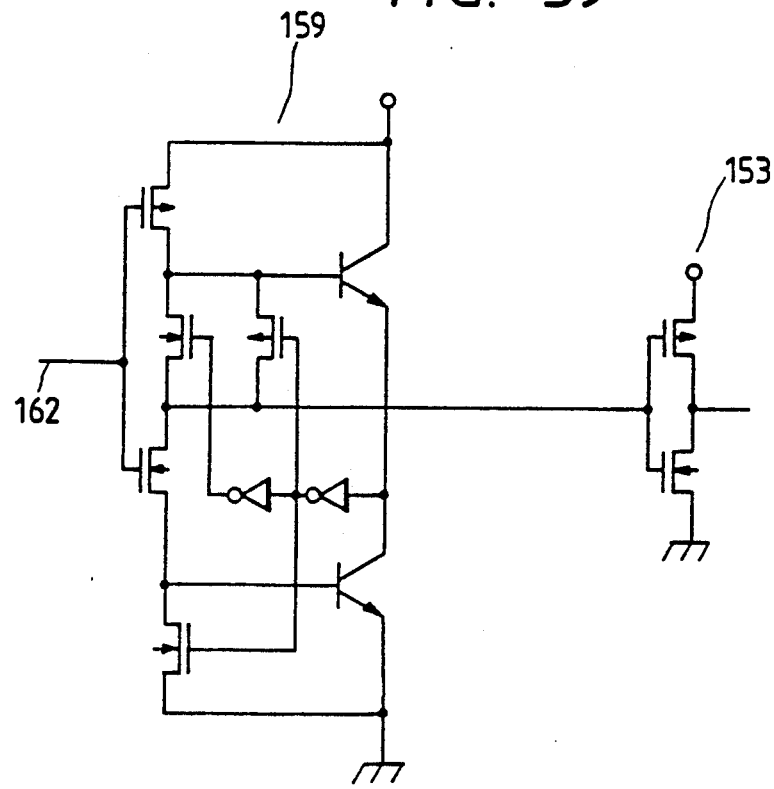

FIG. 59 shows an example in which the BI-CMOS inverter of the present invention shown in FIG. 14 and the CMOS inverter are connected in series and preferably integrated in a single semiconductor substrate. In the circuit of the present invention, the output is a full-swing so that no leakage current will flow to the CMOS inverter 153 of the subsequent stage.

Figure 60:
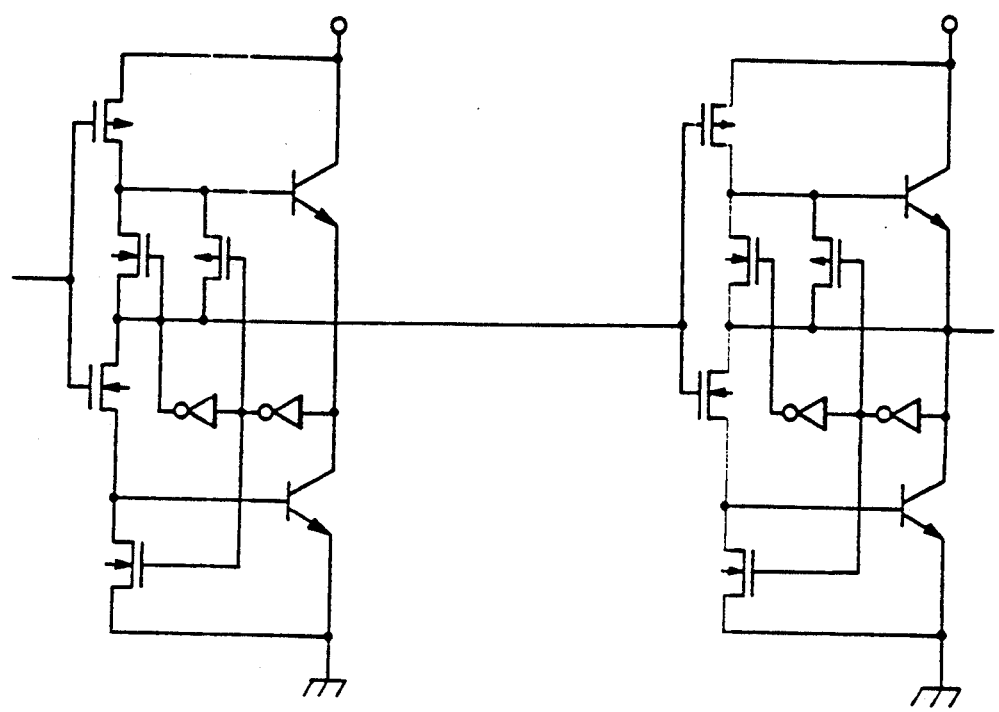

FIG. 60 shows an example in which the BI-CMOS inverters of the present invention are connected in series and preferably integrated in a single semiconductor substrate. Since, in this case, the output of the circuit of the present invention is a full-swing, no leakage current will flow to the BI-CMOS gate of the subsequent stage.

As has been exemplified in the foregoing two embodiments, the power source full-swing of the output signals is an important characteristic for reducing the power consumption because it eliminates the leakage current of the subsequent stage gate. As the voltage of the power source becomes lower in the future, it is highly possible to drop the threshold value of the MOS. This is intended to improve the current driving force of the MOS. In case the MOS has a low threshold value, it is turned ON to allow the leakage current to increase the power consumption or reduce the noise margin of the input/output signals if the amplitude of the gate output signal is smaller than the power source voltage. Therefore, it is an important characteristic that the output signal is substantially fully swung to the power source level, as in the circuit of the present invention, in case the power source voltage is to be dropped.

Another embodiment of the present invention will be described in the following with reference to the accompanying drawings.

Figure 67:
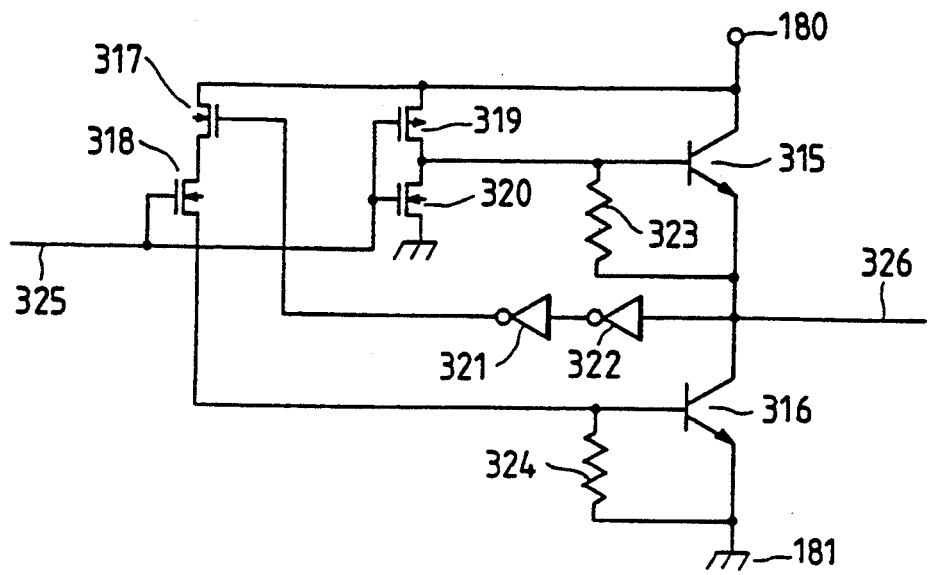
FIG. 67 is a diagram of an inverter circuit of an embodiment of the present invention.

FIG. 67 shows an inverter circuit according to another embodiment of the present invention. Reference numeral 315 designates an NPN which has its collector connected with the $V_{CC}$ power source terminal 180 and its emitter connected with an output terminal 326. Numeral 316 designates an NPN which has its collector connected with the output terminal 326 and its emitter connected with the GND power source terminal 181. Numeral 319 designates a PMOS which has its source, drain and gate connected with the $V_{CC}$ power source terminal 180, the base of the NPN 315 and an input terminal 325, respectively. Numeral 320 designates a NMOS which has its drain, source and gate connected with the base of the NPN 315, the GND power source terminal 181 and the input terminal 325, respectively. Numeral 317 designates an NMOS which has its drain, source and gate connected with the $V_{CC}$ power source terminal 180, the drain of the NMOS 318 and the output of a CMOS inverter 321. Numeral 318 designates an NMOS which has its drain, source and gate connected with the source of the NMOS 317, the base of the NPN 316 and the input terminal 325, respectively. Numerals 322 and 321 designate CMOS inverters which are connected between the output terminal 326 and the gate of the NMOS 317. Numerals 323 and 324 designate resistors which are connected between the respective bases and emitters of the NPN 315 and 316.

Figure 68:
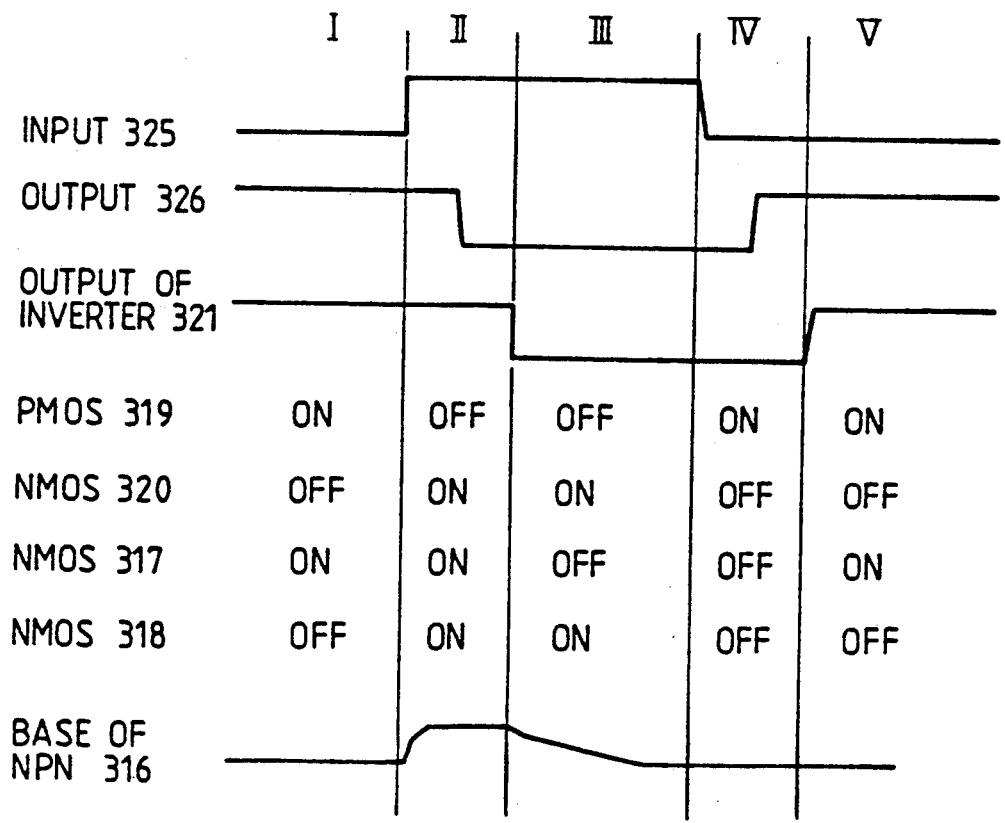
FIG. 68 is a diagram for explaining the operations of the inverter of FIG. 68.

Next, the operations will be described in the following. FIG. 68 illustrates the operation timings and the ON/OFF states of the PMOS 319 and the NMOS 320, 317 and 318, as will be described in connection with the five regions I to V.

In the region I, the input 325 is set at the "0" level, and the output 326 is set at the "1" level. Since, at this time, the PMOS 319 is ON whereas the NMOS 320 is OFF, the base of the NPN 315 is at the $V_{CC}$ potential. The output 326 is caused to abruptly rise to the potential of $(V_{CC}-V_{BE})$ by the action of the NPN 315 and then to the $V_{CC}$ potential through the resistor 323. Since, on the other hand, the NMOS 317 is ON whereas the NMOS 318 is OFF, the base current of the NPN 316 is blocked, and the base potential of the NPN 316 is dropped to the GND potential through the resistor 324 so that the NPN 316 is OFF.

Figure 65:
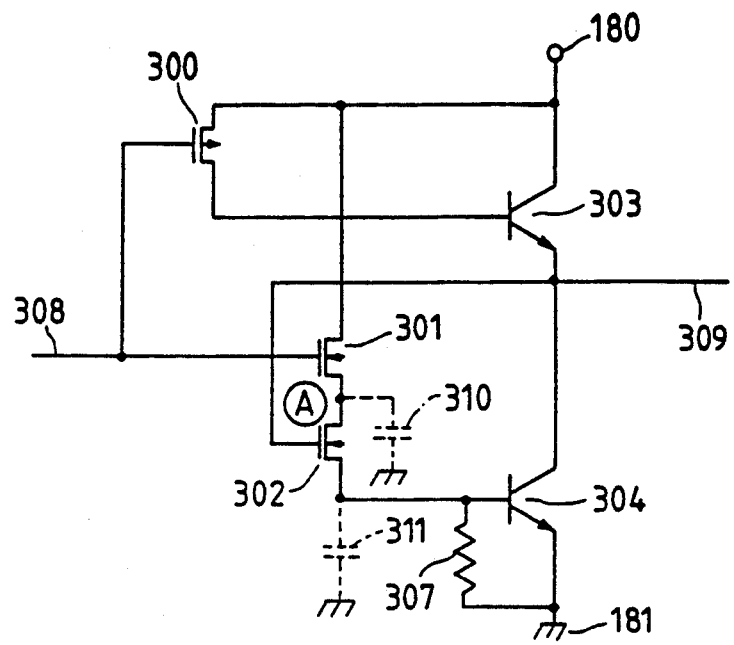
FIGS. 65 and 66 are diagrams for explaining the operations of the inverters of FIGS. 65 and 66.
Figure 66:
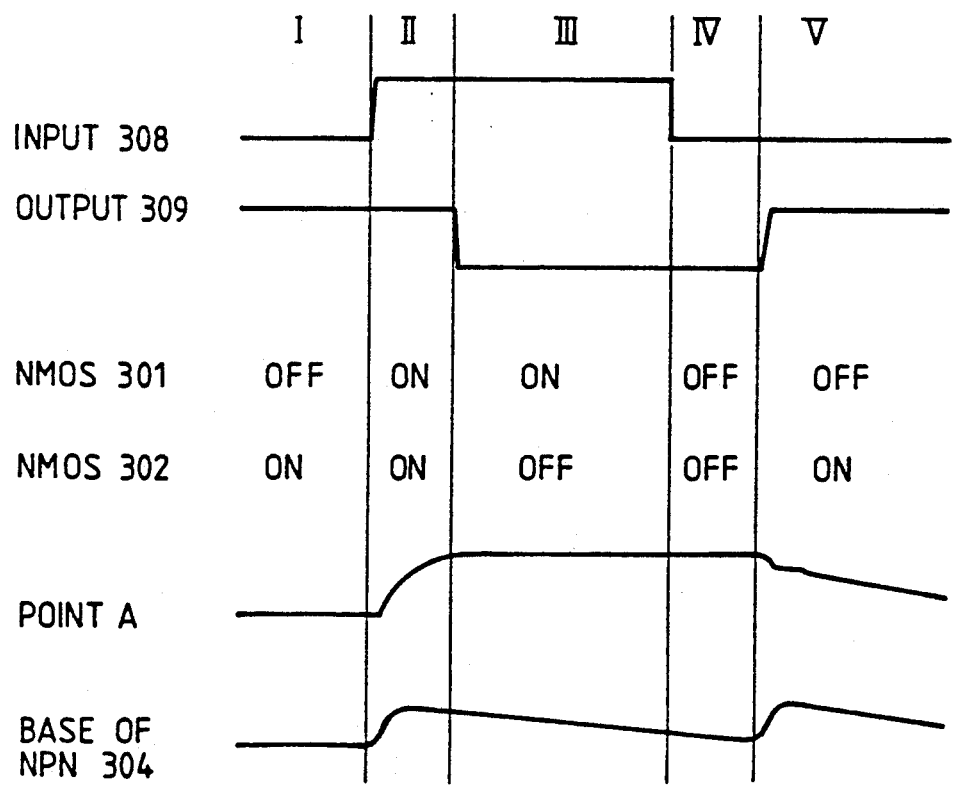

In the region II, the input 325 is dropping, the output of the inverter 321 is at the "1" level, and the output 326 is dropping. Since, at this time, the PMOS 319 is OFF whereas NMOS 320 is ON, the base current is not fed to the NPN 315, but the base potential is dropped to the GND potential so that the 5 NPN 315 is OFF. Since, on the other hand, the NMOS 317 and 318 are ON, the base current is intensely fed from the $V_{CC}$ power source 180 to the NPN 316. As a result, the NPN 316 is turned ON, and the output 326 takes the "0" level. In the present embodiment, the charge distribution having been described with reference to FIG. 65 takes place when the region is shifted from I to II. Specifically, the charges stored in the parasitic capacity of the connection between the NMOS 317 and 318 are so distributed as to raise the base potential of the NPN 316 because the NMOS 318 is turned ON. Since, however, this timing is to turn ON the NPN 316, the distribution phenomenon is extremely helpful in abruptly turning ON the NPN 316.

In the region III, the input 325 is at the "1" level whereas the output 326 is at the "0" level, and the output of the inverter 321 is at the "0" level. Since, at this time, the PMOS 319 is OFF whereas the NMOS 320 is ON, the base potential of the NPN 315 is at the GND potential, and the NPN 315 itself is OFF. Since the NMOS 317 is turned OFF, on the other hand, the NPN 316 receives no feed of the base current so that it is turned OFF. Since, however, the NPN 315 is also OFF, the output 326 is held at the "0" level.

In the region IV, the input 325 drops, the inverter 321 has the "0" level output, and the output 326 is rising. Since, at this time, the PMOS 319 is ON whereas the NMOS 320 is OFF, the NPN 315 receives the feed of the base current so that it is turned ON. Since, on the other hand, both the NMOS 317 and 318 are OFF, the NPN 316 remains OFF. As a result, the output 326 takes the "1" level.

The region v is similar to the region I.

According to the present embodiment, the base current of the bipolar is intensely fed by the MOS current and is interrupted after the bipolar has acted. Thus, it is also possible to provide a bipolar-CMOS composite inverter circuit which has the characteristics of high speed and low power consumption. Since, moreover, the structure eliminates the bad influences of the prior art due to the charge distribution, the characteristics of high speed can be attained with a lower power consumption. Incidentally, there are inserted the two delay CMOS inverters 321 and 322 for keeping the NMOS 317 ON until the output 326 sufficiently drops, as seen from FIG. 68. If, for example, the NMOS 317 is turned OFF before the output 326 does not sufficiently drop, the feed of the base current of the NPN 316 is not sufficient to cause an increase in the delay time and an instability of the output level. In dependence upon the device constants, therefore, it may be necessary to increase the number of the delay inverters or unnecessary to provide the delay inverters. If necessary, in order to reduce the occupied area, it is effective to reduce the channel width of the MOS and to make the channel length L larger than the minimum value of the process.

On the other hand, the resistor 323 is inserted to change the "1" level of the output 326 to the $V_{CC}$ level and is unnecessary in case the output "1" level is good at ($V_{CC}-V_{BE}$). In the presence of the resistor 323, moreover, the NMOS 320 may be eliminated. The resistor 324 may be replaced by another means if it changes the base potential of the NPN 316 to the GND potential when the NPN 316 is OFF. This means may be exemplified by an KMOS which has its gate, drain and source connected with the output 326 or the base of the NPN 315, the base of the NPN 316 and the emitter of the NPN 316, respectively.

In the present embodiment, the NMOS 317 is used to block the base current of the NPN 316 but may be replaced by a PMOS. In this case, however, it is necessary to apply the inverted signal of the output 326 to the gate of the PMOS, as is similar in the following examples.

Figure 69:
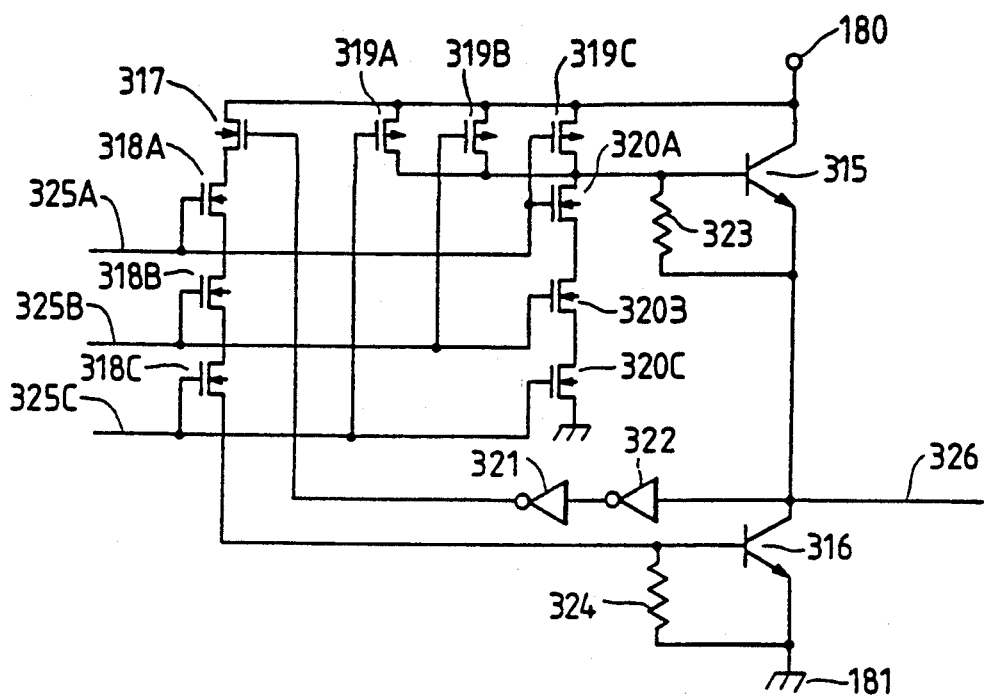
FIGS. 69, 70 and 71 are diagrams showing a three-input NAND circuit, a three-input NOR circuit and a three-state inverter circuit of embodiments of the present invention, respectively.

FIG. 69 shows an example of extension to a three-input NAND circuit according to a concept similar to that of the inverter circuit shown in FIG. 67. Common parts are indicated by identical reference characters. Moreover, the parts having the common functions are designated with the numerals of FIG. 67 supplemented by A, B and C.

Figure 70:
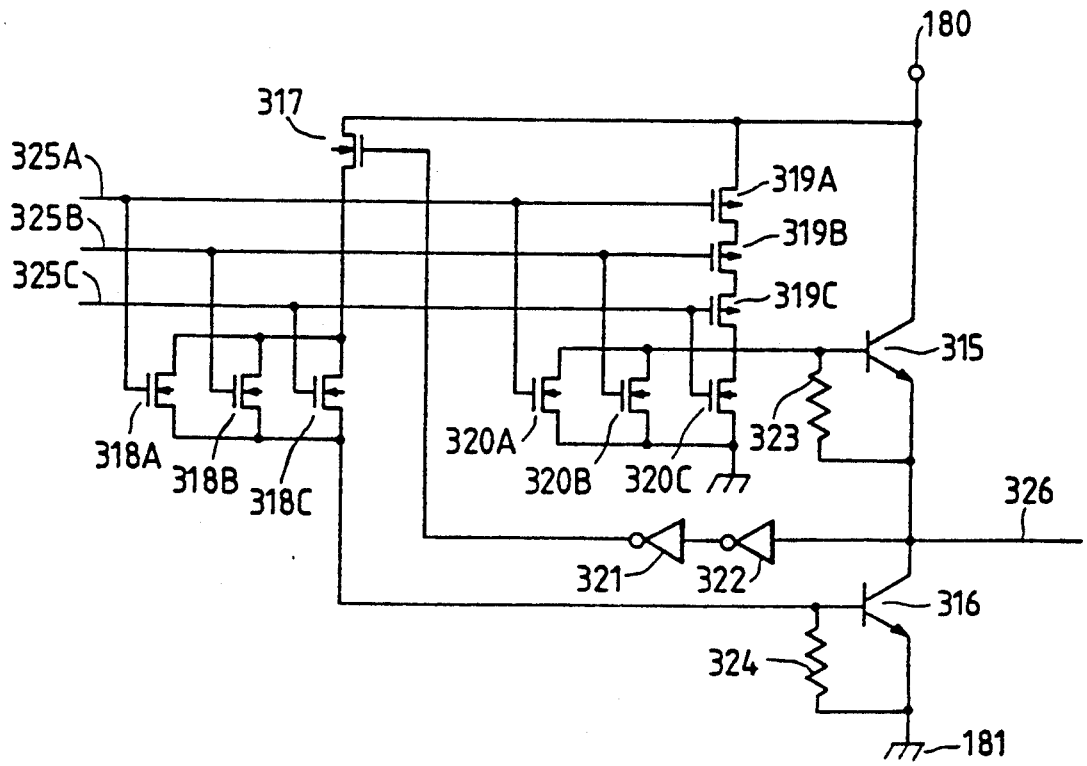

FIG. 70 shows an example of extension to a three-input NOR circuit according to a concept similar to that of the inverter circuit shown in FIG. 67. The common parts are indicated by the identical reference characters. Moreover, the parts having the common functions are designated with the numerals of FIG. 67 supplemented by A, B and C. The operations will be easily understood by those skilled in the art and capable of understanding the CMOS circuit because the inverter circuit of FIG. 67 has been described in detail. Incidentally, the present embodiment takes the three-input NOR circuit as an example, but the present invention can be applied to a general k-input ($k \geq 2$) NOR circuit having two or more inputs.

Figure 71:
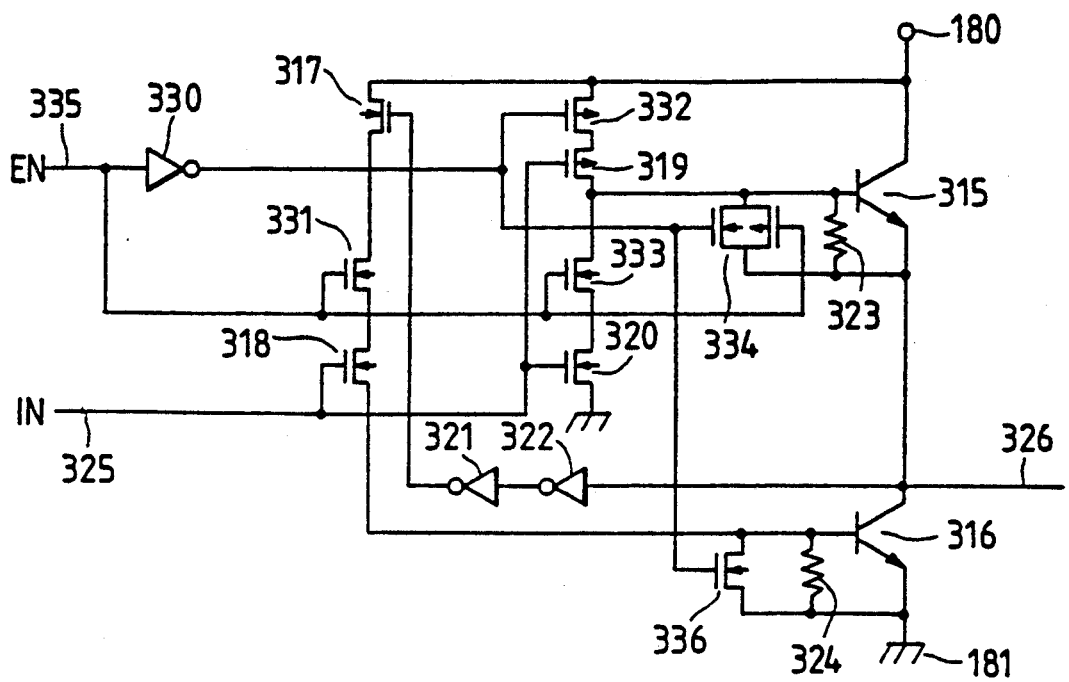

FIG. 71 shows an extension to a three-state inverter circuit according to a concept similar to that of the inverter circuit shown in FIG. 67. The common parts are indicated with identical reference characters. The elements added are: a CMOS inverter 330 connected with an enable terminal 335; a NMOS 331 connected in series with the NMOS 317 and 318; a PMOS 332 connected in series with the PMOS 319; and NMOS 333 connected in series with the NMOS 320; a transfer gate 334 connected between the base and emitter of the NPN 315; and a NMOS 336 connected between the base and emitter of the NPN 316.

Next, the operations will be described in the following.

First of all, let the case be considered in which the enable terminal 335 is at the "1" level. of the above-specified additional elements, all the NMOS 331, the PMOS 332 and the NMOS 333 introduced into the current path are ON, but the transfer gate 334 and the NMOS 336 inserted between the bases and emitters of the NPN 315 and 316 are OFF. Electrically, therefore, the circuit diagram is similar to that of the inverter of FIG. 67 so that the present embodiment acts as an inverter circuit.

In case, on the other hand, the enable terminal 335 is at the "0" level, the aforementioned ON and OFF states are inverted. As a result, the bases and emitters of the NPN 315 and 316 are shorted to block the base current feed path to turn OFF the NPN 315 and 316. Since, moreover, the path from the output terminal 326 to the $V_{CC}$ terminal 180 or the GND terminal 181 is blocked, the high-impedance state is invited.

A latch circuit can be constructed by using the inverter circuit of the present invention. Specifically, FIG. 13 shows a latch circuit which may have its BI-CMOS inverter circuit exemplified by the inverter circuit shown in FIG. 67.

The present invention has been described hereinbefore in connection with the inverter circuit, the NAND circuit, the NOR circuit, the three-state circuit and the latch circuit. The bipolar transistor may be exemplified by a bipolar transistor with Schottky barrier diode. As is understood from the description thus far made, the present invention can be applied to all the circuits which can be constructed of CMOS elements. Since, moreover, the feedback inverters 321 and 322 do not need high speed, they can use the MOS of the ordinary LDD (Lightly Doped Drain) structure, which may be exemplified by a MOS of asymmetric LDD structure. The circuit of the present invention can coexist with the CMOS circuit and operate at a high speed and with a low power consumption so that it can be applied to a gate array LSI of large scale and high performance, a data processing or the like. Since, moreover, the speed is not dropped so much even if the power source voltage is dropped, it can be said that the circuit of the present invention is suitable for a fine process.

Figure 72:
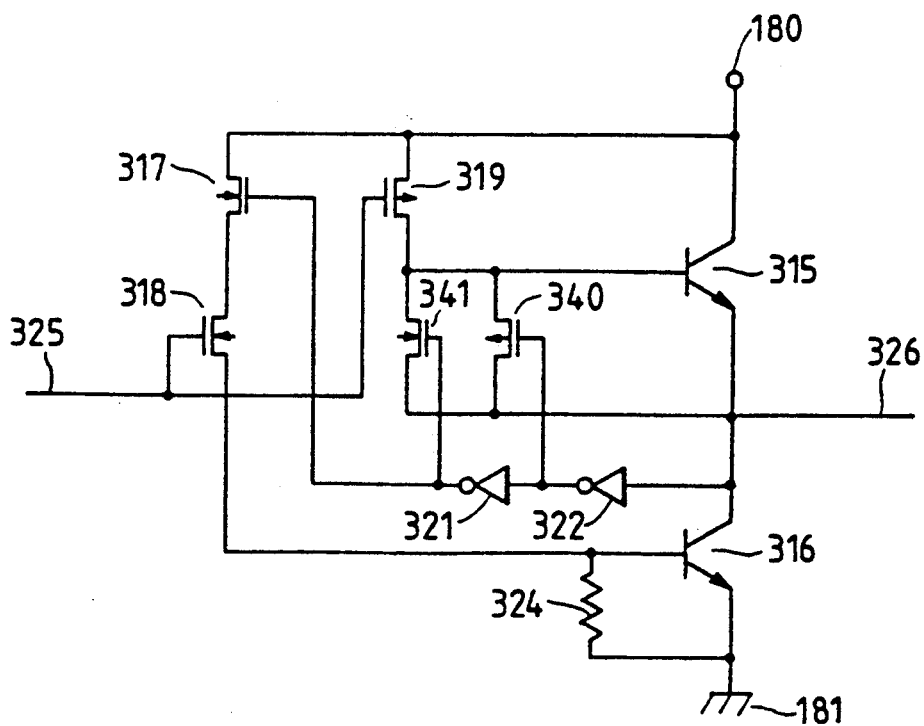
FIGS. 72 and 73 show inverter circuits according to other embodiments of the present invention.

FIG. 72 shows an inverter circuit according to a further embodiment of the present invention. The control of the upper NPN 315 is accomplished by using the circuit of FIG. 14, and the control of the lower NPN 316 is accomplished by using the circuit of FIG. 67.

Figure 73:
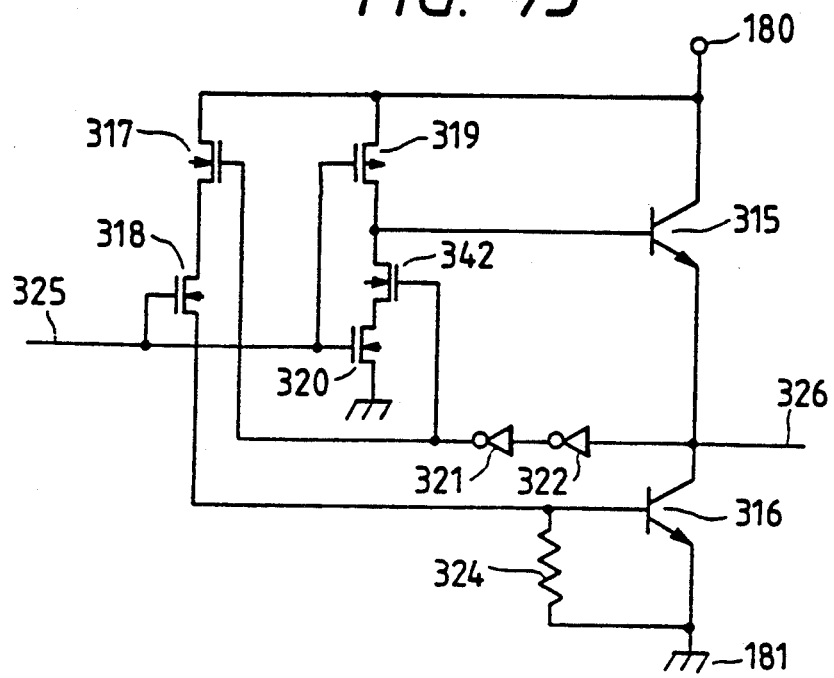
Figure 74:
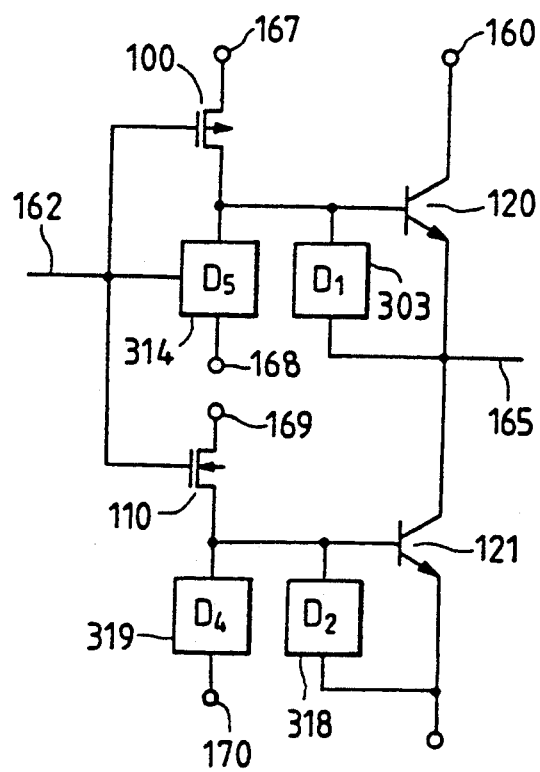
FIG. 74 is a circuit diagram showing an embodiment of the present invention.
Figure 75:
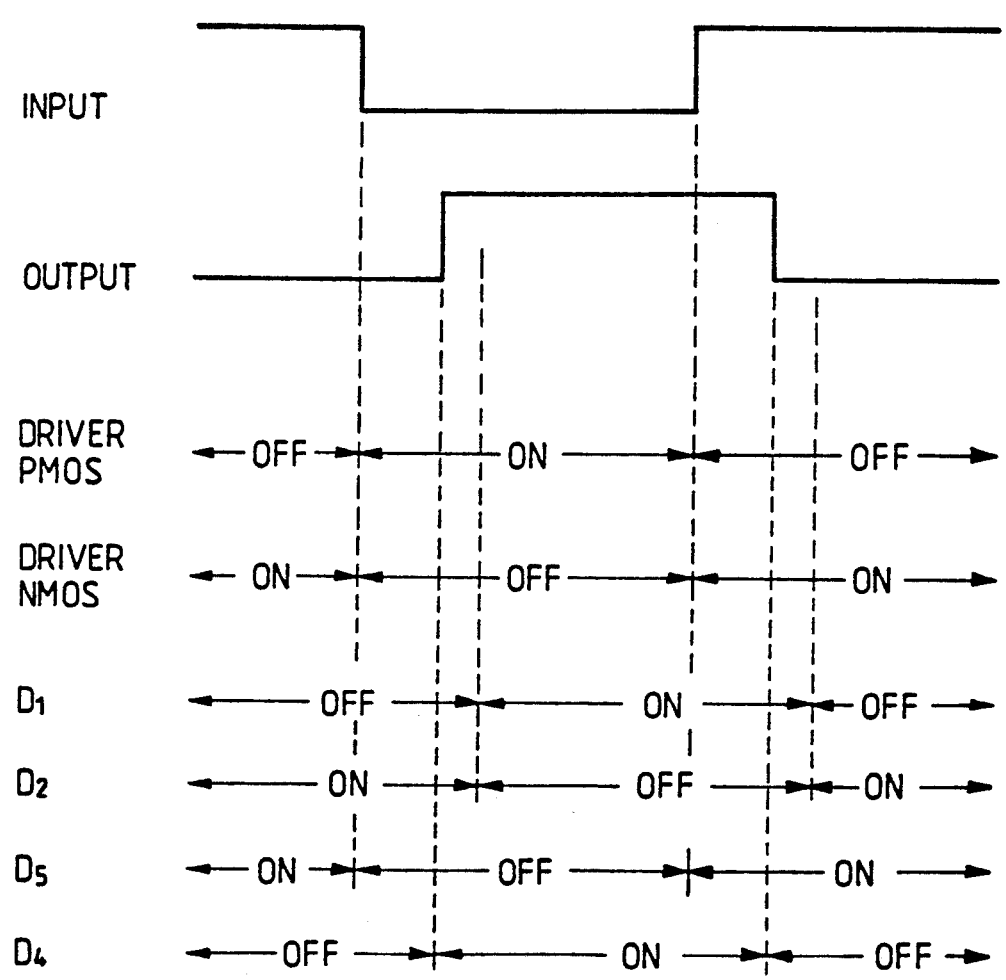
FIG. 75 is an operation timing chart.

On the other hand, FIG. 73 shows an inverter circuit according to a further embodiment of the present invention. The control of the upper NPN 315 is accomplished by using the circuit of FIG. 38, and the control of the lower NPN 316 is accomplished by using the circuit of FIG. 67.

In addition, various circuits can be combined within the scope of the present invention. Moreover, it is apparent that the present invention should not be limited to inverter circuitry.

Furthermore, the base bias appearing in the present invention can be added to a variety of circuits.

Other embodiments of the present invention will be described in the following with reference to FIGS. 76 to 80.

Figure 76:
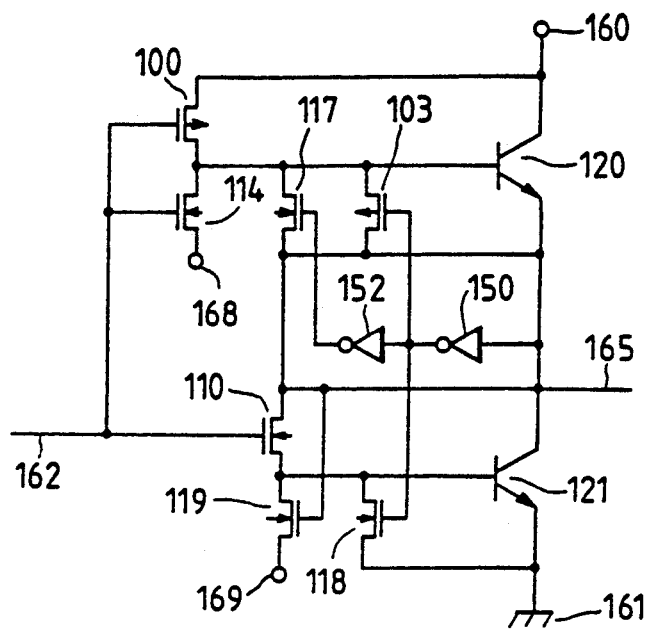

In FIG. 76, the following elements are added to the circuit shown in FIG. 14. Specifically, the NMOS 114 has its drain connected with the base of the NPN 120, its source connected with a certain fixed potential terminal 168 lower than $V_{BE}$ and higher than GND, and its gate connected with the input terminal 162. The NMOS 119 has its drain connected with the base of the NPN 121, its source connected with a certain fixed potential terminal 169 lower than $V_{BE}$ and higher than GND, and its gate connected with the output terminal 105.

FIG. 77 is an operation time chart illustrating an inverter logic gate according to the aforementioned one embodiment.

First of all, let the case be considered in which the input 162(a) is changed from High to Low level. Then, the output 165, the feedback inverter 150 of the first stage, and the feedback inverter 152 of the final stage produce the outputs, as illustrated in FIGS. 77(b), 77(c) and 77(d). Here, the driver PMOS 100 is turned from OFF to ON in response to the drop of the input 162, as shown in FIG. 77(e), and the driver NMOS 110 is changed from ON to OFF, as shown in FIG. 77(f).

For this transitional period, the PMOS 103 and the NMOS 117 are OFF before the output 165 takes a sufficiently High level, as shown in FIGS. 77(g) and 77(i). Since the NMOS 114 is turned OFF in synchronism with the input, the leakage of the base current of the bipolar transistor 120 is suppressed to a small level. Since, moreover, the base bias voltage (e.g., at 0.4 V) set not to exceed the base-emitter voltage $V_{BE}$ is fed in advance through the NMOS 114 to the base of the NPN 120, the parasitic capacity around the base is charged in advance to 0.4 V to accelerate the time period for which the base potential reaches the value $V_{BE}$. Since, on the other hand, the bipolar NPN transistor 121 is turned ON in advance by the NMOS 118, the stored charges of the base can be released. Since, moreover, the NMOS 119 is OFF, the base bias voltage is not applied to cut OFF the bipolar transistor 121.

Next, in case the input 162 is changed from Low to High level, the driver NMOS 110 is turned from OFF to ON, and the driver PMOS 100 is turned from ON to OFF. For this transitional period, the NMOS 118 is OFF in advance whereas the NMOS 119 is ON in advance, and the NPN 121 has its base set in advance at 0.4 V. As a result, the NPN 121 can be turned ON at a high speed. Since the PMOS 103 and the NMOS 117 are ON in advance, the bipolar transistor 120 is kept in its ON state until at least the output 165 is dropped to a sufficiently low level. The NMOS 114 is turned ON in synchronism with the input 162. The charges stored in the base or in the parasitic capacity around the base are released through the NMOS 103 and 117. Since the base bias voltage does not exceed the value $V_{BE}$ even if the NMOS 114 is turned ON, the bipolar transistor 120 is not turned ON.

Figure 78:
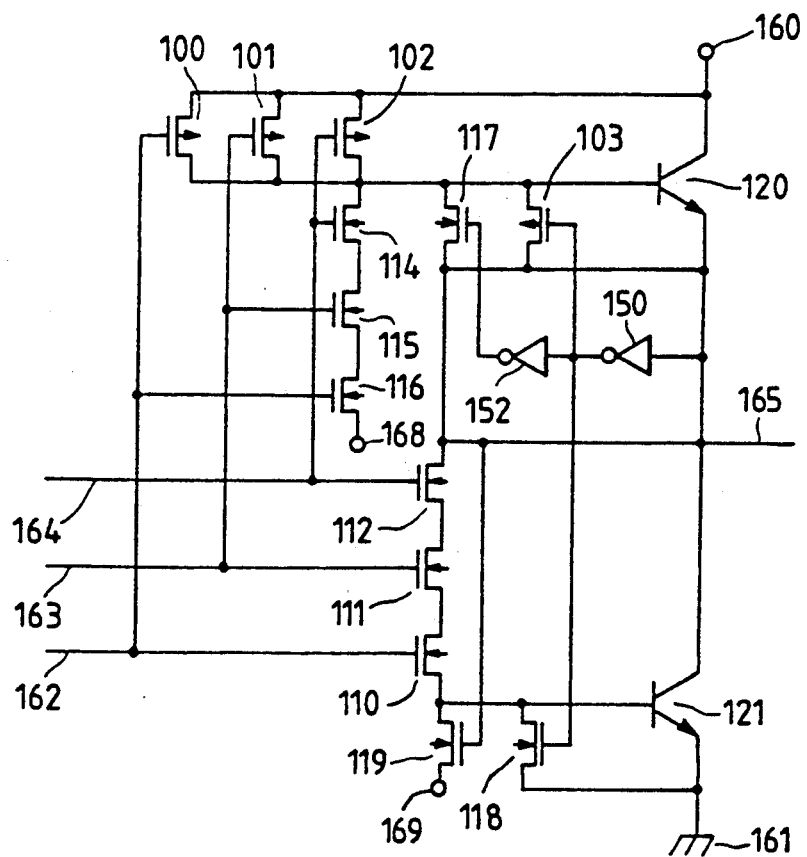

FIG. 78 shows another embodiment of the present invention, in which the extension to a multi-input logic gate is exemplified by a three-input NAND gate. The difference from the foregoing embodiment of FIG. 76 resides in that the drivers PMOS 101 and 102 are added in parallel and in that the drivers NMOS 111 and 112 and the switches NMOS 115 and 116 are added in series.

Figure 79:
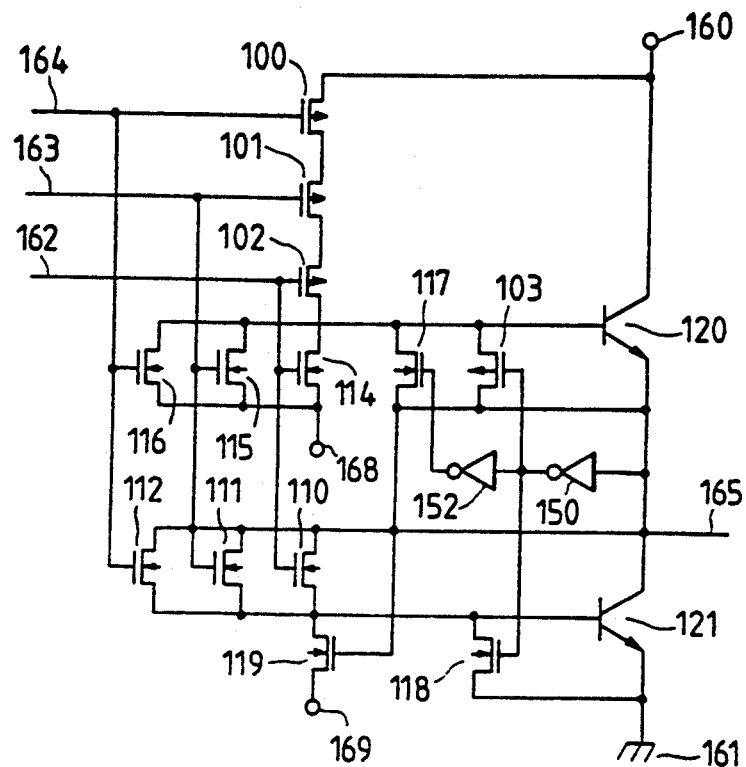

FIG. 79 shows another embodiment of the present invention, in which one example of the extension to the multi-input logic gate is exemplified by another extension to a three-input NOR. The difference from the embodiment of FIG. 76 resides in that the driver PMOS 100, 101 and 102 are connected in series and that the driver NMOS 110, 111 and 112 and the switch NMOS 114, 115 and 116 are connected in parallel.

Figure 80:
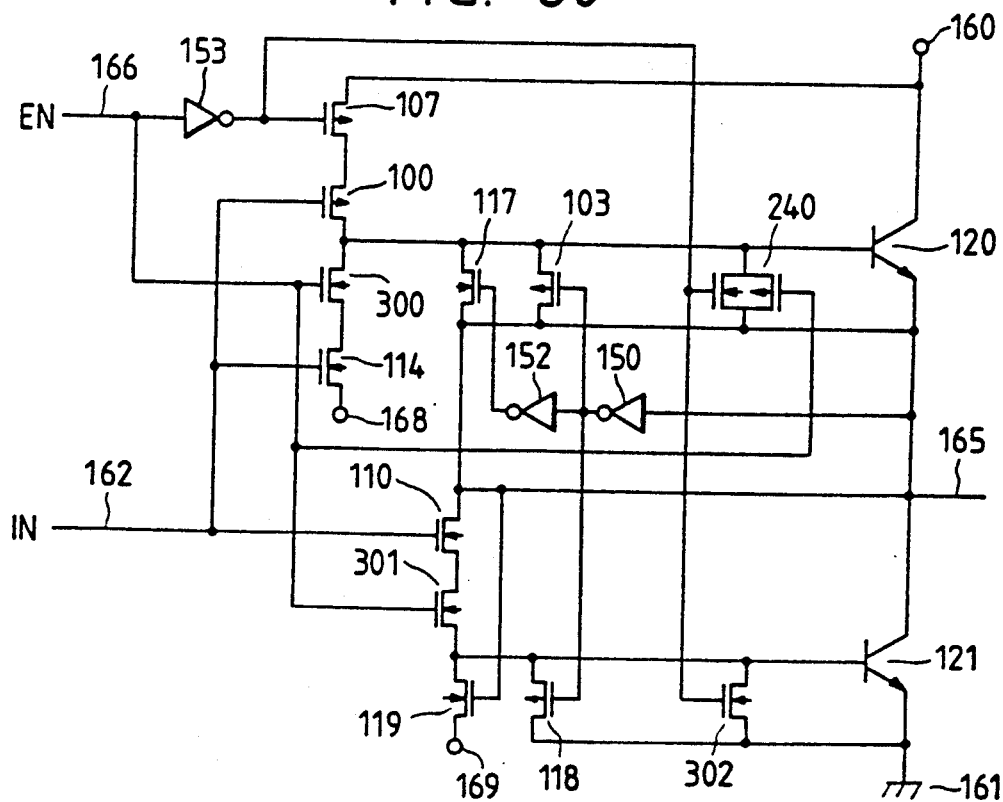
FIG. 80 is an operation timing chart.

FIG. 80 shows another embodiment of the present invention, in which the extension to another logic function is exemplified by a clocked inverter (i.e., a three-state inverter).

The structure is such that the clock enable input 166, the enable input inverting inverter 153, the NMOS 300 and 301, the PMOS 107 and the NMOS 302, and the transfer gate 240 are added to the aforementioned embodiment (i.e., inverter) of FIG. 76. If the enable input is at the High level, the present circuit performs the same operations as those of the inverter of FIG. 76. If, on the other hand, the enable input 166 is at the Low level, the transfer gate 240 and the NMOS 302 are turned ON, and the NPN 120 and 121 are turned OFF. Moreover, the NMOS 300 is turned OFF so that the output 165 takes the High impedance.

Since the voltage to be applied to the circuit is low, according to the present invention, the breakdown conditions of the elements are satisfied. Since, moreover, the power consumption is reduced generally in proportion to the square of the voltage, circuits of several times as many as that of the prior art can be integrated over one chip. As a result, the delay due to the interchip transition of the signals can be reduced to speed up the system. Since the power consumption is low, still moreover, the calorific power can be reduced to simplify the cooling facilities and reduce the manufacture cost. In addition, best use can be made of all the merits accompanying the high integration.

According to the present invention, furthermore, the base current extraction element is OFF and in a high-impedance state when the bipolar at the output stage is turned ON. As a result, no base current will leak so that the bipolar can be turned ON at a high speed. Thus, the base current extraction element can be designed to have a sufficient large size and a low power consumption without deteriorating the high speed. Moreover, the output voltage can be fully amplified through the extraction element at a high speed. According to the present invention, furthermore, it is possible to provide a large-scaled semiconductor integrated circuit device of high speed and low power consumption which is composed of field effect transistors and bipolar transistors.

According to the present invention, furthermore, the bipolar transistors can be turned ON at a high speed because the base potential of the bipolar transistor is biased in advance to a certain fixed voltage (e.g., 0.4 V) lower than the base-emitter voltage VBE and higher than the GND potential.

Regarding the foregoing description, it should be noted that CMOS logic inverters 150, 151, 152, 321 and 322 in FIGS. 8, 9, 11, 12, 14, 15, 17 to 20, 22 to 25, 27 to 30, 32 to 39, 41 to 44, 48 to 50, 52, 53, 67, 69 to 73, 76, and 78 to 80 act as a delay means which is not only directly responsive to the output signal of the circuit but also indirectly responsive to the input signal of the circuit through PMOS 100, 101 and 102 and NPN 120.

Although these CMOS logic inverters are shown and described as being directly responsive to the output signal of the circuit, these CMOS logic inverters could be designed to have a predetermined delayed turn-on and turn-off time directly responsive to the input signal of the circuit without any connection being required to the output terminal of the circuit. Examples of this are shown in FIGS. 81 to 89.

Figure 81:
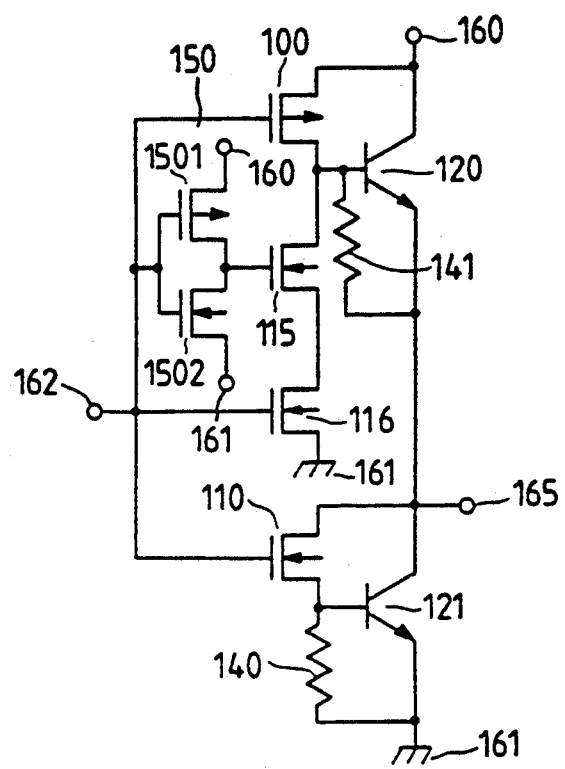

FIG. 81 shows an embodiment in which a concept similar to that of FIG. 44 is extended to an inverter. Specifically, a CMOS inverter 150 including PMOS 1501 and NMOS 1502 has an input terminal connected to the input terminal 162 and its output terminal connected with the gate of the NMOS 115.

Figure 82:
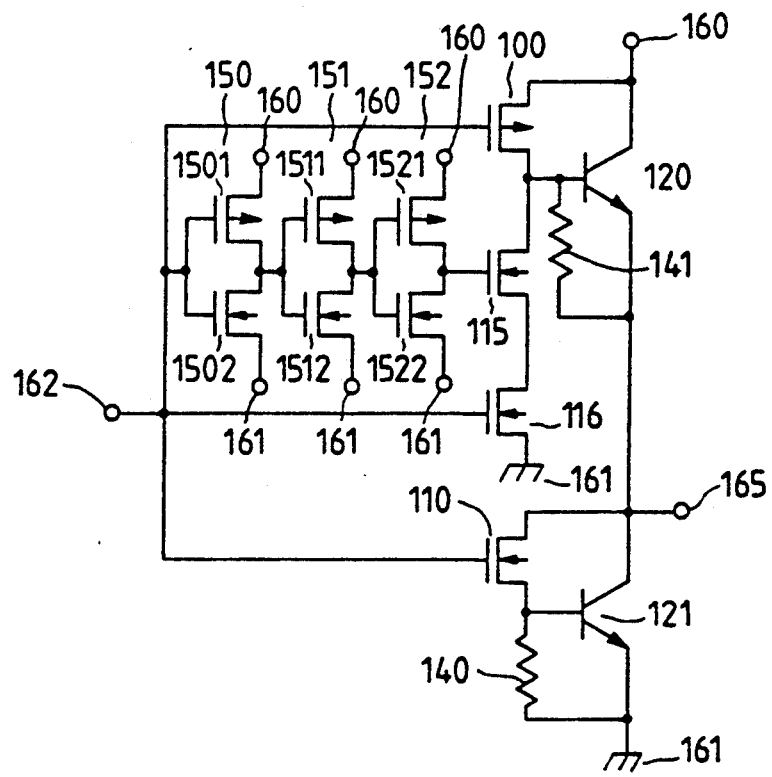

FIG. 82 shows an embodiment of the present invention, which is constructed by adding the following elements to the inverter circuit of FIG. 81. Specifically, a CMOS inverter 151 including PMOS 1511 and NMOS 1512 has an input terminal connected to the output terminal of the CMOS inverter 150, and a CMOS inverter 152 including PMOS 1521 and NMOS 1522 has an input terminal connected to the output terminal of the CMOS inverter 151 and its output terminal connected with the gate of the NMOS 115.

Figure 83:
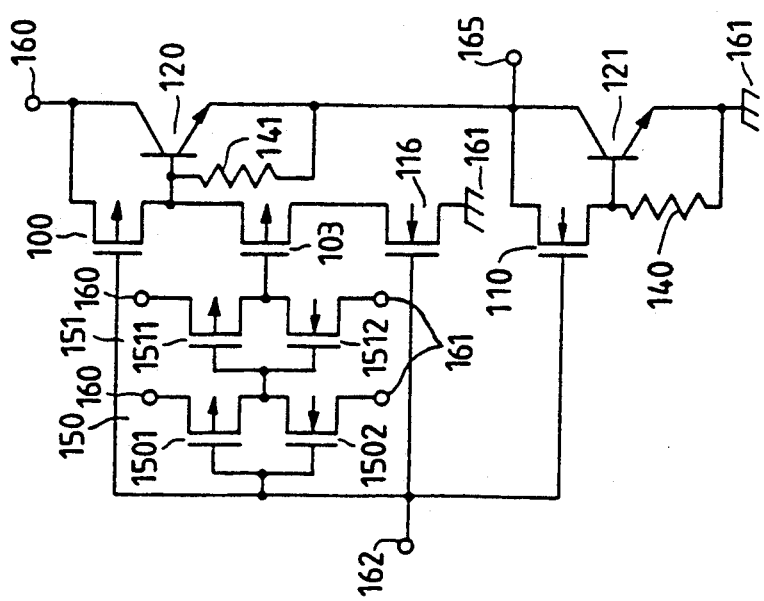

FIG. 83 shows an embodiment of the present invention, which is constructed by adding the following elements to the inverter circuit of FIG. 81. Specifically, a CMOS inverter 151 including PMOS 1511 and NMOS 1512 has an input terminal connected to the output terminal of the CMOS inverter 150 and its output terminal connected with the gate of the PMOS 103.

Figure 84:
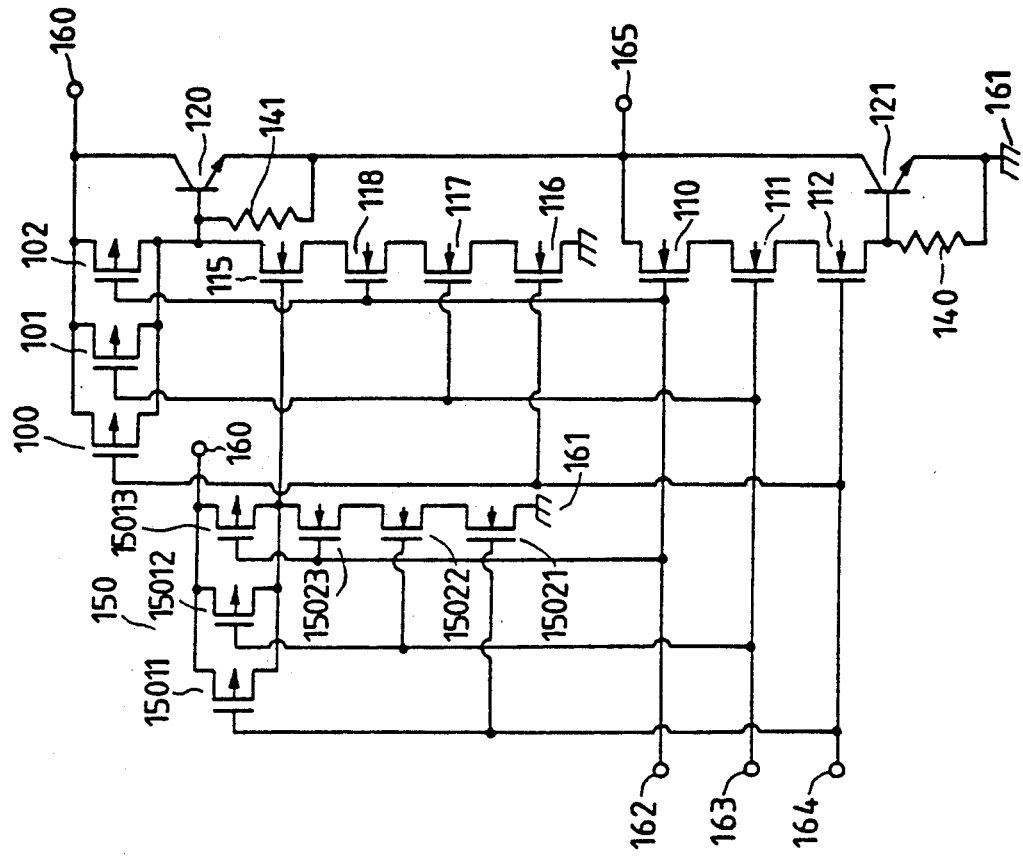

FIG. 84 shows an embodiment in which a concept similar to that of FIG. 81 is extended to a three-input NAND circuit. Specifically, a CMOS three-input NAND circuit 150 including PMOS 15011, 15012 and 15013 and NMOS 15021, 15022 and 15023 has input terminals connected to the input terminals 162, 163 and 164, respectively, and its output terminal connected with the gate of the NMOS 115.

Figure 85:
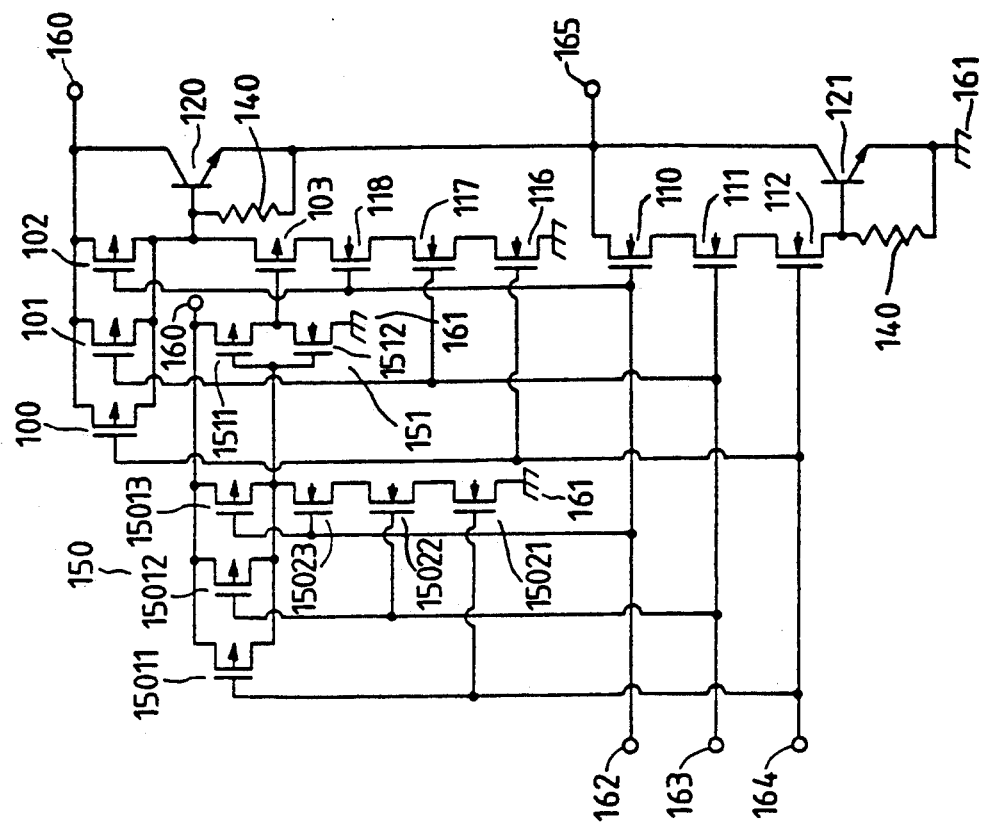

FIG. 85 shows an embodiment in which a concept similar to that of FIG. 82 is extended to a three-input NAND circuit. The manner of extension is similar to that which is made when the inverter of FIG. 81 is extended to the three-input NAND circuit of FIG. 84.

Figure 86:
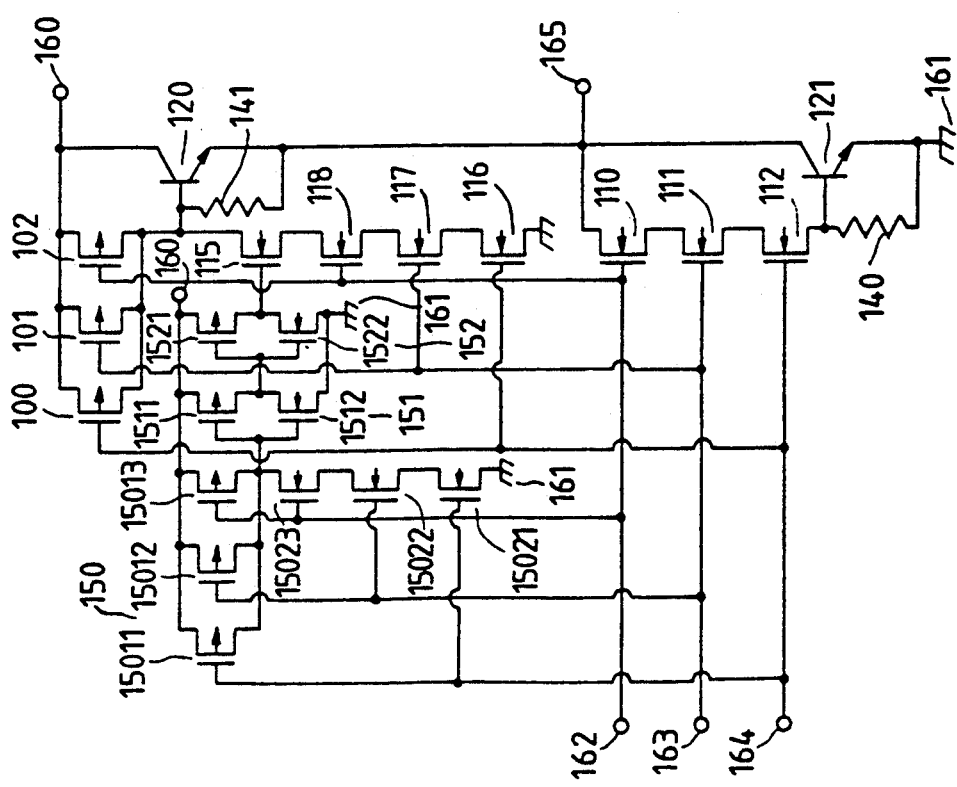

FIG. 86 shows an embodiment in which a concept similar to that of FIG. 83 is extended to a three-input NAND circuit. The manner of extension is similar to that which is made when the inverter of FIG. 81 is extended to the three-input NAND circuit of FIG. 84.

Figure 87:
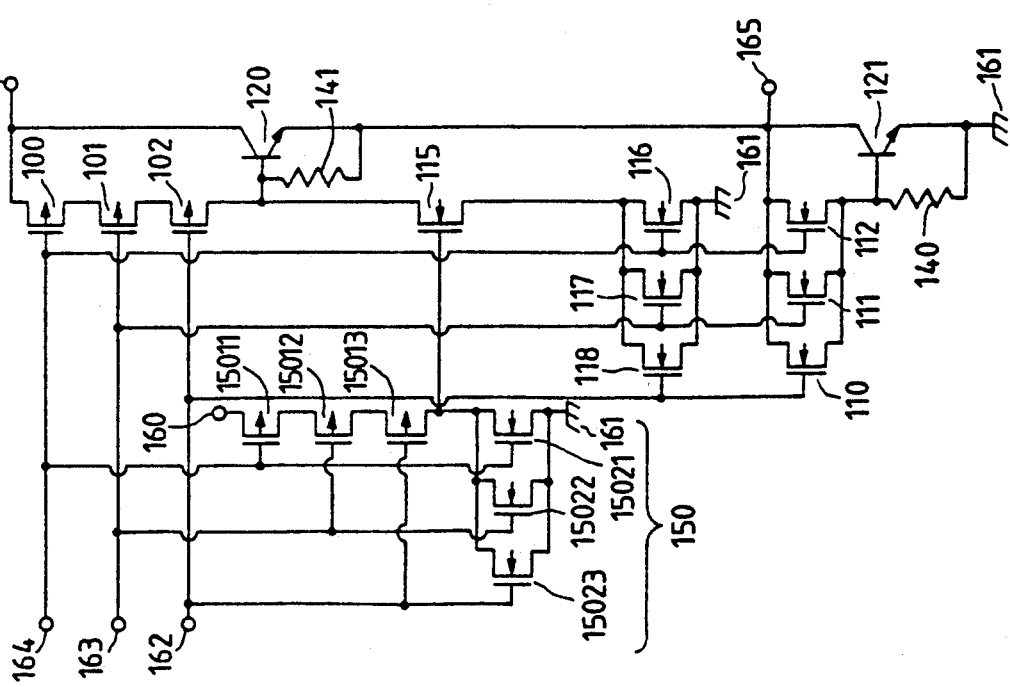

FIG. 87 shows an embodiment in which a concept similar to that of FIG. 81 is extended to a three-input NOR circuit. Specifically, a CMOS three-input NOR circuit 150 including PMOS 15011, 15012 and 15013 and NMOS 15021, 15022 and 15023 has input terminals connected to the input terminals 162, 163 and 164, respectively, and its output terminal connected with the gate of the NMOS 115.

Figure 88:
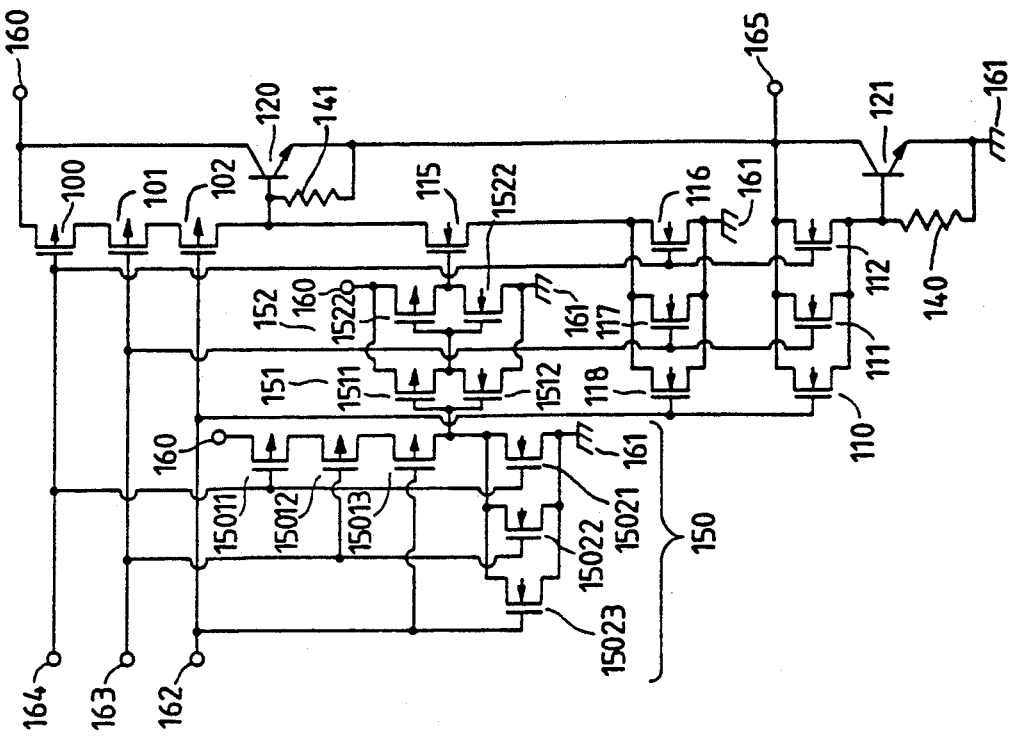

FIG. 88 shows an embodiment in which a concept similar to that of FIG. 82 is extended to a three-input NOR circuit. The manner of extension is similar to that which is made when the inverter of FIG. 81 is extended to the three-input NOR circuit of FIG. 87.

Figure 89:
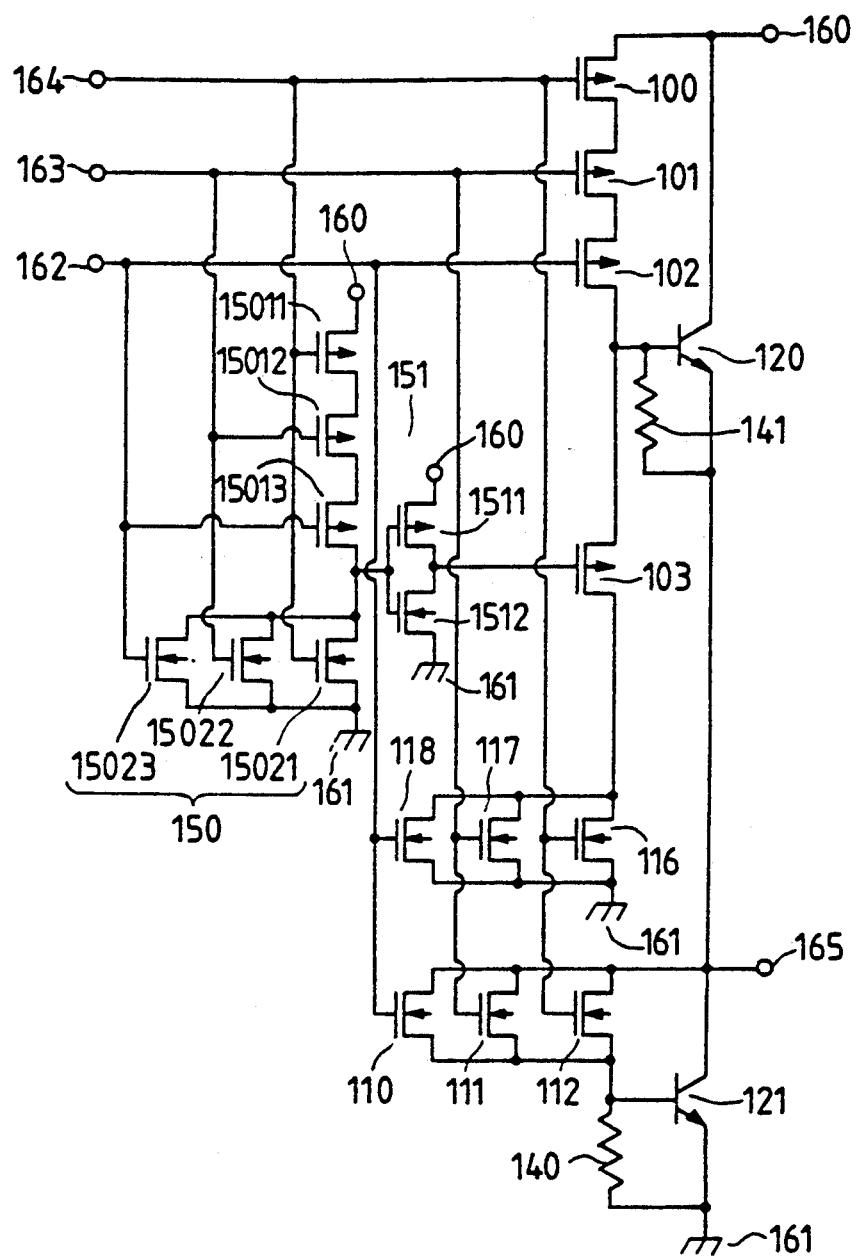

FIG. 89 shows an embodiment in which a concept similar to that of FIG. 83 is extended to a three-input NOR circuit. The manner of extension is similar to that which is made when the inverter of FIG. 81 is extended to the three-input NOR circuit of FIG. 87.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor integrated circuit device comprising a plurality of logic circuits integrated on a semiconductor substrate, wherein at least one of said logic circuits includes:
   first and second power source terminals having an absolute value of potential difference substantially less than 5 V;
   at least one input terminal;
   an output terminal;
   a bipolar transistor having a base, and having its collector-emitter current path coupled between said second power source terminal and said output terminal;
   at least one field effect transistor having its gate responsive to an input signal applied to said input terminal and its source-drain current path coupled between said output terminal and the base of said bipolar transistor;
   a semiconductor switch means responsive to the input signal applied to said input terminal for performing ON/OFF operations complementary to the ON/OFF operations of said bipolar transistor and having a pair of main terminals, wherein a current path between its paired main terminals is coupled between said first power source terminal and said output terminal; and
   a potential difference reducing element having a pair of main terminals, wherein a current path between its paired main terminals is coupled between said output terminal and said second power source terminal for reducing a potential difference which is present between said output terminal and said second power source terminal based on the base-emitter forward voltage of said bipolar transistor when said bipolar transistor is in an ON state.

2. A semiconductor integrated circuit device according to claim 1, wherein the absolute value of the potential difference between said first power source terminal and said second power source terminal substantially satisfies 3.3 V±0.3 V.

3. A semiconductor integrated circuit device according to claim 1, wherein the absolute value of the potential difference between said first power source terminal and said second power source terminal is substantially 4.5 V.

4. A semiconductor integrated circuit device according to claim 1, wherein the absolute value of the potential difference between said first power source terminal and said second power source terminal substantially satisfies 2.0 V±10%.

5. A semiconductor integrated circuit device according to claim 1, wherein the absolute value of the potential difference between said first power source terminal and said second power source terminal substantially satisfies 1.5 V±10%.

6. A semiconductor integrated circuit device according to claim 1, wherein the absolute value of the potential difference between said first power source terminal and said second power source terminal substantially satisfies 3.0 V±10%.

7. A semiconductor integrated circuit device according to claim 1, wherein the absolute value of the potential difference between said first power source terminal and said second power source terminal substantially satisfies 4.0 V±10%.

8. A semiconductor integrated circuit device according to claim 1, wherein the absolute value of the potential difference between said first power source terminal and said second power source terminal is substantially no less than 4.0 V.

9. A semiconductor integrated circuit device comprising a plurality of logic circuits integrated on a semiconductor substrate, wherein at least one of said logic circuits includes:
   at least one input terminal;
   an output terminal;
   a bipolar transistor having a base, and having its collector-emitter current path coupled between said second power source terminal and said output terminal;
   at least one field effect transistor having its gate responsive to an input signal applied to said input terminal and its source-drain current path coupled between said first power source terminal and the base of said bipolar transistor;
   a semiconductor switch means responsive to the input signal applied to said input terminal for performing ON/OFF operations complementary to the ON/OFF operations of said bipolar transistor and having a pair of main terminals, wherein a current path between its paired main terminals is coupled between said output terminal and said second power source terminal; and a potential difference reducing element having a pair of main terminals, wherein a current path between its paired main terminals is coupled between said first power source terminal and said output terminal for reducing a potential difference which is present between said first power source terminal and said output terminal based on the base-emitter forward voltage of said bipolar transistor when said bipolar transistor is in an ON state.

wherein the absolute value of the potential difference between said first power source terminal and said second power source terminal substantially satisfies 2.0 V±10%.

10. A semiconductor integrated circuit device comprising a plurality of logic circuits integrated on a semiconductor substrate, wherein at least one of said logic circuits includes:

first and second power source terminals having an absolute value of potential difference substantially less than 5 V;

at least one input terminal;

an output terminal;

a bipolar transistor having a base, and having its collector-emitter current path coupled between said first power source terminal and said output terminal;

at least one field effect transistor having its gate responsive to an input signal applied to said input terminal and its source-drain current path coupled between said first power source terminal and the base of said bipolar transistor;

a semiconductor switch means responsive to the input signal applied to said input terminal for performing ON/OFF operations complementary to the ON/OFF operations of said bipolar transistor and having a pair of main terminals, wherein a current path between its paired main terminals is coupled between said output terminal and said second power source terminal; and a potential difference reducing element having a pair of main terminals, wherein a current path between its paired main terminals is coupled between said first power source terminal and said output terminal for reducing a potential difference which is present between said first power source terminal and said output terminal based on the base-emitter forward voltage of said bipolar transistor when said bipolar transistor is in an ON state.

wherein the absolute value of the potential difference between said first power source terminal and said second power source terminal substantially satisfies 1.5 V±10%.

11. A semiconductor integrated circuit device comprising a plurality of logic circuits integrated on a semiconductor substrate, wherein at least one of said logic circuits includes:

first and second power source terminals having an absolute value of potential difference substantially less than 5 V;

at least one input terminal;

an output terminal;

a bipolar transistor having a base, and having its collector-emitter current path coupled between said first power source terminal and said output terminal;

at least one field effect transistor having its gate responsive to an input signal applied to said input terminal and its source-drain current path coupled between said first power source terminal and the base of said bipolar transistor;

a semiconductor switch means responsive to the input signal applied to said input terminal for performing ON/OFF operations complementary to the ON/OFF operations of said bipolar transistor and having a pair of main terminals, wherein a current path between its paired main terminals is coupled between said output terminal and said second power source terminal; and a potential difference reducing element having a pair of main terminals, wherein a current path between its paired main terminals is coupled between said first power source terminal and said output terminal for reducing a potential difference which is present between said first power source terminal and said output terminal based on the base-emitter forward voltage of said bipolar transistor when said bipolar transistor is in an ON state.

wherein the absolute value of the potential difference between said first power source terminal and said second power source terminal substantially satisfies 3.0 V±10%.

12. A semiconductor integrated circuit device comprising a plurality of logic circuits integrated on a semiconductor substrate, wherein at least one of said logic circuits includes:

first and second power source terminals having an absolute value of potential difference substantially less than 5 V;

at least one input terminal;

an output terminal;

a bipolar transistor having a base, and having its collector-emitter current path coupled between said first power source terminal and said output terminal;

at least one field effect transistor having its gate responsive to an input signal applied to said input terminal and its source-drain current path coupled between said first power source terminal and the base of said bipolar transistor;

a second bipolar transistor having a base, and having its collector-emitter current path coupled between said output terminal and said second power source terminal;

at least one second field effect transistor having its gate responsive to the input signal applied to said input terminal and its source-drain current path coupled between said output terminal and the base of said second bipolar transistor for causing said second bipolar transistor to perform the ON/OFF operations complementary to the ON/OFF operations of said first bipolar transistor;

a first potential difference reducing element having a pair of main terminals, wherein a current path between its paired main terminals is coupled between said first power source terminal and said output terminal for reducing a potential difference which is present between said first power source terminal and said output terminal based on the base-emitter forward voltage of said bipolar transistor when said bipolar transistor is in an ON state; and a second potential difference reducing element having a pair of main terminals, wherein a current path between its paired main terminals is coupled between said output terminal and said second power source terminal for reducing a potential difference which is present between said output terminal and said second power source terminal based on the base-emitter forward voltage of said second bipolar transistor when said second bipolar transistor is in an ON state, wherein the absolute value of the potential difference between said first power source terminal and said second power source terminal substantially satisfies 2.0 V±10%.

13. A semiconductor integrated circuit device comprising a plurality of logic circuits integrated on a semiconductor substrate, wherein at least one of said logic circuits includes:

first and second power source terminals having an absolute value of potential difference substantially less than 5 V;

at least one input terminal;

an output terminal;

a bipolar transistor having a base, and having its collector-emitter current path coupled between said first power source terminal and said output terminal;

at least one field effect transistor having its gate responsive to an input signal applied to said input terminal and its source-drain current path coupled between said first power source terminal and the base of said bipolar transistor;

a second bipolar transistor having a base, and having its collector-emitter current path coupled between said output terminal and said second power source terminal;

at least one second field effect transistor having its gate responsive to the input signal applied to said input terminal and its source-drain current path coupled between said output terminal and the base of said second bipolar transistor for causing said second bipolar transistor to perform the ON/OFF operations complementary to the ON/OFF operations of said first bipolar transistor;

a first potential difference reducing element having a pair of main terminals, wherein a current path between its paired main terminals is coupled between said first power source terminal and said output terminal for reducing a potential difference which is present between said first power source terminal and said output terminal based on the base-emitter forward voltage of said bipolar transistor when said bipolar transistor is in an ON state; and a second potential difference reducing element having a pair of main terminals, wherein a current path between its paired main terminals is coupled between said output terminal and said second power source terminal for reducing a potential difference which is present between said output terminal and said second power source terminal based on the base-emitter forward voltage of said second bipolar transistor when said second bipolar transistor is in an ON state, wherein the absolute value of the potential difference between said first power source terminal and said second power source terminal substantially satisfies 1.5 V±10%.

14. A semiconductor integrated circuit device comprising a plurality of logic circuits integrated on a semiconductor substrate, wherein at least one of said logic circuits includes:

first and second power source terminals having an absolute value of potential difference substantially less than 5 V;

at least one input terminal;

an output terminal;

a first bipolar transistor having a base, and having its collector-emitter current path coupled between said first power source terminal and said output terminal;

at least one field effect transistor having its gate responsive to an input signal applied to said input terminal and its source-drain current path coupled between said first power source terminal and the base of said bipolar transistor;

a second bipolar transistor having a base, and having its collector-emitter current path coupled between said output terminal and said second power source terminal;

at least one second field effect transistor having its gate responsive to the input signal applied to said input terminal and its source-drain current path coupled between said output terminal and the base of said second bipolar transistor for causing said second bipolar transistor to perform the ON/OFF operations complementary to the ON/OFF operations of said first bipolar transistor;

a first potential difference reducing element having a pair of main terminals, wherein a current path between its paired main terminals is coupled between said first power source terminal and said output terminal for reducing a potential difference which is present between said first power source terminal and said output terminal based on the base-emitter forward voltage of said bipolar transistor when said bipolar transistor is in an ON state; and a second potential difference reducing element having a pair of main terminals, wherein a current path between its paired main terminals is coupled between said output terminal and said second power source terminal for reducing a potential difference which is present between said output terminal and said second power source terminal based on the base-emitter forward voltage of said second bipolar transistor when said second bipolar transistor is in an ON state, wherein the absolute value of the potential difference between said first power source terminal and said second power source terminal substantially satisfies 3.0 V±10%.

* * * * *